(12) United States Patent
Lee et al.

(10) Patent No.: US 12,180,069 B2
(45) Date of Patent: Dec. 31, 2024

(54) METHOD AND SYSTEM FOR FABRICATING A MEMS DEVICE

(71) Applicant: InvenSense, Inc., San Jose, CA (US)

(72) Inventors: Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 299 days.

(21) Appl. No.: 17/877,151

(22) Filed: Jul. 29, 2022

(65) Prior Publication Data
US 2023/0045257 A1 Feb. 9, 2023

Related U.S. Application Data

(60) Provisional application No. 63/229,390, filed on Aug. 4, 2021.

(51) Int. Cl.
*B81C 1/00* (2006.01)
*B81B 3/00* (2006.01)
(Continued)

(52) U.S. Cl.
CPC ........ *B81C 1/00396* (2013.01); *B81B 3/0005* (2013.01); *B81B 3/0081* (2013.01); *B81B 7/0038* (2013.01); *B81B 7/007* (2013.01); *B81B 7/02* (2013.01); *B81C 1/00269* (2013.01); *B81C 1/00992* (2013.01); *B81B 2201/0235* (2013.01); *B81B 2201/0242* (2013.01); *B81B 2203/0315* (2013.01); *B81B 2203/04* (2013.01); *B81B 2207/07* (2013.01); *B81C 2201/0119* (2013.01); *B81C 2201/013* (2013.01); *B81C 2201/0132* (2013.01); *B81C 2201/014* (2013.01); *B81C 2201/0147* (2013.01); *B81C 2201/0159* (2013.01); *B81C 2201/016* (2013.01);
(Continued)

(58) Field of Classification Search
None
See application file for complete search history.

(56) References Cited

U.S. PATENT DOCUMENTS

2012/0125747 A1 5/2012 Chu et al.
2014/0225206 A1 8/2014 Lin et al.
(Continued)

OTHER PUBLICATIONS

PCT/US2022/038835 Filed Jul. 29, 2022—PCT International Search Report and Written Opinion, dated Nov. 9, 2022, 12 pages.
(Continued)

*Primary Examiner* — Roberts P Culbert

(57) ABSTRACT

A device includes a substrate and an intermetal dielectric (IMD) layer disposed over the substrate. The device also includes a first plurality of polysilicon layers disposed over the IMD layer and over a bumpstop. The device also includes a second plurality of polysilicon layers disposed within the IMD layer. The device includes a patterned actuator layer with a first side and a second side, wherein the first side of the patterned actuator layer is lined with a polysilicon layer, and wherein the first side of the patterned actuator layer faces the bumpstop. The device further includes a standoff formed over the IMD layer, a via through the standoff making electrical contact with the polysilicon layer of the actuator and a portion of the second plurality of polysilicon layers and a bond material disposed on the second side of the patterned actuator layer.

16 Claims, 99 Drawing Sheets

(51) Int. Cl.
B81B 7/00 (2006.01)
B81B 7/02 (2006.01)

(52) U.S. Cl.
CPC .............. *B81C 2201/019* (2013.01); *B81C 2201/0198* (2013.01); *B81C 2201/112* (2013.01); *B81C 2203/0109* (2013.01); *B81C 2203/0118* (2013.01); *B81C 2203/019* (2013.01); *B81C 2203/035* (2013.01); *B81C 2203/036* (2013.01)

(56) References Cited

U.S. PATENT DOCUMENTS

| | | |
|---|---|---|
| 2014/0264661 A1 | 9/2014 | Cheng et al. |
| 2014/0264662 A1 | 9/2014 | Cheng et al. |
| 2017/0305738 A1 | 10/2017 | Chang et al. |
| 2020/0262697 A1 | 8/2020 | Lee et al. |
| 2023/0045563 A1* | 2/2023 | Lee .................... B81C 1/00992 |

OTHER PUBLICATIONS

PCT/US2022/038850 Filed Jul. 29, 2022—PCT International Search Report and Written Opinion, dated Nov. 9, 2022, 12 pages.
PCT/US2022/038861 Filed Jul. 29, 2022—PCT International Search Report and Written Opinion, dated Nov. 15, 2022, 16 pages.
M. Tilli et al., "Outgassing and Gettering", Chapter 39 in Handbook of Silicon Bases MEMS Materials and Technologies, 2nd ed. Elsevier, Amsterdam, (Year: 2015).

* cited by examiner

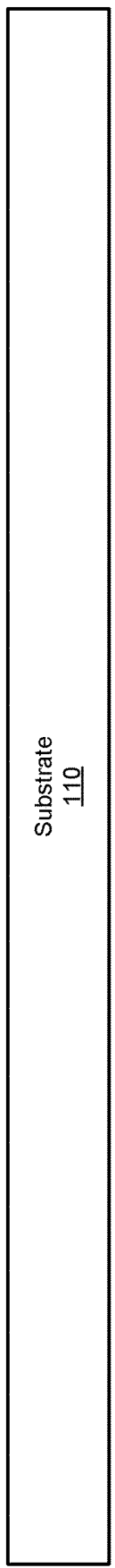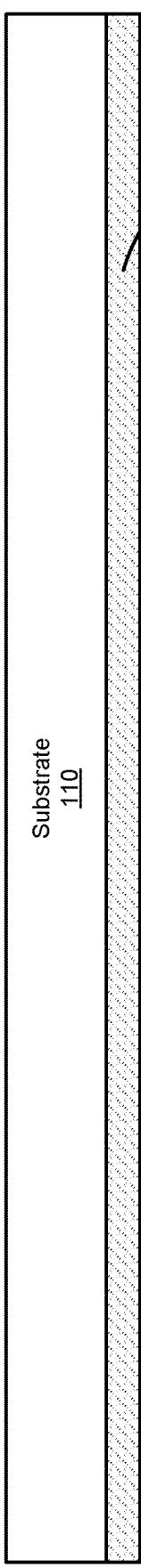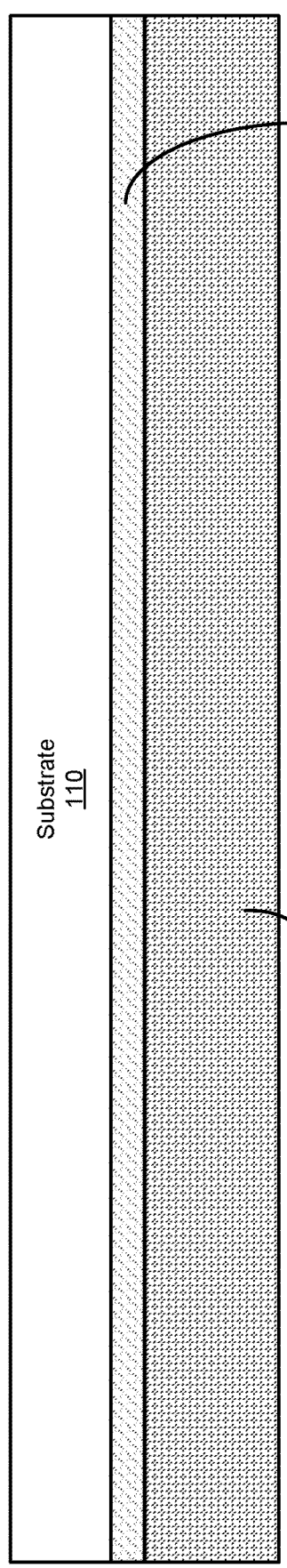

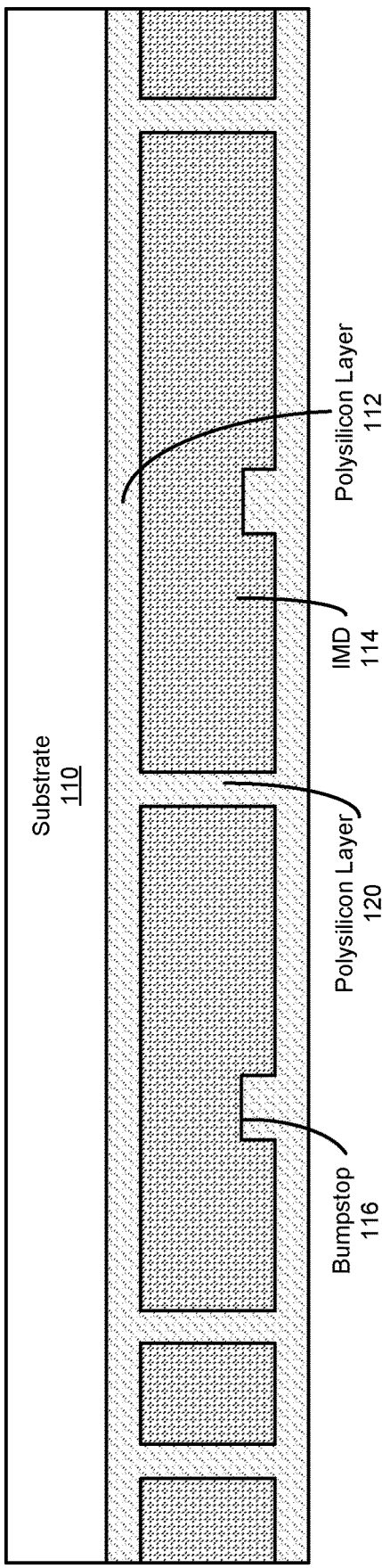
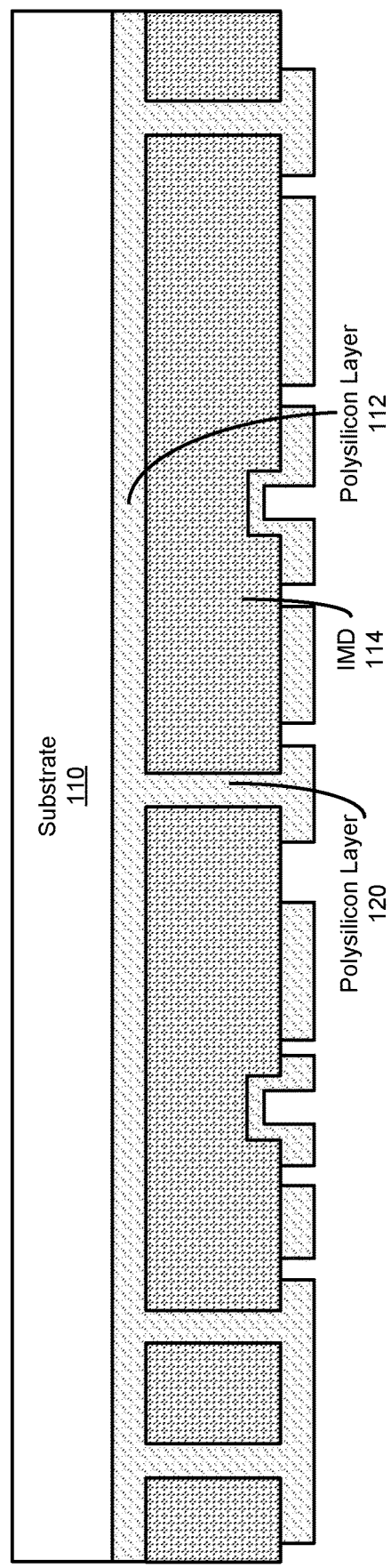

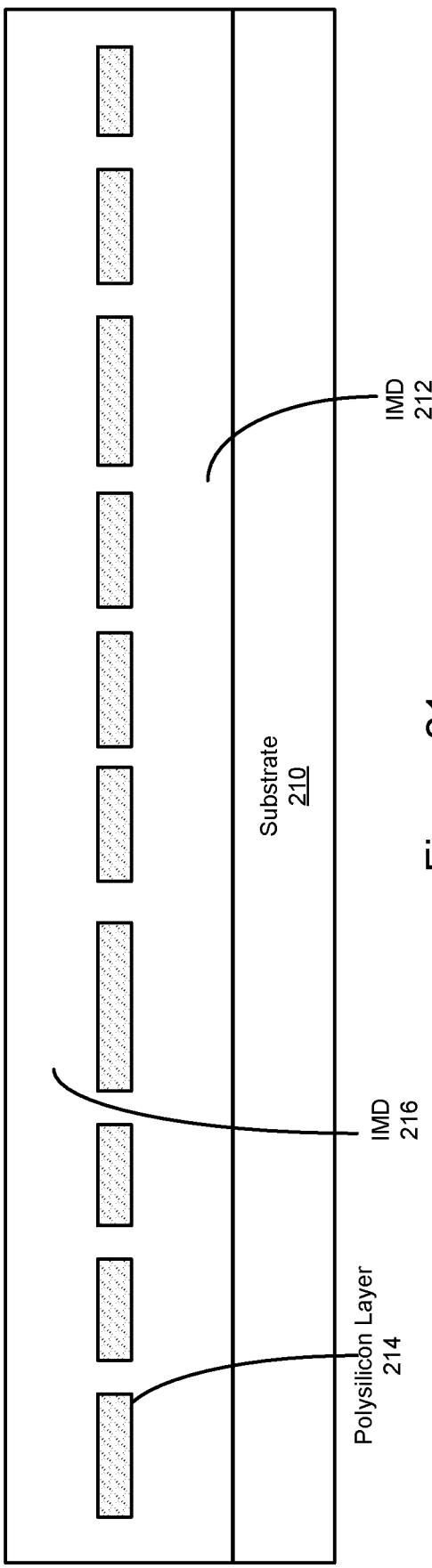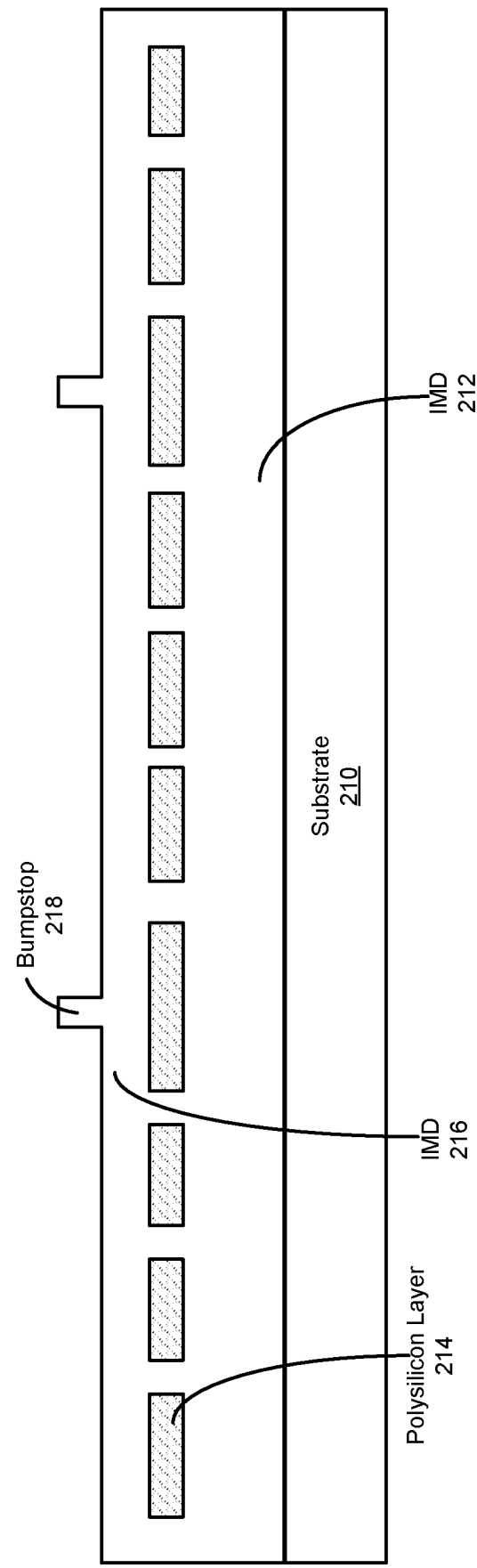

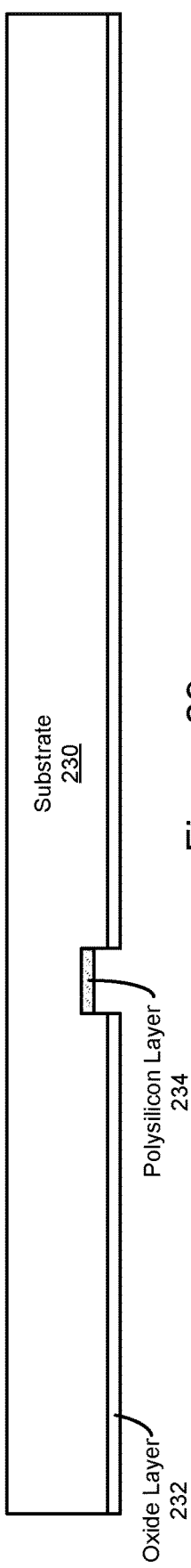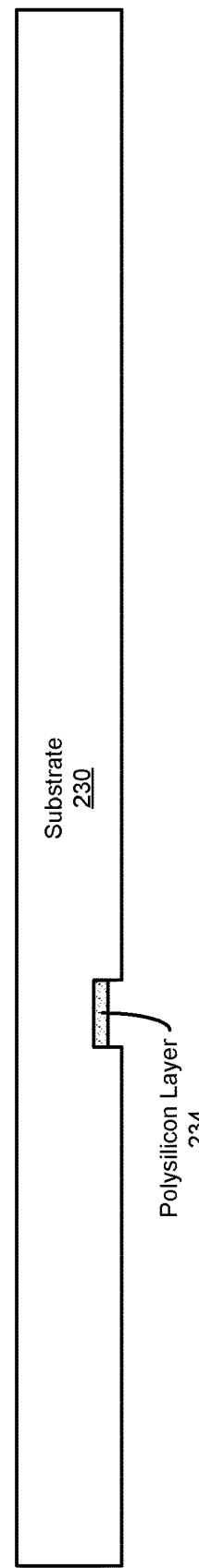

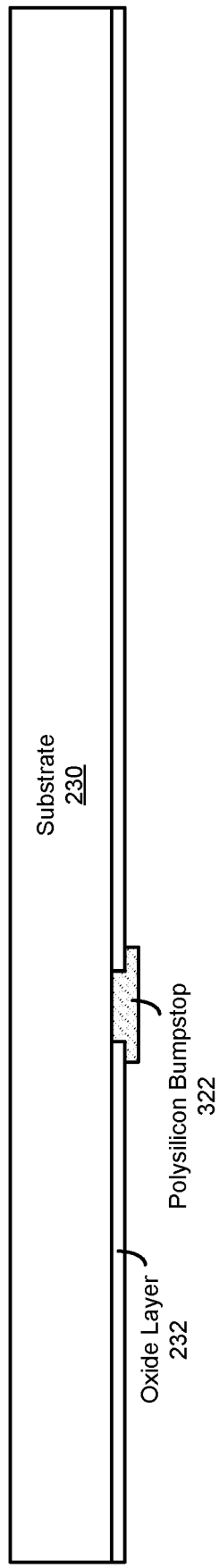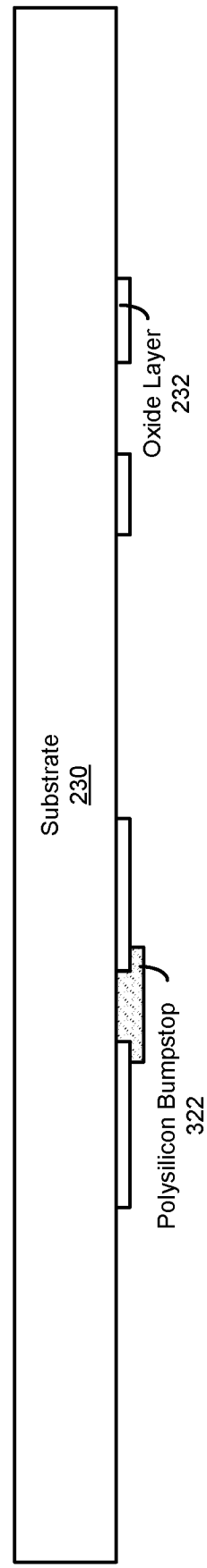
Figure 45
Figure 46

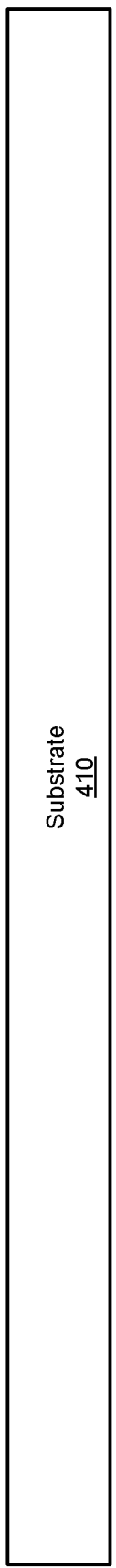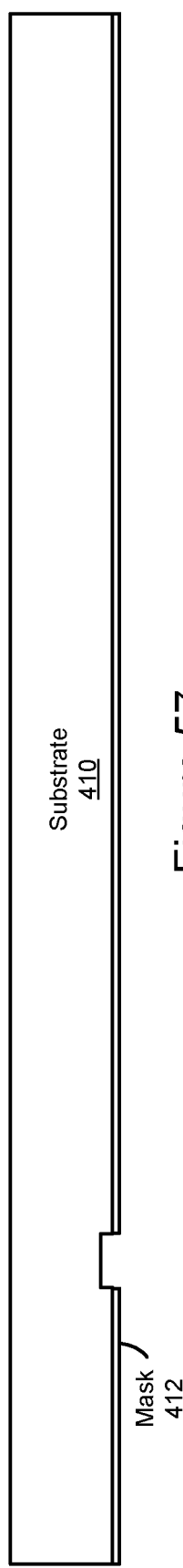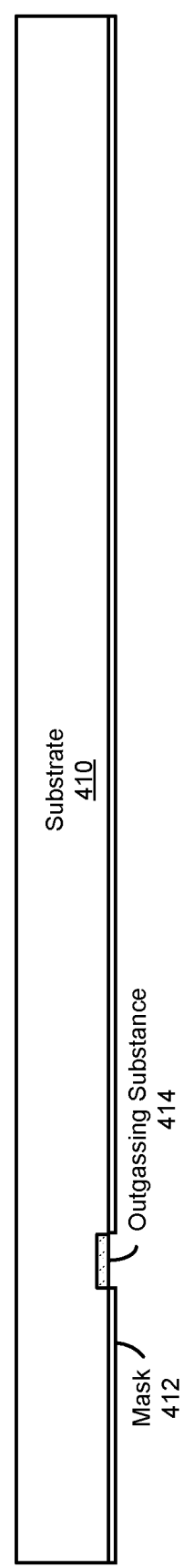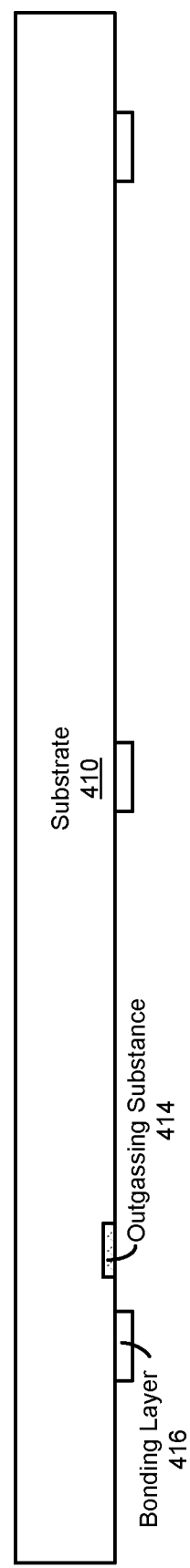

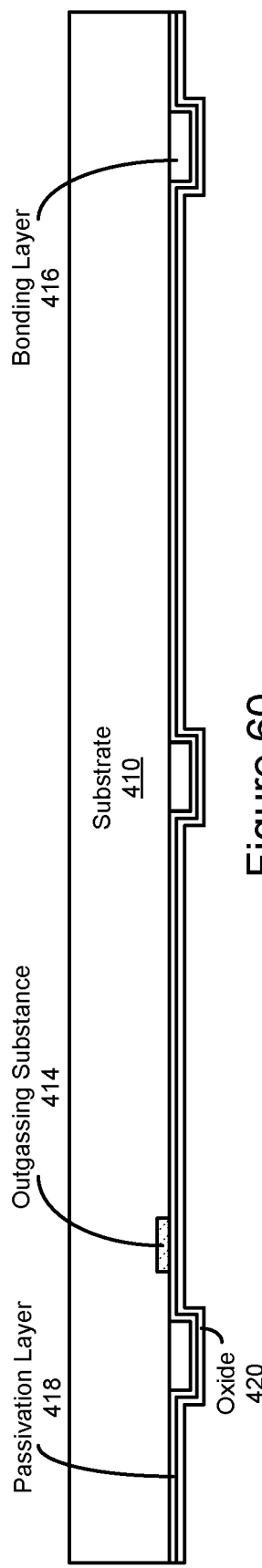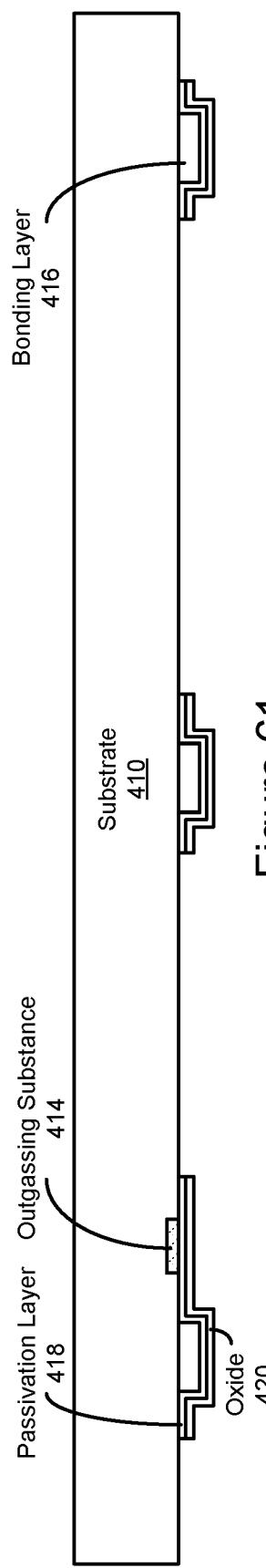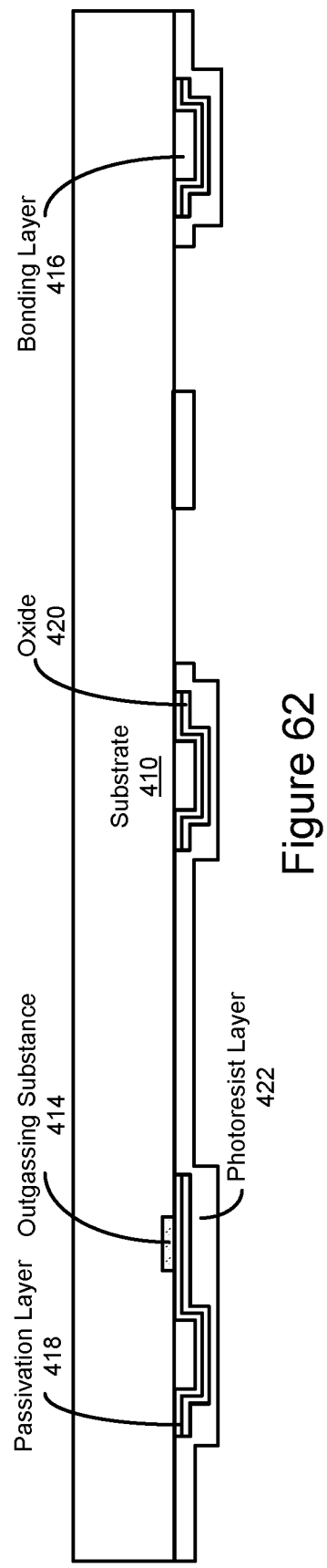

Depositing a bonding material on a first, a second, and a third portions of a substrate, wherein the first, the second and the third portions are associated with a first, a second, and a third standoff regions
7002

Depositing and patterning a mask over a fourth portion of the substrate that is exposed and further on the bonding material, wherein a first exposed portion of the patterned mask is associated with a first cavity region positioned between the first and the second standoff regions and a second exposed portion of the patterned mask is associated with a second cavity region positioned between the second and the third standoff regions
7004

Depositing and patterning a photoresist mask over the patterned mask to expose at least two regions within the first cavity region
7006

Etching the at least two regions to form a first cavity
7008

Removing a remainder of the photoresist mask to expose the first cavity region and the second cavity region
7010

Etching the first cavity region and the second cavity region, wherein the etching the first cavity region increases a depth of the first cavity and wherein the etching the second cavity region forms a second cavity between the second and the third standoff regions, and wherein a depth of the first cavity region within the first cavity is greater than a depth of the second cavity
7012

Depositing and patterning a getter material to cover a portion of the first cavity
7014

Removing the patterned mask to expose the bonding material
7016

Figure 70

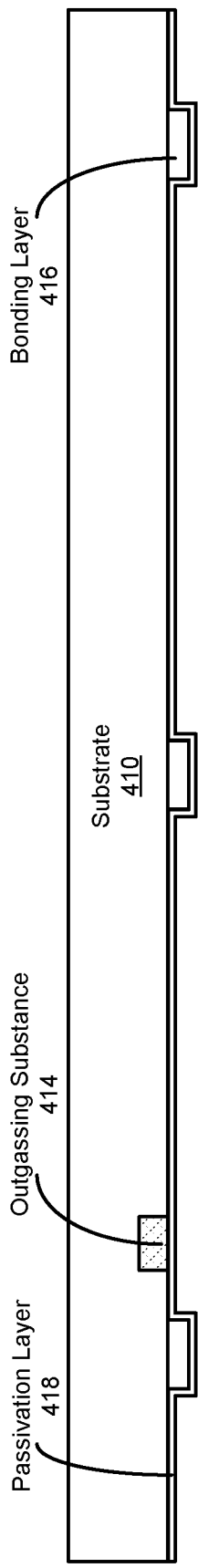
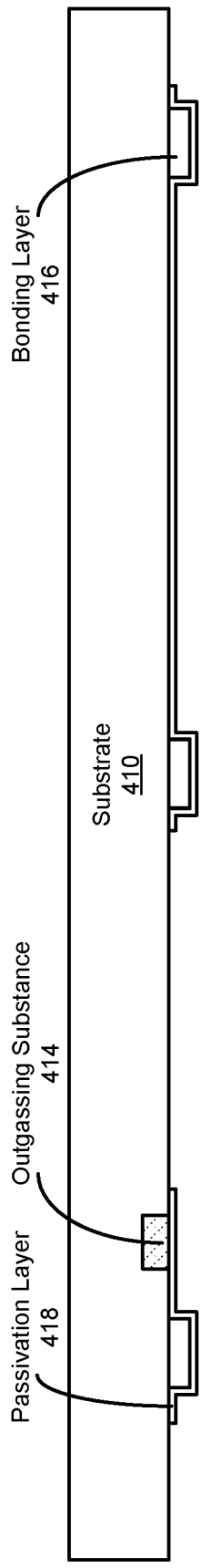
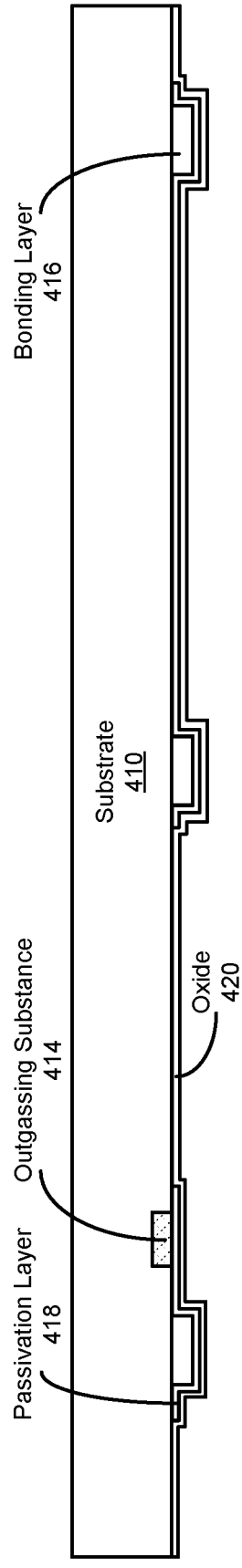

depositing a bonding material on a first, a second, and a third portions of a substrate, wherein the first, the second and the third portions are associated with a first, a second, and a third standoff regions
8402

Forming a mask over a fourth portion of the substrate that is exposed and further on the bonding material
8404

Patterning the mask to form a first patterned mask, wherein a first exposed portion of the patterned mask is associated with a first cavity region positioned between the first and the second standoff regions, and wherein the mask covers a second cavity region positioned between the second and the third standoff regions and further covers the bonding material
8406

Depositing and pattering an oxide mask over the substrate and the mask to form an exposed second cavity region of the substrate
8408

Forming a photoresist mask over the patterned mask and further on an exposed second cavity region of the substrate
8410

Patterning the photoresist mask to expose a section of the second cavity region
8412

Etching the section of the second cavity region to form two second cavities
8414

Removing a remainder of the photoresist mask to expose a remainder of substrate in the first cavity region
8416

Etching the first cavity region and the first cavity
8418

Patterning the first patterned mask to form a second patterned mask, wherein the second patterned mask exposes a section of the second cavity region while covering the first, the second, and the third standoff regions
8420

Depositing a getter material in the first cavity region
8422

Etching exposed portions of the substrate uncovered by the second patterned mask to form a first, a second, and a third standoffs associated with the first, the second, and the third standoff regions and further to form a second cavity positioned between the second and the third standoff regions
8422

Removing the second patterned mask to expose the bonding material
8416

Figure 84

Depositing a bonding material on a first, a second, and a third portions of a substrate, wherein the first, the second and the third portions are associated with a first, a second, and a third standoff regions
9302

Forming a mask over a fourth portion of the substrate that is exposed and further on the bonding material
9304

Patterning the mask, wherein a first exposed portion of the patterned mask is associated with a first cavity region positioned between the first and the second standoff regions and a second exposed portion of the patterned mask is associated with a second cavity region positioned between the second and the third standoff regions, and wherein the patterned mask covers the first, the second, and the third standoff regions
9306

Etching exposed portions of the substrate to form a first cavity within the first cavity region, a second cavity within the second cavity region, wherein a depth of the first cavity is the same as a depth of the second cavity, and wherein the etching further forms a first, a second, and a third standoffs associated with the first, the second, and the third standoff regions respectively
9308

Forming a getter material over the patterned mask and further on exposed portions of the first and the second cavity regions
9310

Patterning the getter material to cover a portion of the first cavity
9312

Forming a photoresist mask over exposed portion of the substrate in the second cavity and further over exposed portion of the substrate in the first cavity and further over the patterned getter material
9314

Patterning the photoresist mask to expose a portion of the first cavity region while covering the patterned getter
9316

Etching the exposed portion of the first cavity region to form a first and a second region associated with the first cavity, and wherein a depth of the first and the second cavity regions is greater than the depth of the second cavity
9318

Removing the patterned mask to expose the bonding material
9320

Figure 93

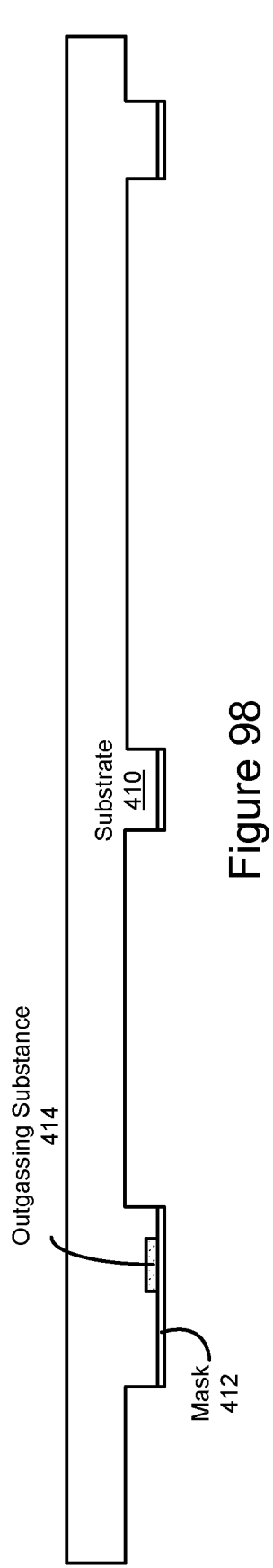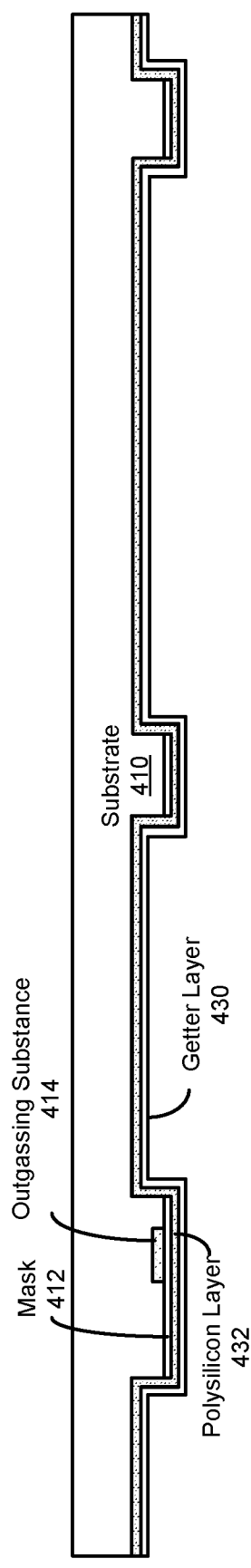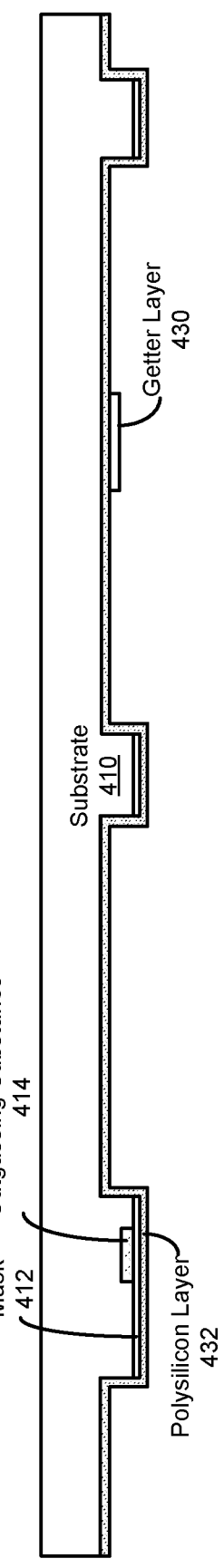
Figure 98
Figure 99
Figure 100

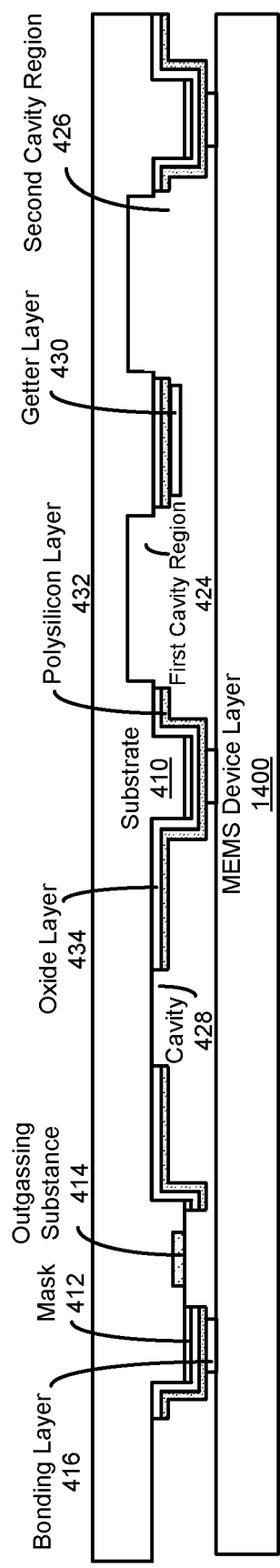
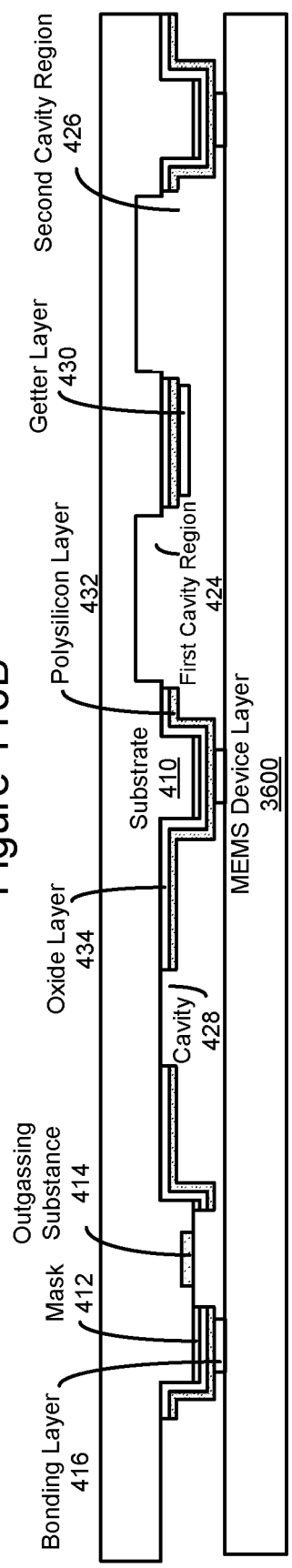
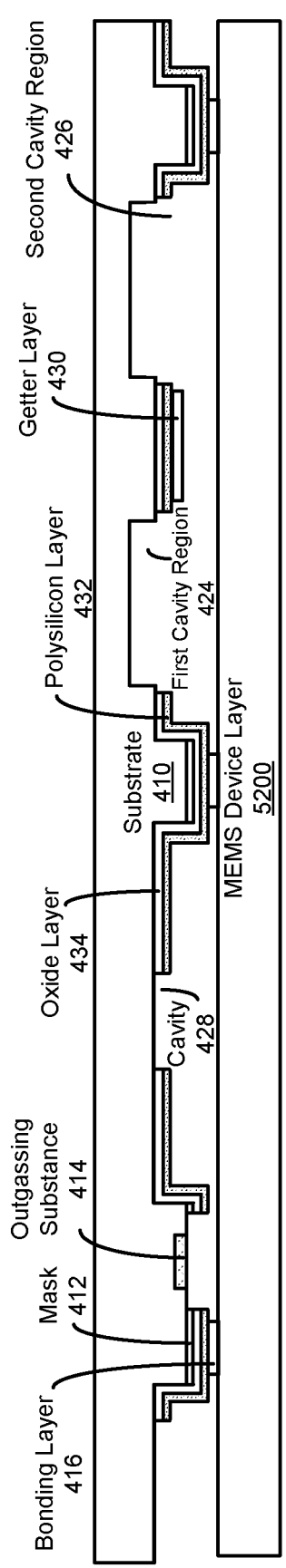
Figure 110B
Figure 110C
Figure 110D

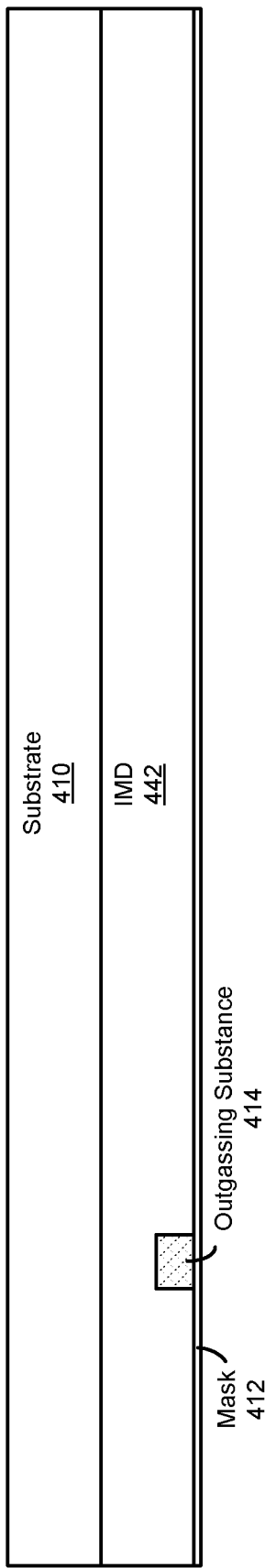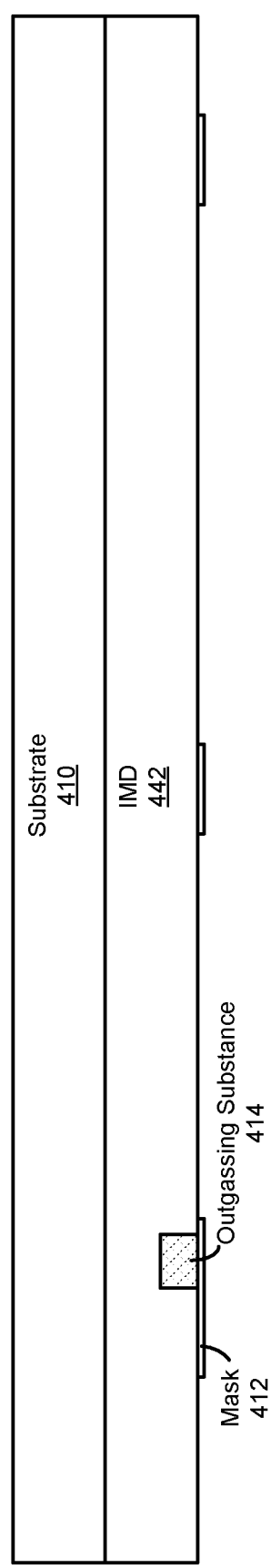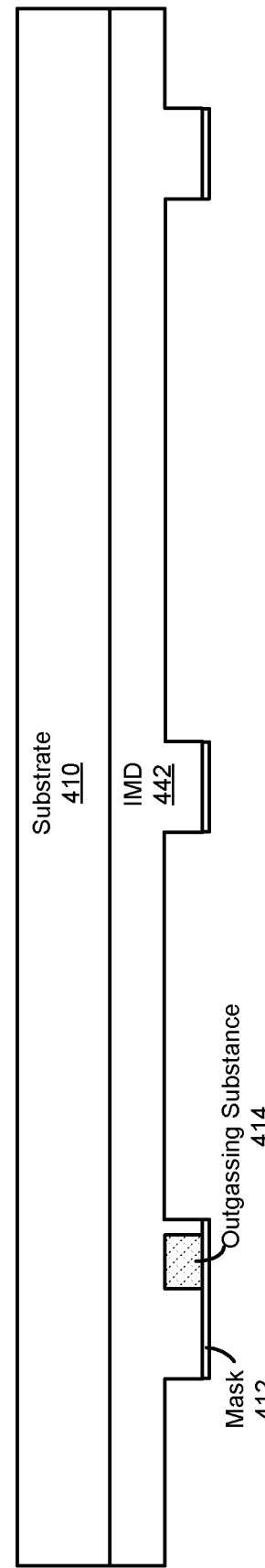

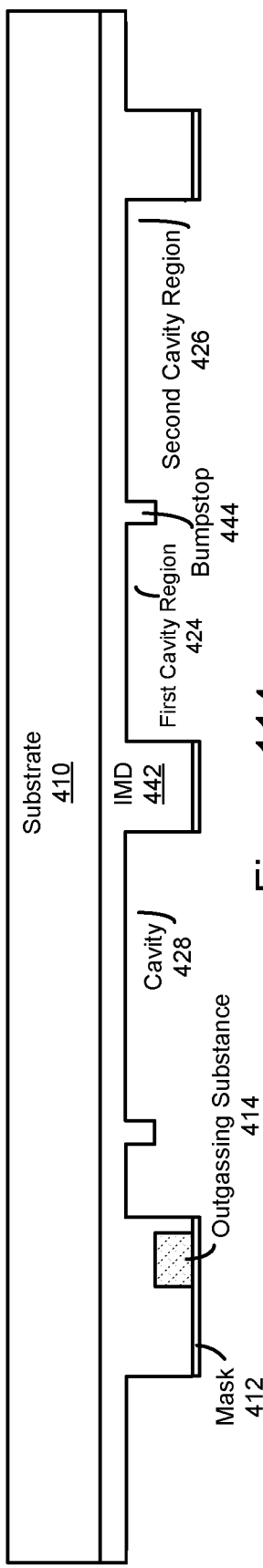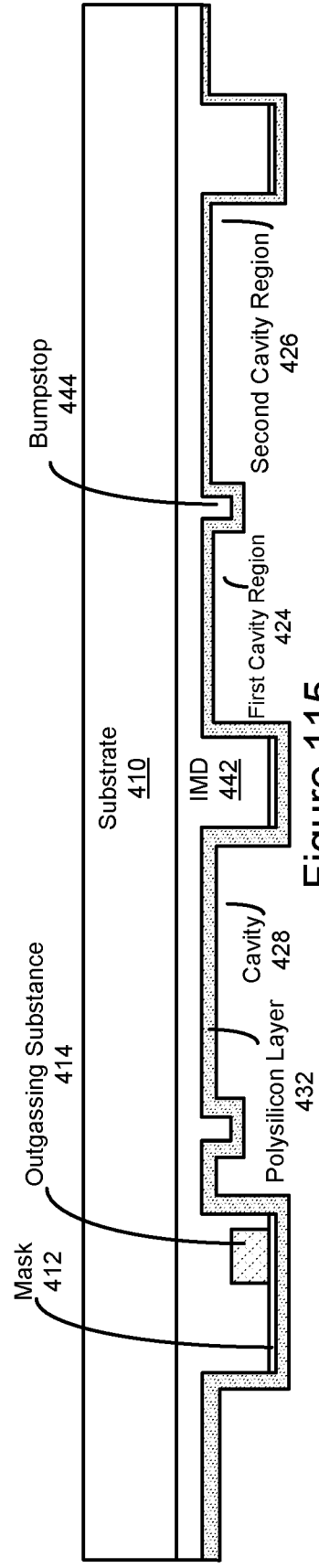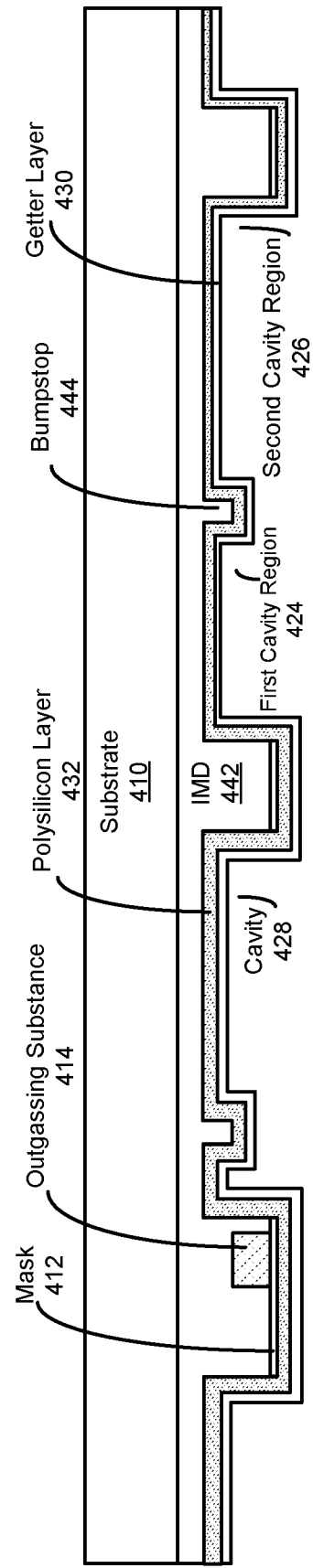

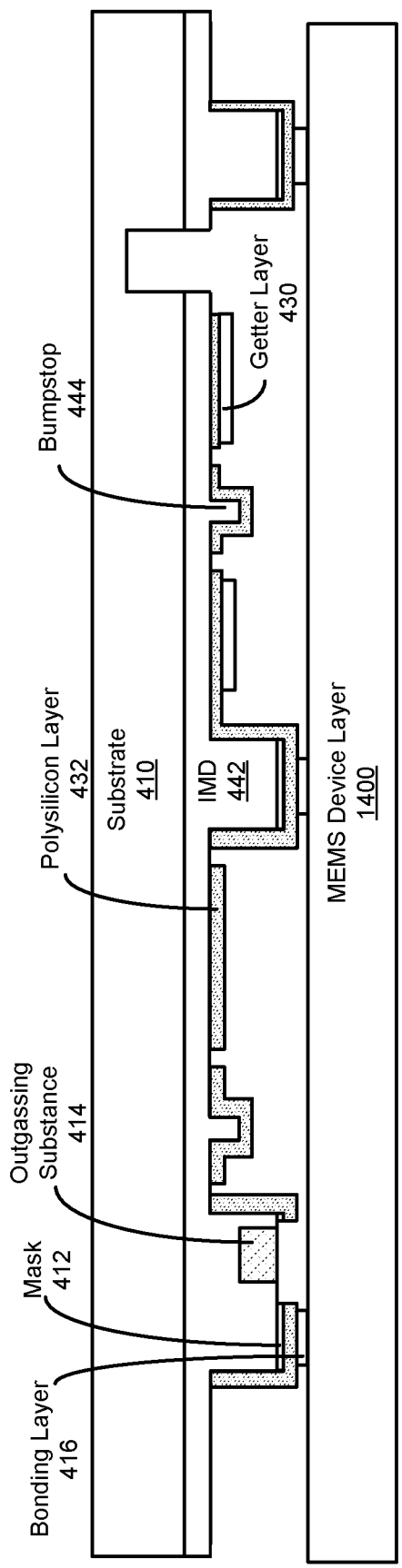
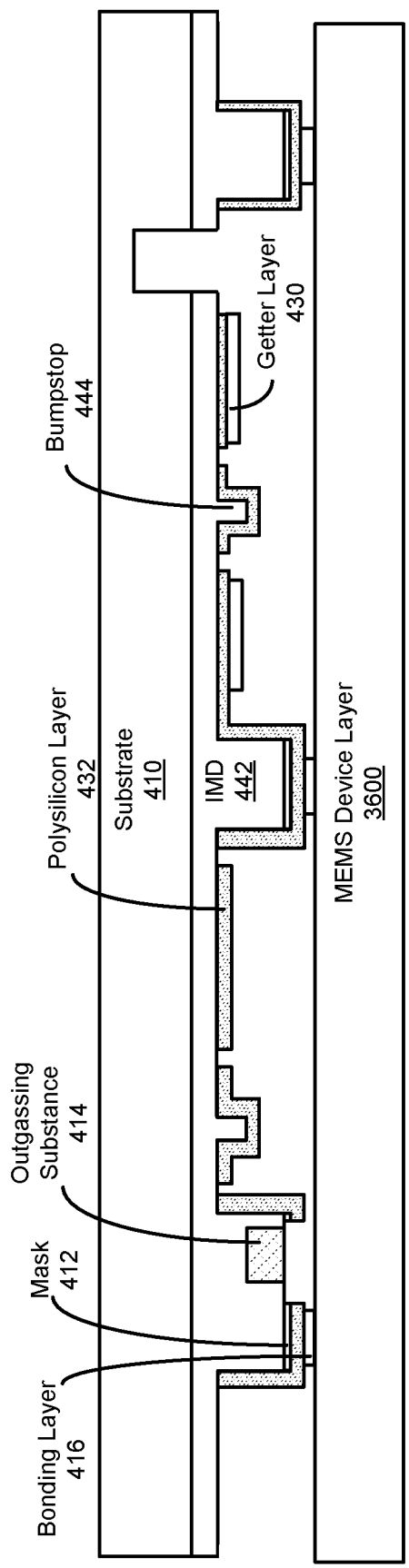
Figure 120C
Figure 120D

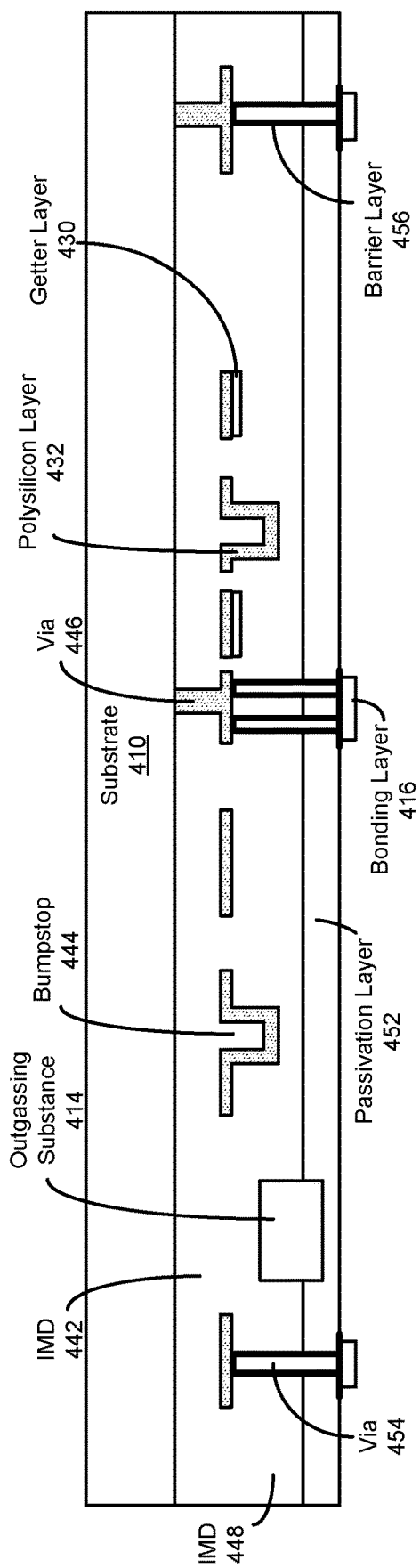
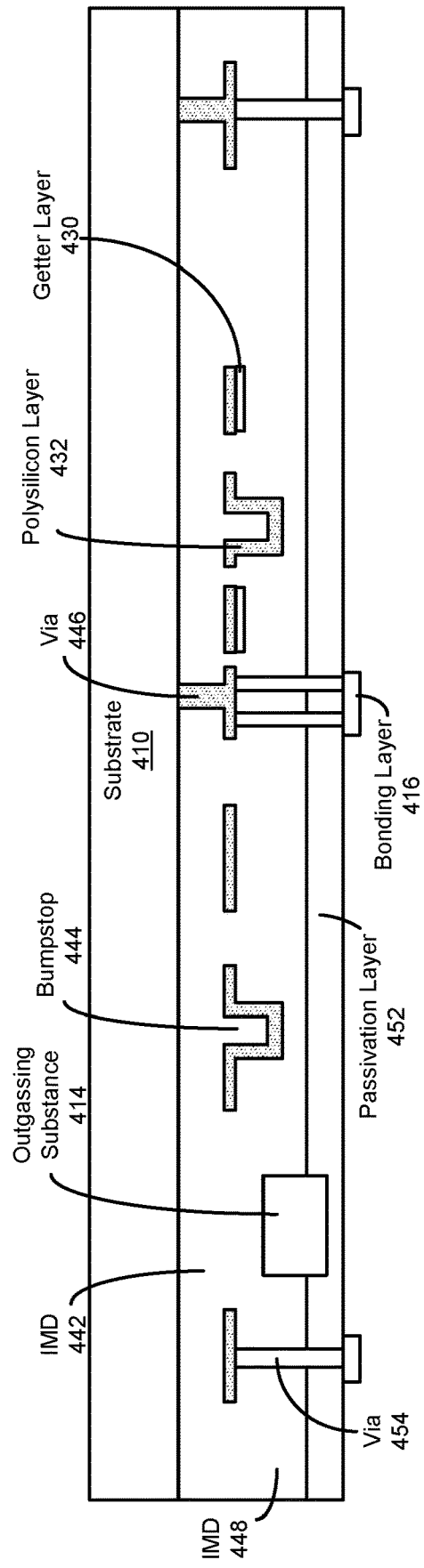

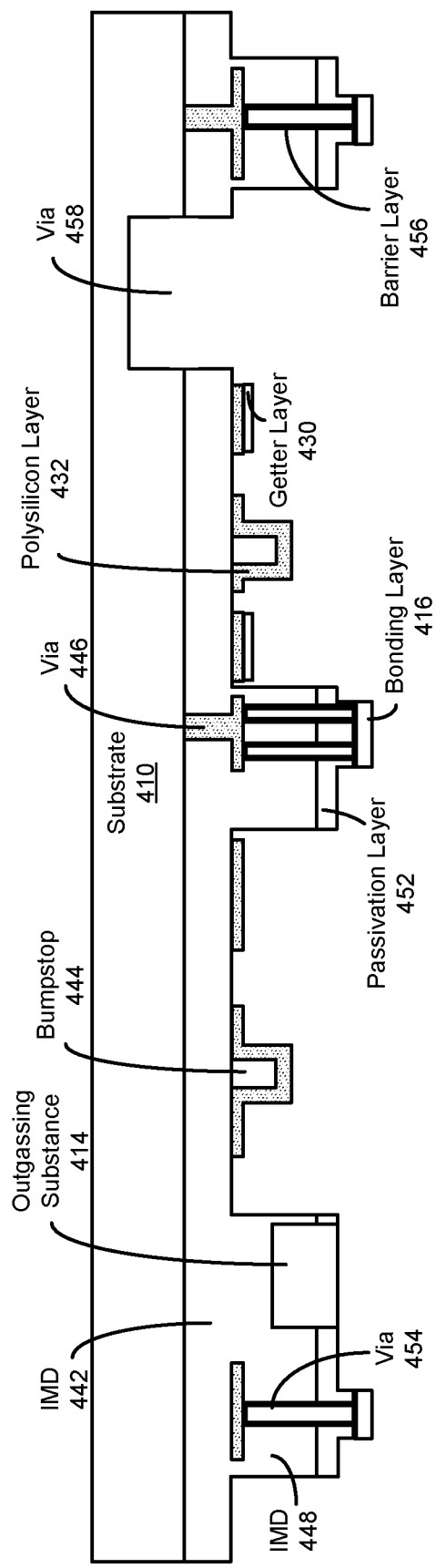
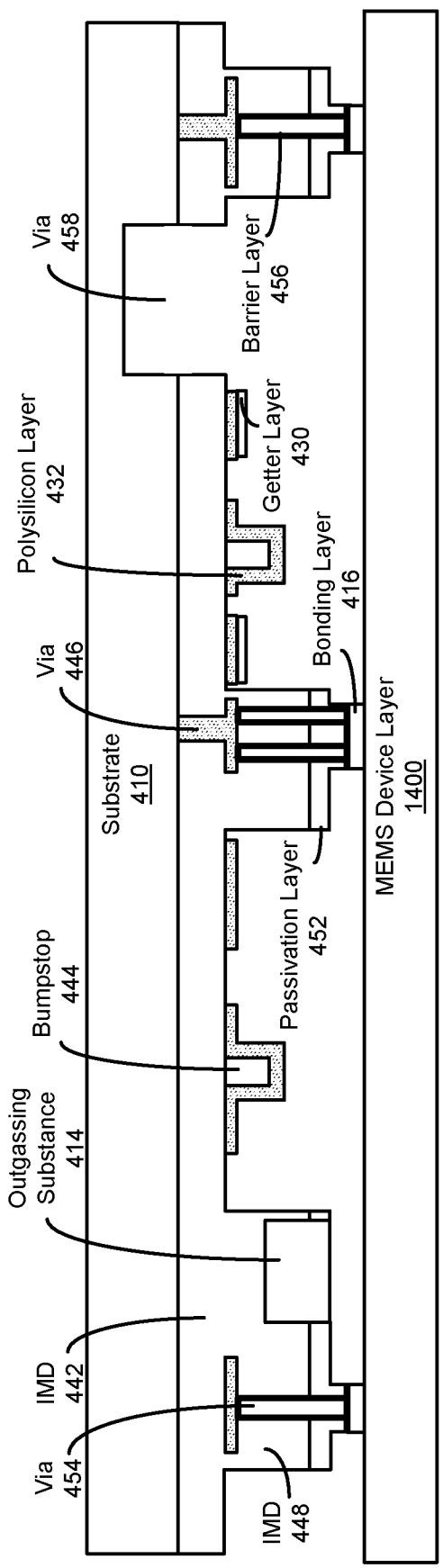
Figure 135A
Figure 135B

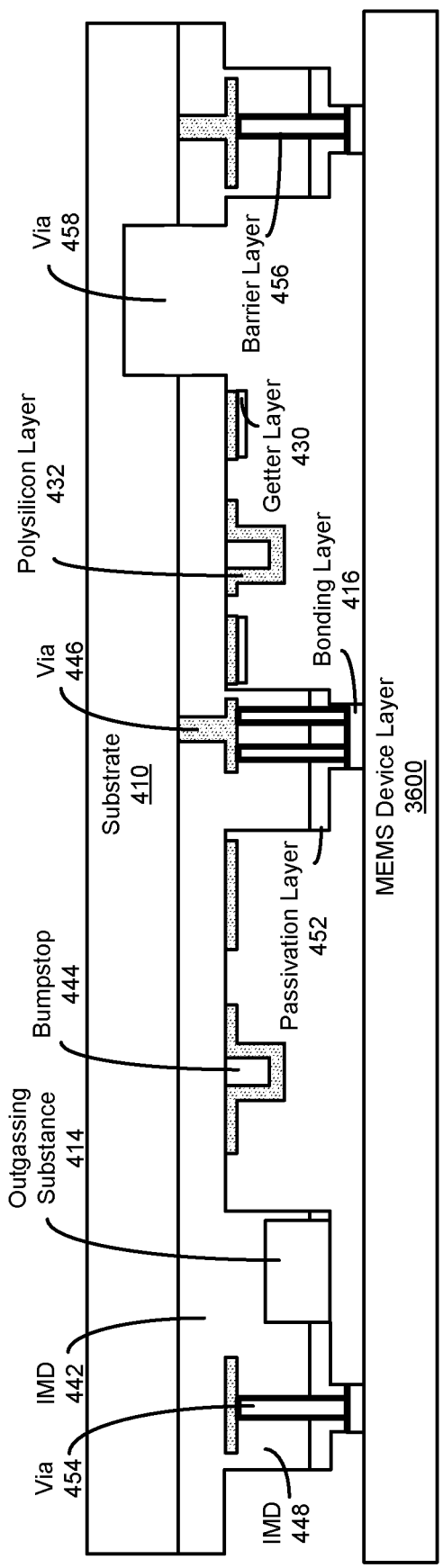
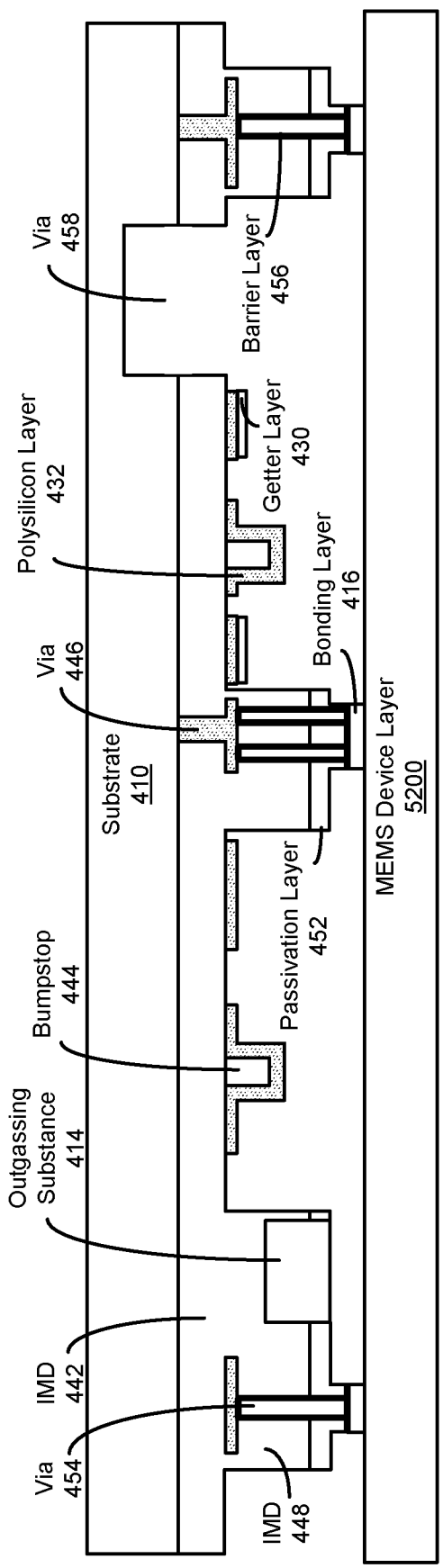
Figure 135C
Figure 135D

METHOD AND SYSTEM FOR FABRICATING A MEMS DEVICE

RELATED APPLICATIONS

The instant application is a non-provisional application and claims the benefit and priority to a provisional application No. 63/229,390 that was filed on Aug. 4, 2021, which is incorporated herein in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g., electronics for sensing). MEMS devices include but are not limited to, for example, gyroscopes, accelerometers, magnetometers, pressure sensors, etc.

Some MEMS devices may be formed by bonding a MEMS layer to a semiconductor layer, where the MEMS layer may include a cap layer and a MEMS device layer and wherein the semiconductor layer may include sensing electrodes and other circuitries. In general, sensors utilize monolithic integration of a MEMS device layer and a cap layer. Unfortunately, monolithic integration of the MEMS layer restricts its flexibility with respect to using advanced semiconductor technologies for high end sensor applications.

Traditionally, standoffs are created on the MEMS device layer through an etching process. The standoffs are then used to bond two components to one another and form one or more cavities. Unfortunately, creating the standoff by etching through the MEMS device layer using lithography causes issues such as photoresist pooling issue in the MEMS device layer patterning with the standoff.

A number of issues, e.g., high temperatures involving the fabrication process, stability of cavity pressure, stiction, etc., may impact the performance of the sensor. For example, high temperatures may be involved during the fabrication process of the MEMS layer. Unfortunately, high temperatures may cause protrusion on the electrodes, known as hillock effect, causing performance degradation. Certain sensing applications may need cavity pressure to be preserved. Unfortunately, over time cavity pressure may become unstable due to outgassing or slow gettering inside the cavity of the device (without the presence of the active getter that results in higher drift in the cavity pressure in operation). MEMS layer may utilize a structure such as a bumpstop to prevent the movable components of the MEMS device layer, e.g., proof mass, to contact and damage circuitries underneath it. Unfortunately, the movable components may stick to the bumpstop and fail to release (also known as stiction) causing performance issues with the device.

SUMMARY

Accordingly, a need has arisen to create a MEMS layer in a non-monolithic fashion, thereby enabling the MEMS layer to be integrated with a more advanced semiconductor technology. Moreover, a need has arisen to reduce hillock effect on various components, e.g., electrodes, improve stiction, stabilize the cavity pressure, and improve MEMS device layer lithography.

In some embodiments, the standoffs are formed on a substrate or on a cap layer that is fabricated separate and apart from the MEMS device layer in order to improve the MEMS device layer lithography. In some embodiments, various components, e.g., electrodes, may be formed out of a polysilicon material with higher thermal capacity in order to reduce hillock effect, thereby improving performance. Moreover, polysilicon interconnect may be used to connect the electrodes with high thermal capacity. It is appreciated that a getter material may be used to stabilize the cavity pressure, in some nonlimiting examples. Stiction may be improved, in some embodiments, by using a layer of polysilicon on the bumpstop.

A method includes depositing a first polysilicon layer over a first side of an actuator layer; forming a first intermetal dielectric (IMD) layer over the first polysilicon layer; etching the first IMD layer to form a via that exposes the first polysilicon layer and further to form a bump region; depositing a second polysilicon layer over the first IMD layer, the via and the bump region; etching a portion of the second polysilicon layer to expose a portion of the first IMD layer and to form a patterned second polysilicon layer; depositing a second IMD layer over the patterned second polysilicon layer and further over the exposed portion of the first IMD layer; etching a portion of the second IMD layer to expose a portion of the patterned second polysilicon layer and to form a patterned second IMD layer; depositing a third polysilicon layer over the patterned second IMD layer and further over the exposed portion of the second polysilicon layer; etching the third polysilicon layer to form a patterned third polysilicon layer; depositing a third IMD layer over the patterned third polysilicon layer and further over an exposed portion of the second IMD layer; fusion bonding the third IMD layer to a substrate; depositing a bond layer over a second side of an actuator layer, wherein the second side is opposite to the first side; patterning the bond layer to form a patterned bond layer; etching a pattern through the actuator layer, the first polysilicon layer and partially through the first IMD layer; and etching through the first IMD layer to form a cavity and further to expose a portion of the second polysilicon layer.

The method further comprising eutecticly bonding Germanium on a cap layer to the patterned bond layer. In some embodiments, the cap layer comprises at least one cavity. The method may further include thinning the cap layer and further deep reactive ion etching (DRIE) the cap layer to open and pattern bond pad outside of the at least one cavity. In some embodiments, at least a portion of the cap layer that faces the actuator layer is lined with a getter material, e.g., Ti. In some embodiments, the method includes depositing High Density Plasma Oxide (HDP) in the cap layer before bonding the cap layer. According to some embodiments, the bond layer comprises Aluminum or Germanium.

A method includes roughening a first side of an actuator layer; depositing a first InterMetal Dielectric (IMD) layer over the first side of the actuator layer; forming a via and a cavity within the first IMD layer; depositing a first polysilicon layer over the first IMD layer, the via and the cavity; patterning the first polysilicon layer to expose a portion of the first IMD layer and to form a patterned first polysilicon layer; depositing a second IMD layer over the patterned first polysilicon layer and further over the exposed portion of the first IMD layer; etching a portion of the second IMD layer to expose a portion of the patterned first polysilicon layer and to form a patterned second IMD layer; depositing a second polysilicon layer over a portion of the patterned second IMD layer and further over the exposed portion of the first polysilicon layer to connect the first polysilicon layer to the second polysilicon layer; depositing a third IMD layer over the second polysilicon layer and further over an exposed portion of the second IMD layer; fusion bonding the third IMD layer to a substrate; depositing a bond layer over a portion of a second side of the actuator layer, wherein the second side is opposite to the first side; etching a pattern through the actuator layer from the second side to partially etch through the first IMD layer; and etching through the first IMD layer through the etched pattern to form a cavity and further to expose a portion of the second polysilicon layer.

In some embodiments, the etching through the first IMD layer through the etched pattern is by timed vapor hydrofluoric etch process. The method may further include eutecticly bonding a cap layer to the eutectic bond layer. In some embodiments, the cap layer comprises at least one cavity. The method may further include thinning the cap layer and further deep reactive ion etching (DRIE) the cap layer to open and pattern bond pad outside of the at least one cavity. It is appreciated that at least a portion of the cap layer that faces the actuator layer is lined with a getter material, e.g., Ti. In some embodiments, the bond layer comprises Aluminum or Germanium.

A device includes a substrate; an intermetal dielectric (IMD) layer disposed over the substrate; a first plurality of polysilicon layers disposed over the IMD layer and over a bumpstop; a second plurality of polysilicon layers disposed within the IMD layer; a patterned actuator layer with a first side and a second side, wherein the first side of the patterned actuator layer is lined with a polysilicon layer, and wherein the first side of the patterned actuator layer faces the bumpstop; a standoff formed over the IMD layer; a via through the standoff making electrical contact with the polysilicon layer of the actuator and a portion of the second plurality of polysilicon layers; and a bond material disposed on the second side of the patterned actuator layer.

It is appreciated that in some embodiments the bumpstop is positioned in a cavity formed by the standoff and the IMD layer. In one nonlimiting example, the device further includes a cap layer, wherein germanium on the cap layer is eutecticly bonded to Aluminum on the bond material. According to some embodiments, the deice further includes an outgassing substance positioned within a cavity formed after eutecticly bonding the cap wafer. It is appreciated that the device may further include a getter material disposed over a surface of a cavity of the cap wafer.

These and other features and advantages will be apparent from a reading of the following detailed description.

BRIEF DESCRIPTION OF DRAWINGS

FIGS. 1-14A show fabrication process for a MEMS device layer according to one aspect of the present embodiments.

FIGS. 18-36B show fabrication process for another MEMS device layer according to another aspect of the present embodiments.

FIGS. 40-52 show fabrication process for a MEMS device layer according to yet another aspect of the present embodiments.

FIGS. 56-69A show fabrication process for a cap layer according to a first aspect of the present embodiments.

FIG. 70 shows a method flow for fabricating a cap layer according to a first aspect of the present embodiments.

FIGS. 71-83A show fabrication process for a cap layer according to a second aspect of the present embodiments.

FIG. 84 shows a method flow for fabricating a cap layer according to a second aspect of the present embodiments.

FIGS. 85-92A show fabrication process for a cap layer according to a third aspect of the present embodiments.

FIG. 93 shows a method flow for fabricating a cap layer according to a third aspect of the present embodiments.

FIGS. 94-103A show fabrication process for a cap layer according to a fourth aspect of the present embodiments.

FIGS. 105-110A show fabrication process for a cap layer according to a fifth aspect of the present embodiments.

FIGS. 110B-110D show bonding of a MEMS device layer to a cap layer according to a fifth aspect of the present embodiments.

FIGS. 111-120B show fabrication process for a cap layer according to a sixth aspect of the present embodiments.

FIGS. 120C-120E show bonding of a MEMS device layer to a cap layer according to a sixth aspect of the present embodiments.

FIGS. 122-135A show fabrication process for a cap layer according to a seventh aspect of the present embodiments.

FIGS. 135B-135D show bonding of a MEMS device layer to a cap layer according to a seventh aspect of the present embodiments.

FIGS. 135E-136 show bonding of a MEMS device layer to a cap layer forming a MEMS layer, MEMS layer thinning and opening a bond pad according to a seventh aspect of the present embodiments.

DESCRIPTION

Figure 4:
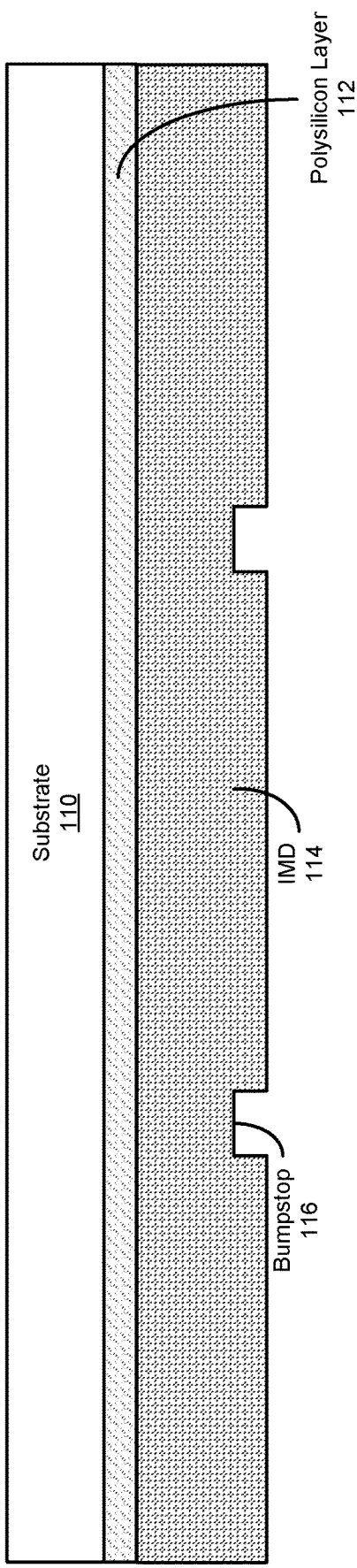

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc., are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS layer may include a MEMS device layer coupled to a cap layer. The MEMS device layer may commonly be referred to as the actuator layer with movable structures, e.g., proof mass, etc. The cap layer coupled to the MEMS device layer may form one or more cavities for housing moveable structures of gyro, accelerometer, etc. It is appreciated that the MEMS layer may be coupled to a semiconductor layer, e.g., a CMOS layer, to form a MEMS device.

The embodiments described herein, decouples the fabrication process for the MEMS layer in a non-monolithic fashion. The embodiments fabricate polysilicon electrodes and/or polysilicon interconnection layers on a substrate, thereby reducing hillock effects and eliminating a need to create slotting to account for hillock. Moreover, the embodiments utilize polysilicon bumpstop to reduce stiction. Moreover, standoff formation in the MEMS device layer is eliminated by forming it on a substrate and/or on a cap layer, thereby improving the MEMS device layer lithography by reducing photoresist pooling. It is appreciated that for the MEMS device layer patterning, photoresist may be thicker in the transition region with topography (thicker near the standoff region), thereby causing uniformity issues between different regions such as patterning far from the standoff as opposed to near the standoff region In some embodiments, the MEMS device layer is bonded to a substrate. Electrodes comprising polysilicon material are formed and a bumpstop with a layer of polysilicon is formed, thereby reducing hillock effects and stiction. A bond pad may be formed on the MEMS device layer. In some embodiments getter material comprises Titanium, Cobalt or Zirconium and outgassing substance comprises high-density plasma oxide.

According to some embodiments, a cap layer is fabricated to bond with the MEMS device layer. In some embodiments, High Density Plasma oxide (HDP) is deposited in the cap layer to form an outgassing substance for damping purposes, e.g., in accelerometer cavity with high cavity pressure, while certain cavity surfaces of the cap layer, e.g., gyro cavity with low pressure, may be coated with a getter material to stabilize the cavity pressure. The cap layer may also optionally include a polysilicon electrode similar to the MEMS device layer as well as a bumpstop with a layer of polysilicon.

It is appreciated that in some embodiments have the additional advantage of tighter vertical gap control by eliminating eutectic bond squish. Moreover, the embodiments, allow for tighter MEMS device layer to substrate lithography alignment. Furthermore, the MEMS device layer may be released through a deep reactive-ion etching (DRIE) without using an oxide etch stop. It may be appreciated that the embodiments also enable single-sided anchor between the substrate and the MEMS device layer, thereby reducing the device size.

Referring now to FIGS. 1-14A, fabrication process for a MEMS device layer according to one aspect of the present embodiments is shown. In FIG. 1, a substrate 110 is provided. The substrate 110 may be a p-silicon substrate or an n-silicon substrate. The fabrication is described with respect to a p-silicon substrate for illustrative purposes and should not be construed as limiting the scope of the embodiments. For example, an n-silicon substrate may be used. The substrate 110 will eventually form the actuator layer of the MEMS device layer.

Referring now to FIG. 2, a polysilicon layer 112 is deposited over the substrate 110. In other words, the polysilicon layer 112 is deposited over a first side of the substrate 110 (also known as the actuator layer). In one nonlimiting example, the polysilicon layer 112 may cover the entire surface of the substrate 110 layer. In one nonlimiting example, the polysilicon layer 112 may be doped in-situ or ion implantation may occur after undoped poly is deposited. It is appreciated that the polysilicon layer 112 provide roughness the is advantages to improve stiction. Moreover, polysilicon may form one or more electrodes, thereby reducing hillock effects.

Referring now to FIG. 3, an intermetal dielectric (IMD) 114 layer is deposited over the polysilicon layer 112. The IMD layer 114 may include material such as $SiO_2$, SiN, etc.

Figure 5:
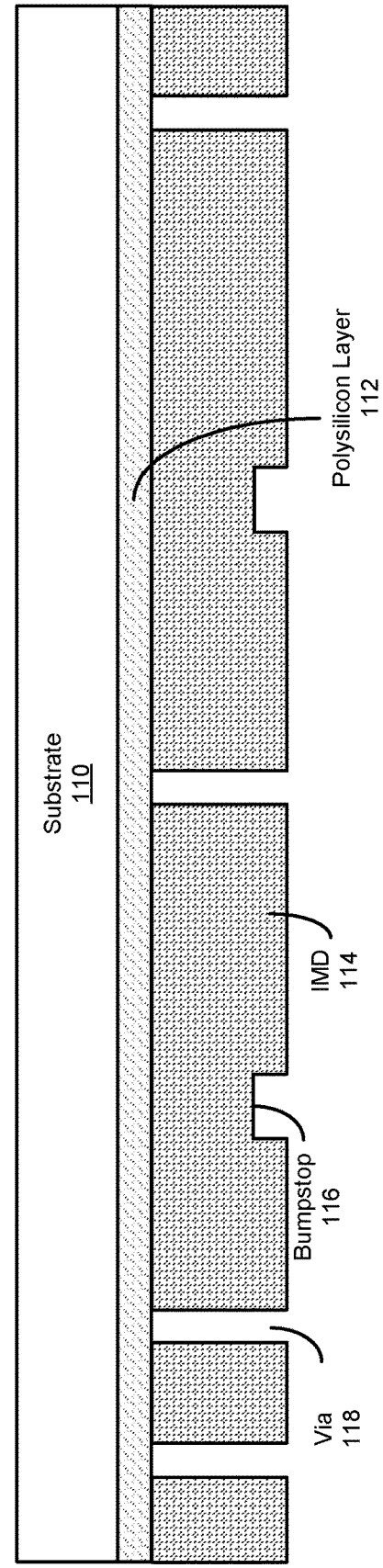

Referring now to FIG. 4, a mask is deposited over the IMD 114 layer and patterned where the exposed surfaces of the IMD 114 layer correspond to bumpstop regions. Once mask is patterned, the IMD 114 layer may be etched to form the bumpstop 116. Referring now to FIG. 5, a patterned mask over the IMD 114 layer is formed where the exposed portions of the patterned mask correspond to via regions. Subsequent to formation of the patterned mask, the IMD 114 layer is etched to forms one or more vias or a closed loop via 118.

Referring now to FIG. 6, a polysilicon layer 120 is deposited over the IMD 114 layer and within the vias 118. As such, the polysilicon layer 120 connects with the polysilicon layer 112. It is appreciated that the polysilicon layer 120 may compose of a same material as that of polysilicon layer 112. Polysilicon filling the closed loop via 118 may completely encapsulate IMD 114 inside the closed loop via where IMD can be protected from the vapor hydrofluoric (HF) etch in the later release step.

Referring now to FIG. 7, a patterned mask is formed over the polysilicon layer 120 and the exposed portions of the polysilicon layer 120 is etched. Etching the polysilicon layer 120 forms a patterned polysilicon layer and may expose the IMD 114 layer underneath. It is appreciated that the polysilicon layer 120 may be coplanar except for the portion that covers the bumpstops 116.

Figure 8:
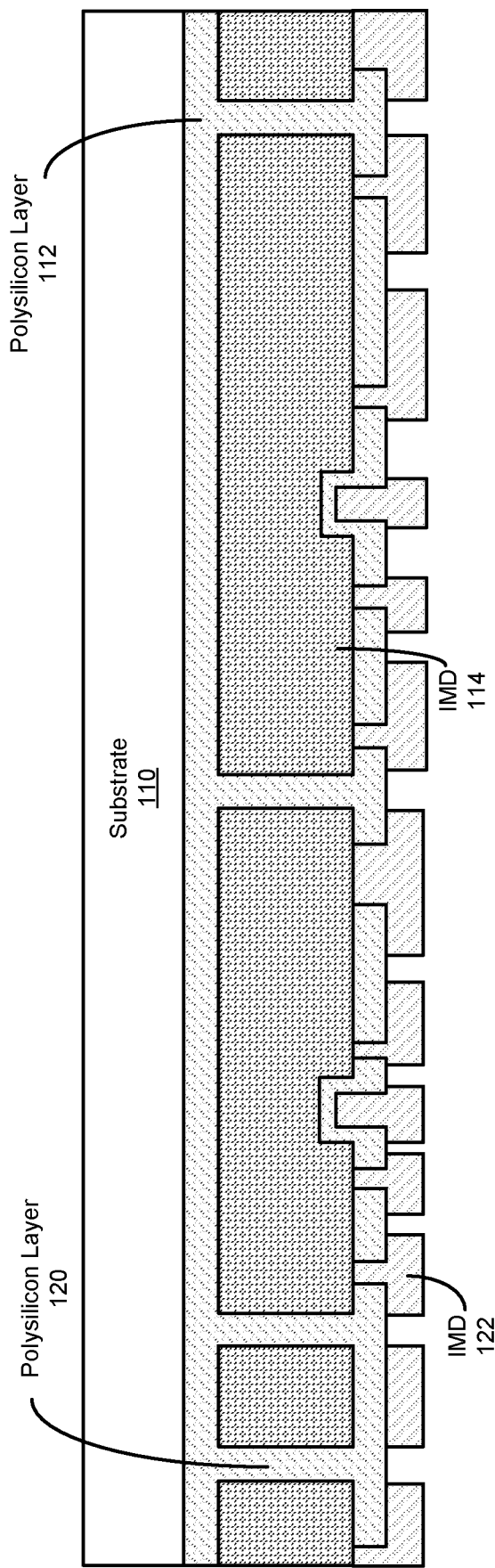

Referring now to FIG. 8, an IMD 122 layer is deposited over the patterned polysilicon layer 120 and further on the exposed IMD 114 layer. It is appreciated that the IMD 122 layer may compose of the same material as that of IMD 114 layer for illustrative purposes but should not be construed as limiting the scope of the embodiments. Once the IMD 122 layer is deposited it may go through chemical mechanical polishing (CMP) process. In one alternative embodiment, the IMD 122 layer deposition may be a multistep process. For example, one layer of IMD may be deposited, chemically and mechanically planarized with stopping at polysilicon layer 120, followed by depositing a passivation layer such as SiN layer, and subsequently depositing another layer of IMD layer. SiN layer may serve as an etch stop layer for vapor HF etch in the later release step.

A patterned mask may be formed over the IMD 122 layer where the exposed portions of the IMD 122 layer (i.e., uncovered by the patterned mask) correspond to one or more via. The IMD 122 layer is etched to forms the vias.

Figure 9:
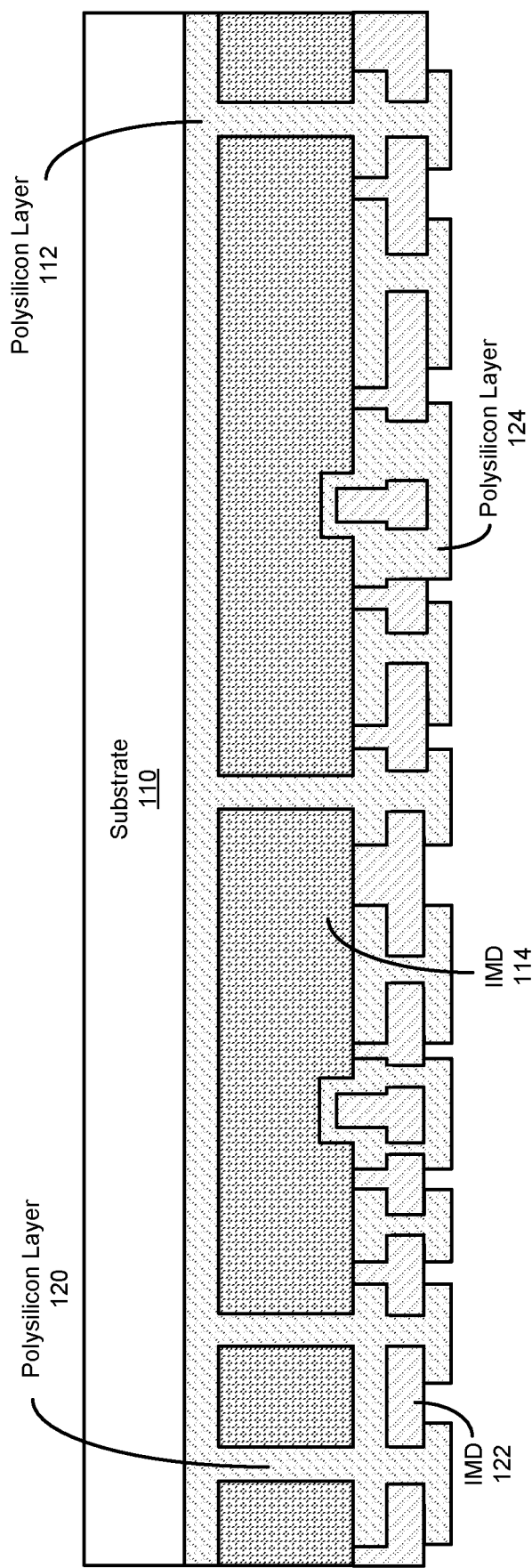

Referring now to FIG. 9, a polysilicon layer 124 is deposited over the IMD 122 layer and within the formed vias. It is appreciated that the polysilicon layer 124 may be patterned by forming a patterned mask and etching the exposed regions of the polysilicon layer 124. It is appreciated that the polysilicon layer 124 is coplanar. In one alternative embodiment, the vias in IMD 122 layer may be filled with Ti/TiN/Tungsten or copper and the polysilicon layer 124 can be replaced by other material including the stack of poly and Ti silicide, AlCu and copper. The benefit of using the alternative material is the wiring resistance reduction due to the reduced sheet resistance. The thermal budget needs to be considered in the post process steps.

Figure 10:
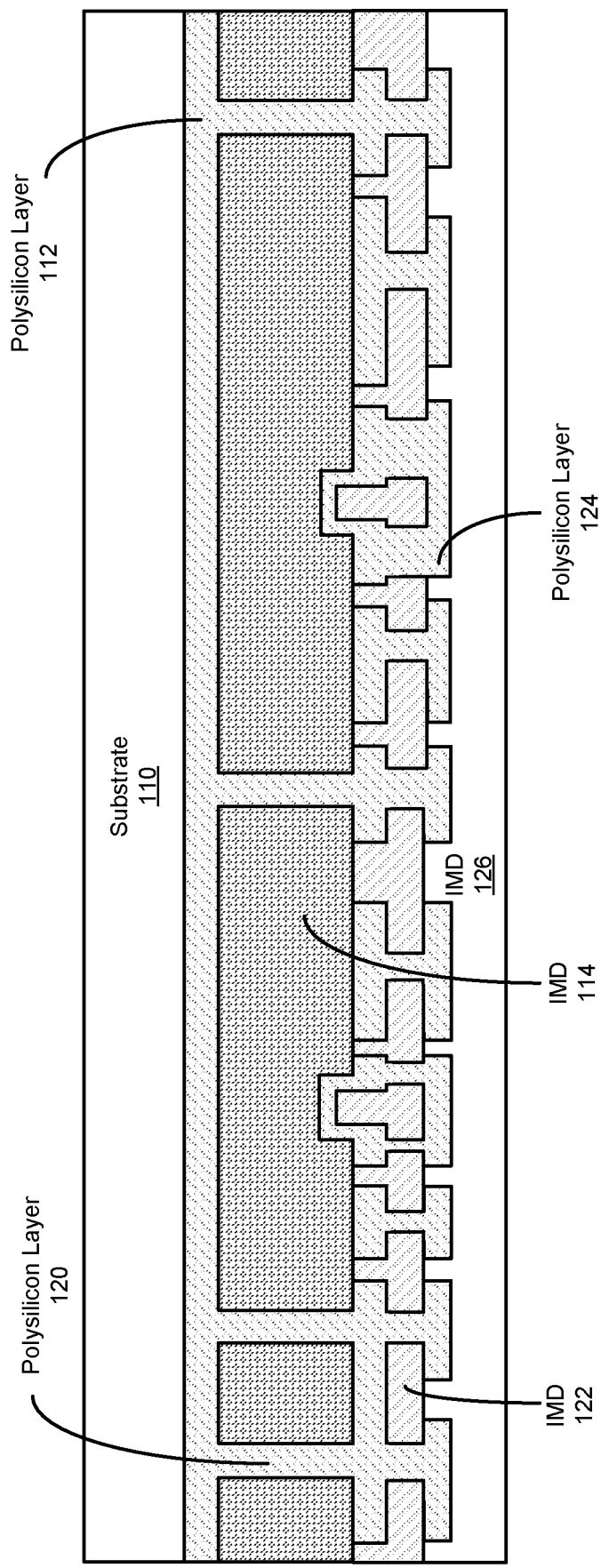
Figure 11:
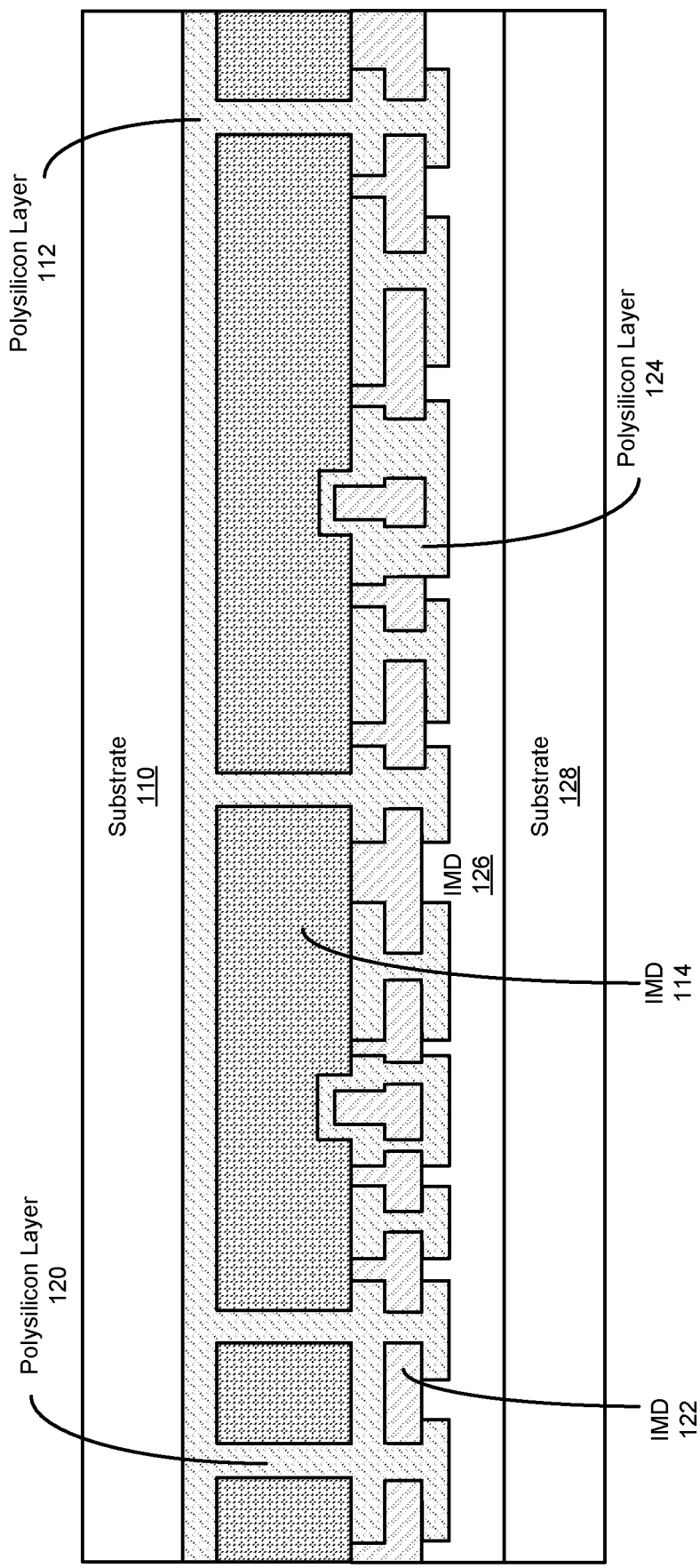

Referring now to FIG. 10, an IMD 126 layer is deposited over the patterned polysilicon layer 124 and further on the IMD 122 layer. It is appreciated that the IMD 126 layer may include the same material as the IMD 122 layer. The IMD 126 layer is served as a fusion bond layer to bond to a substrate 128, which may be a p-silicon or n-silicon substrate, as illustrated in FIG. 11.

Figure 12:
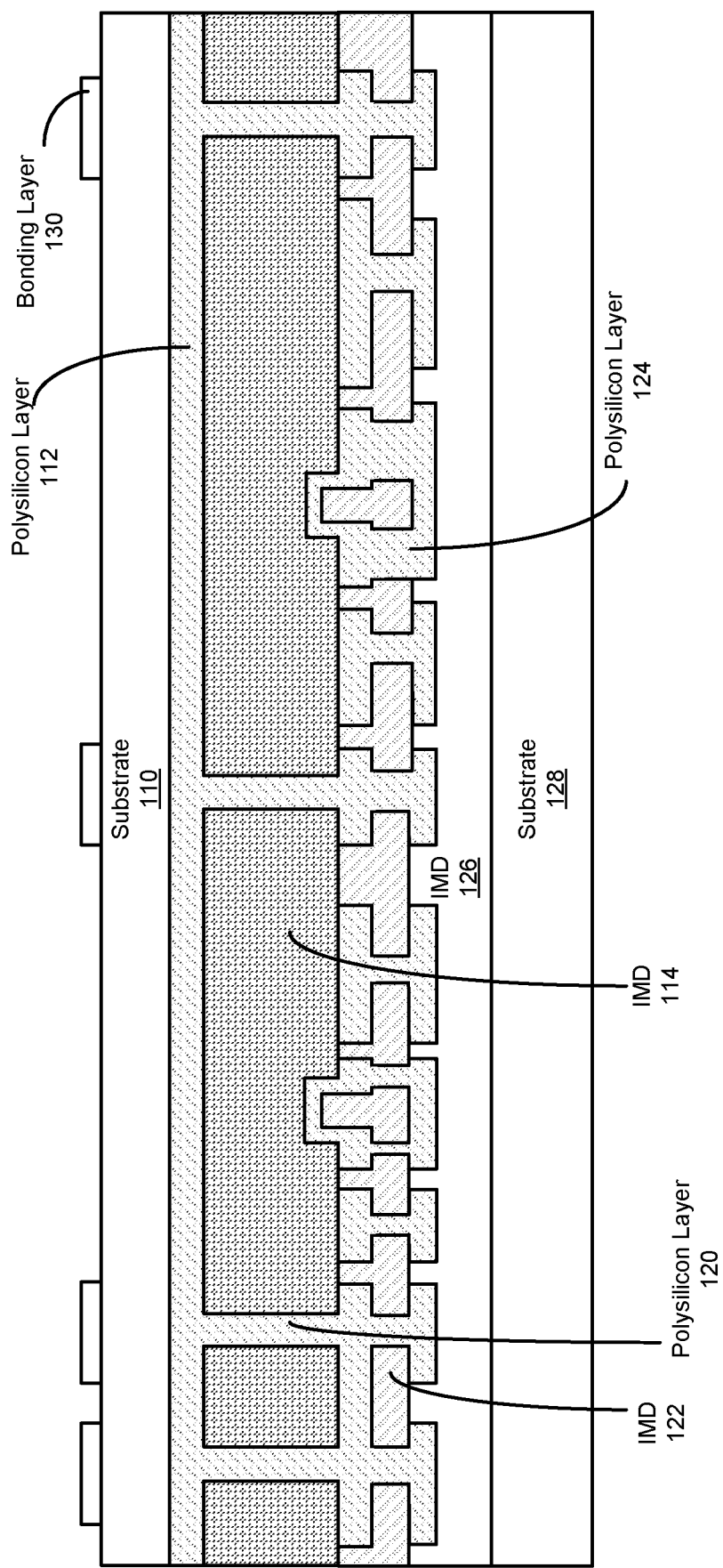

Referring now to FIG. 12, a bond layer 130 is deposited over the substrate 110 and is subsequently patterned by forming a patterned mask and etching the exposed regions of the substrate 110. It is appreciated that the substrate 110 may also be thinned down for defining the MEMD device layer. The bond layer 130 may comprise material such as Ge, AlCu, Al, etc. For example, Al and Ge may be eutecticly bonded together.

Figure 13:
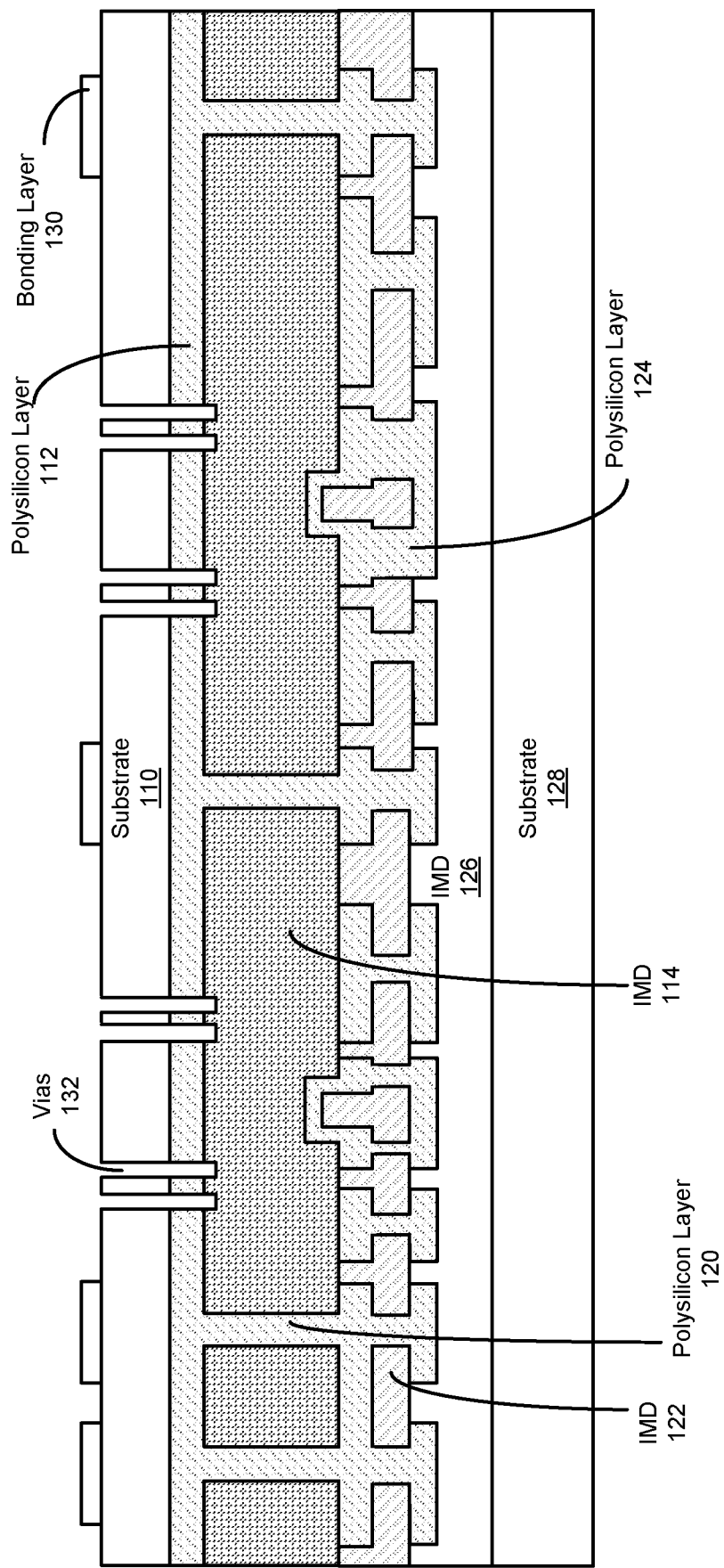

Referring now to FIG. 13, substrate etching is performed by forming a patterned mask on the substrate 110 in order to form one or more vias 132. The vias 132 go through the substrate 110 and further through the polysilicon layer 112 and further reach the IMD 114 layer.

Figure 14A:
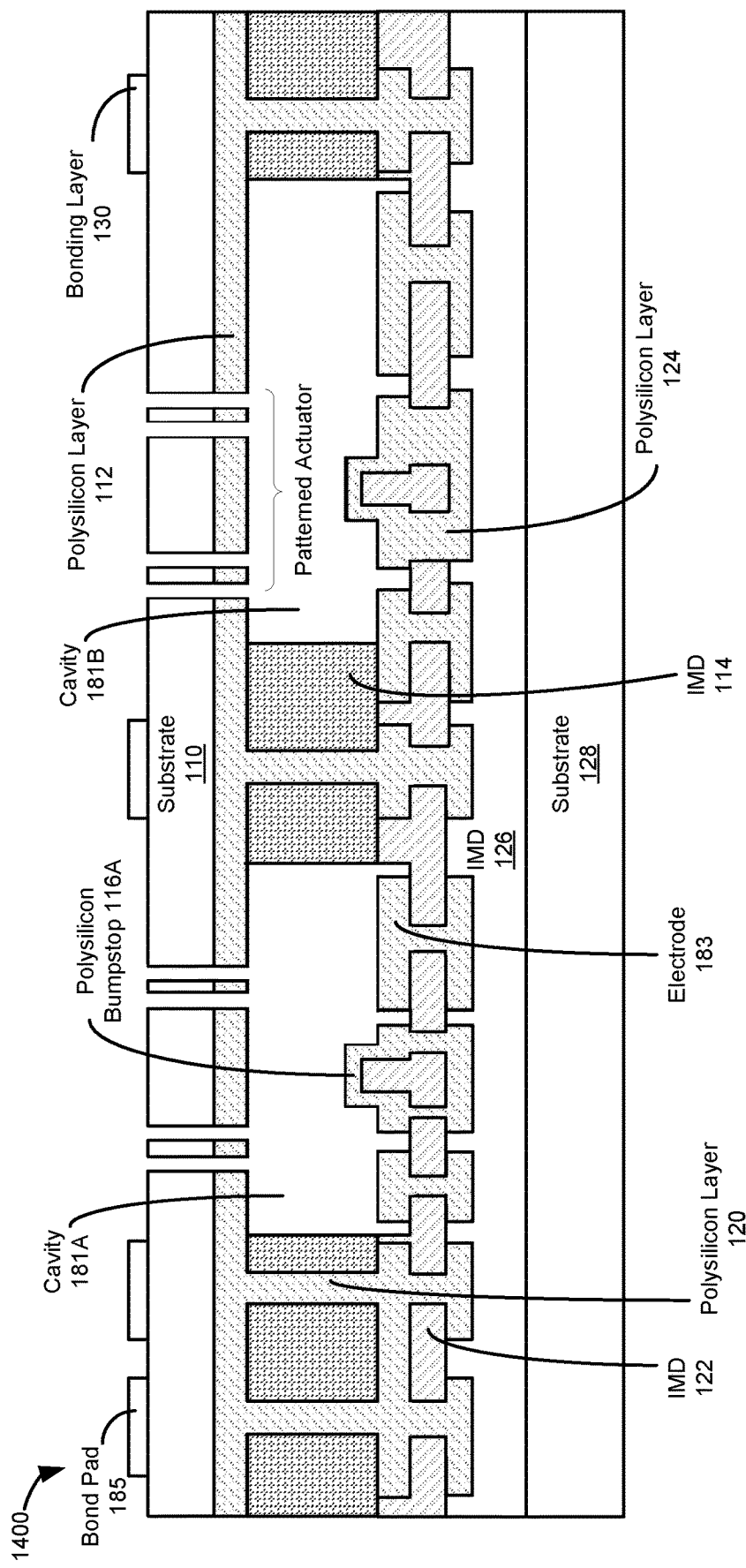

Referring now to FIG. 14A, a MEMS device layer 1400 is shown. The MEMS device layer is released by timed vapor hydrofluoric (HF) etch. This process may be referred to as actuator release. The HF etching etches a portion of the IMD 114 layer to form one or more cavities. For example, cavities 181A and 181B are formed between a top layer of the polysilicon layer 112, side walls of IMD 114 layer and bottom that includes IMD 122 layer and polysilicon layer 124. In some optional embodiments, IMD 114 may be fully encapsulated by polysilicon layer 120 with a closed loop via 118. In some optional embodiments, IMD 122 may contain SiN layer. The polysilicon layer 120 and/or the SiN layer may serve as the etch stop layer for the vapor HF etching. The benefit of using the lateral and/or vertical etch stop layer is more controlled etch process (less sensitive to the etch time). In one nonlimiting example an anti-stiction coating layer, e.g., a self-assembled monolayer (SAM), may be applied to improve stiction.

It is appreciated that a polysilicon bumpstop 116A is formed from the IMD 122 layer covered with a layer of polysilicon layer 124, thereby improving stiction. Moreover, the top of the cavities 181A and 181B are lines with a polysilicon layer 112, thereby also improving stiction when the movable structures make contact with the bumpstop 116A due to poly-to-poly contact. Furthermore, one or more electrodes 183 are formed comprising polysilicon, thereby reducing hillock effects. It is appreciated that one cavity may be used for gyro-sensing while another may be used for accelerometer. It is appreciated that the bond layer 130 on the substrate 110 may be used as a bond pad 185 to connect the MEMS device layer 1400 to other circuitries, e.g., a CMOS layer.

Figure 14B:
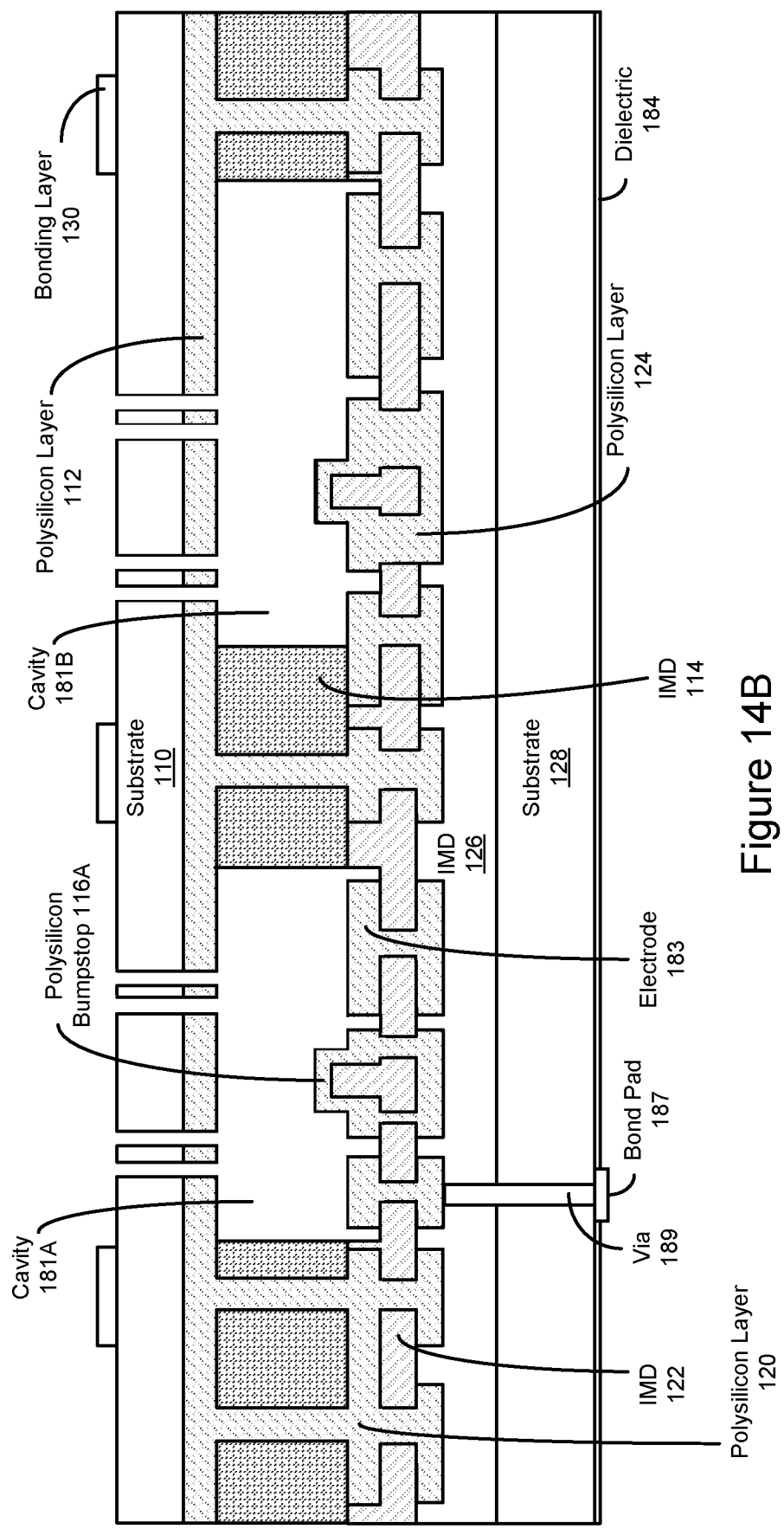
FIG. 14B shows the MEMS device layer with a bond pad formed on the back side of the MEMS device according to one aspect of the present embodiments.

Referring now to FIG. 14B, the MEMS device layer with a bond pad formed on the back side of the MEMS device according to one aspect of the present embodiments is shown. In this embodiment, a bond pad 187 may be formed on the back side of the substrate 128, thereby reducing the chip size. In this embodiment, a via 189 is formed by depositing a dielectric 184 layer substrate 128, etching through the dielectric 184 layer, the back of the substrate 128 and the IMD 126 layer to connect the bond pad 187 to an electrode, comprising polysilicon material in this example. In one embodiment, the interior of the formed via 189 is insulated by depositing material such as an oxide. Thereafter, a conductive layer such as polysilicon, Ti, TiN, Cu, etc., may line the interior of the formed via 189. The bond pad 187 comprising conductive material is deposited on the back side of the substrate 128 and patterned to cover the formed via 189. It is appreciated that the backside bond pad 187 may be formed after the MEMS device layer is bonded to a cap layer, e.g., eutecticly bonded.

Figure 15:
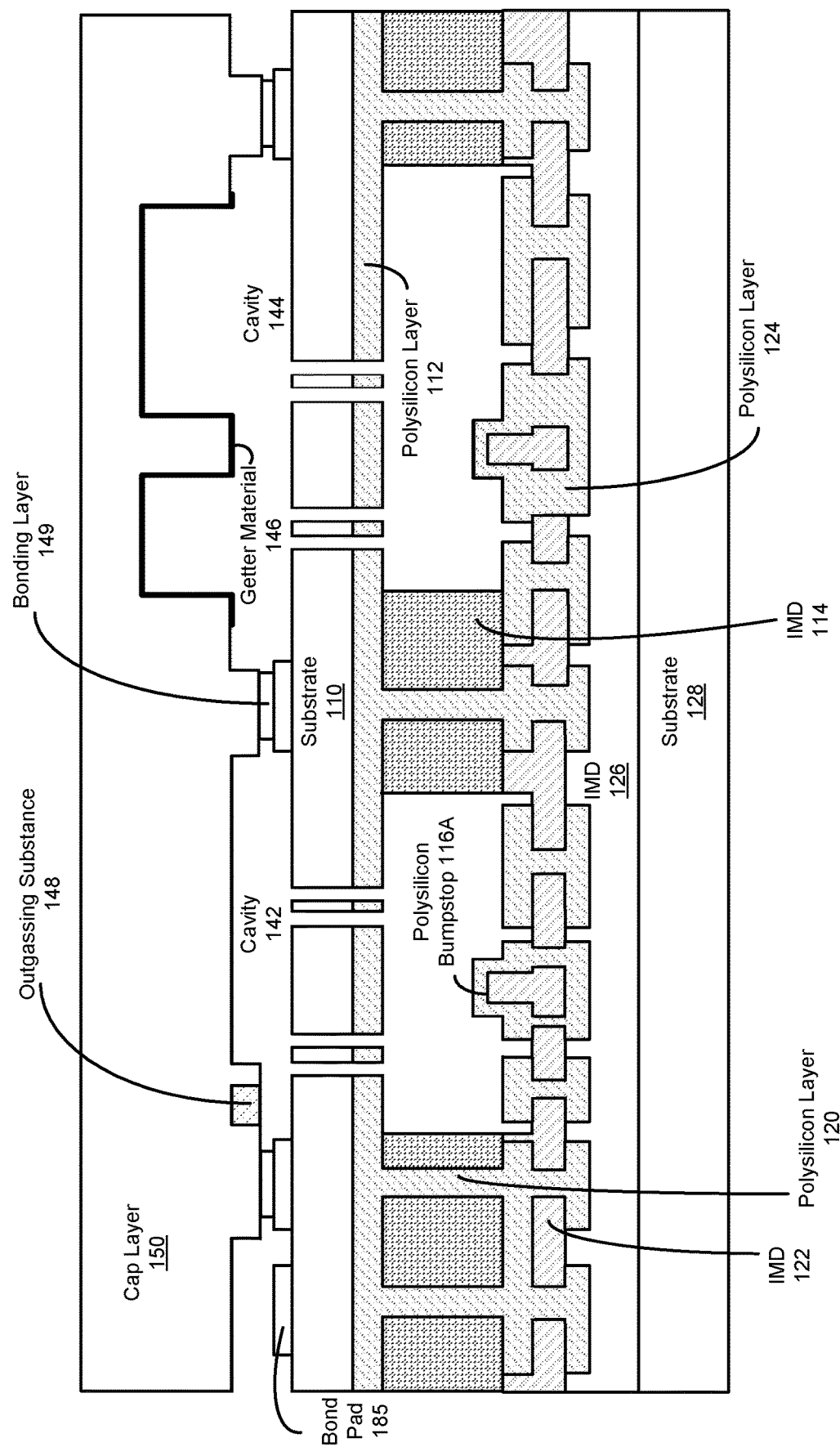
FIGS. 15 and 16 show bonding of a MEMS device layer to a cap layer forming a MEMS layer, MEMS layer thinning and opening a bond pad according to one aspect of the present embodiments.

Referring now to FIG. 15, bonding of a MEMS device layer 1400 to a cap layer 150 is shown. The bonding layer 149 of the cap layer 150 may bond to the bonding layer 130 on the MEMS device layer to bond them together and to form the cavities 142 and 144. In an example, eutectic bond can be formed by heating germanium in bond layer 149 and aluminum in bond layer 130. The eutectic bond provides a hermetic seal to cavity 142 and cavity 144. The eutectic bond provides electrical connection from cap 150 to substrate layer 110. The cap layer 150 may include an outgassing substance 148 by depositing HDP in that region. The outgassing substance 148 may be used for damping purposes in accelerometer cavity 142 with high cavity pressure. An upper surface of the cap layer 150 cavity 144 may be lined with a getter material 146, e.g., Ti, TiN, etc. to stabilize the cavity 144 pressure, making it suitable for gyro measurements.

Figure 16:
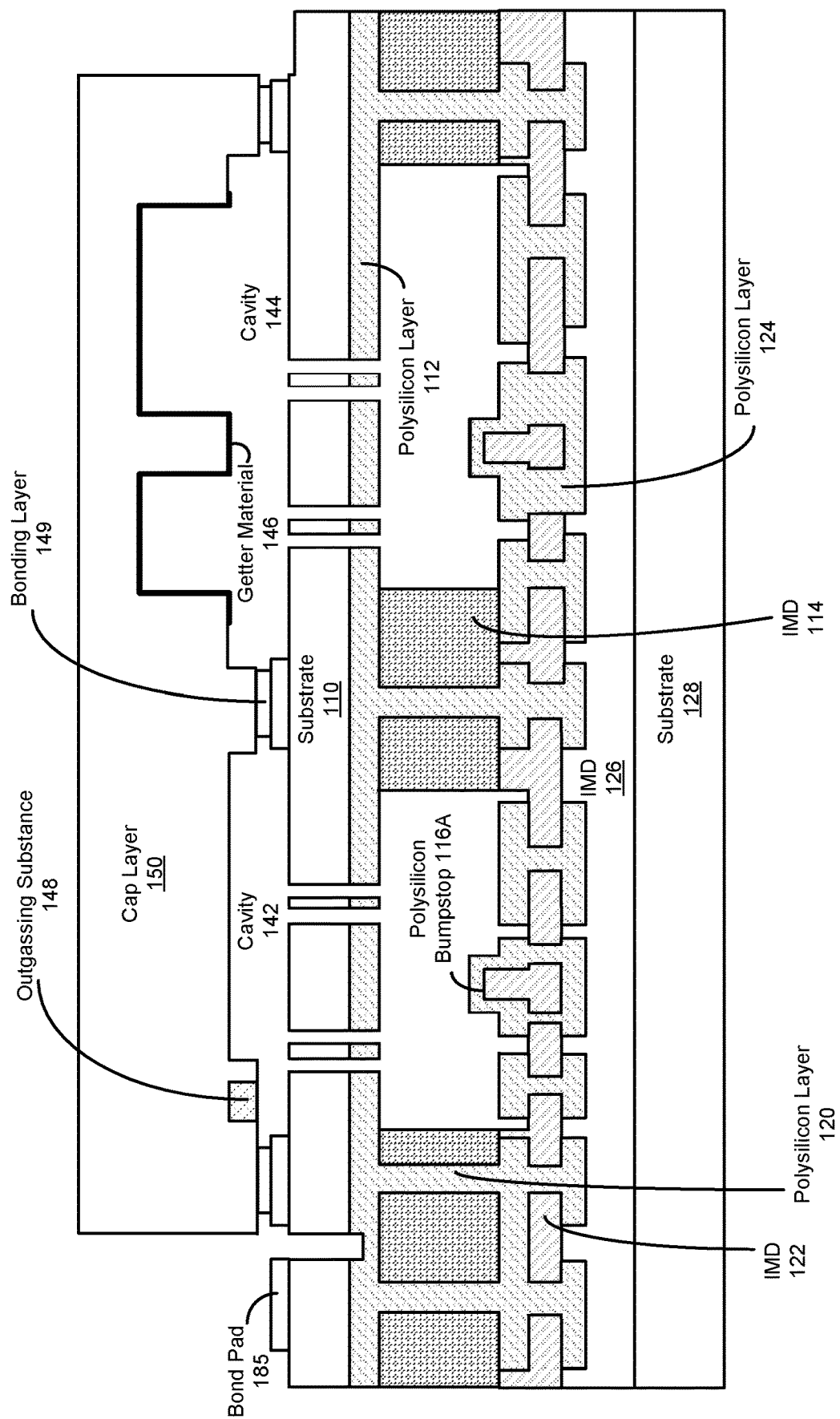

Referring now to FIG. 16, the cap layer 150 is thinned and etched, e.g., DRIE, to expose the bond pad 185.

Figure 17A:
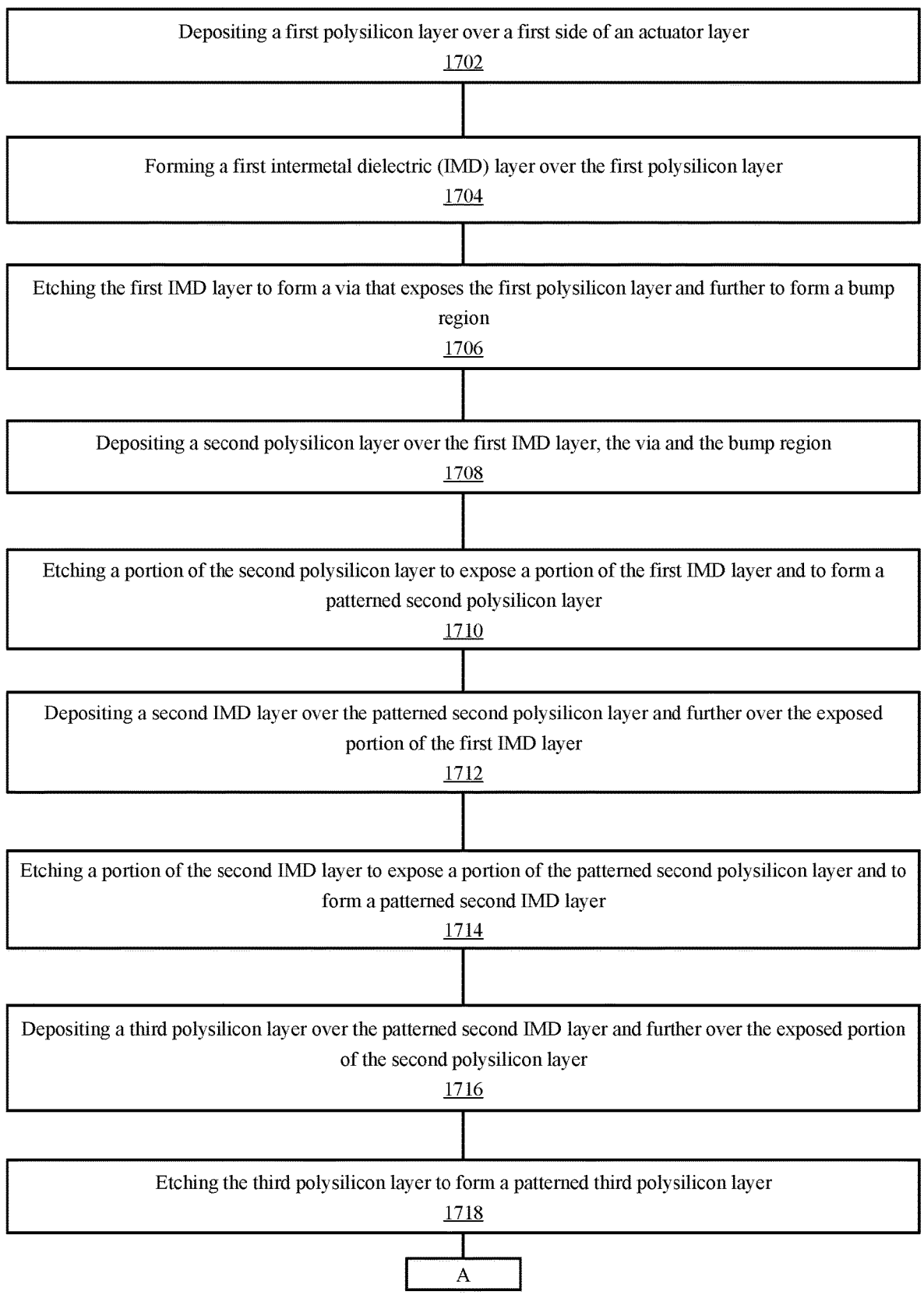
FIGS. 17A-17D show a method flows for fabricating a MEMS device layer according to one aspect of the present embodiments.
Figure 17B:
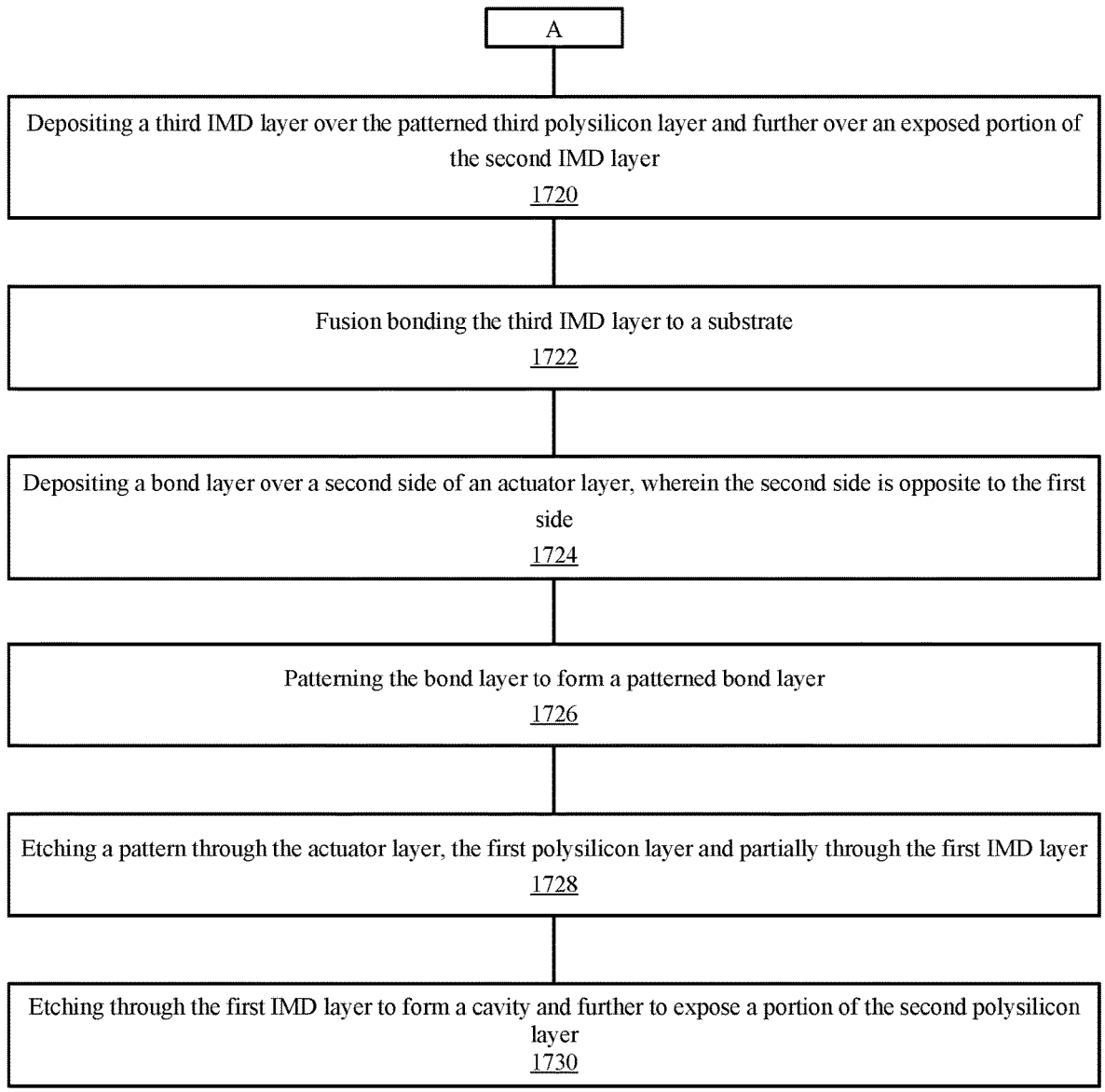
Figure 17C:
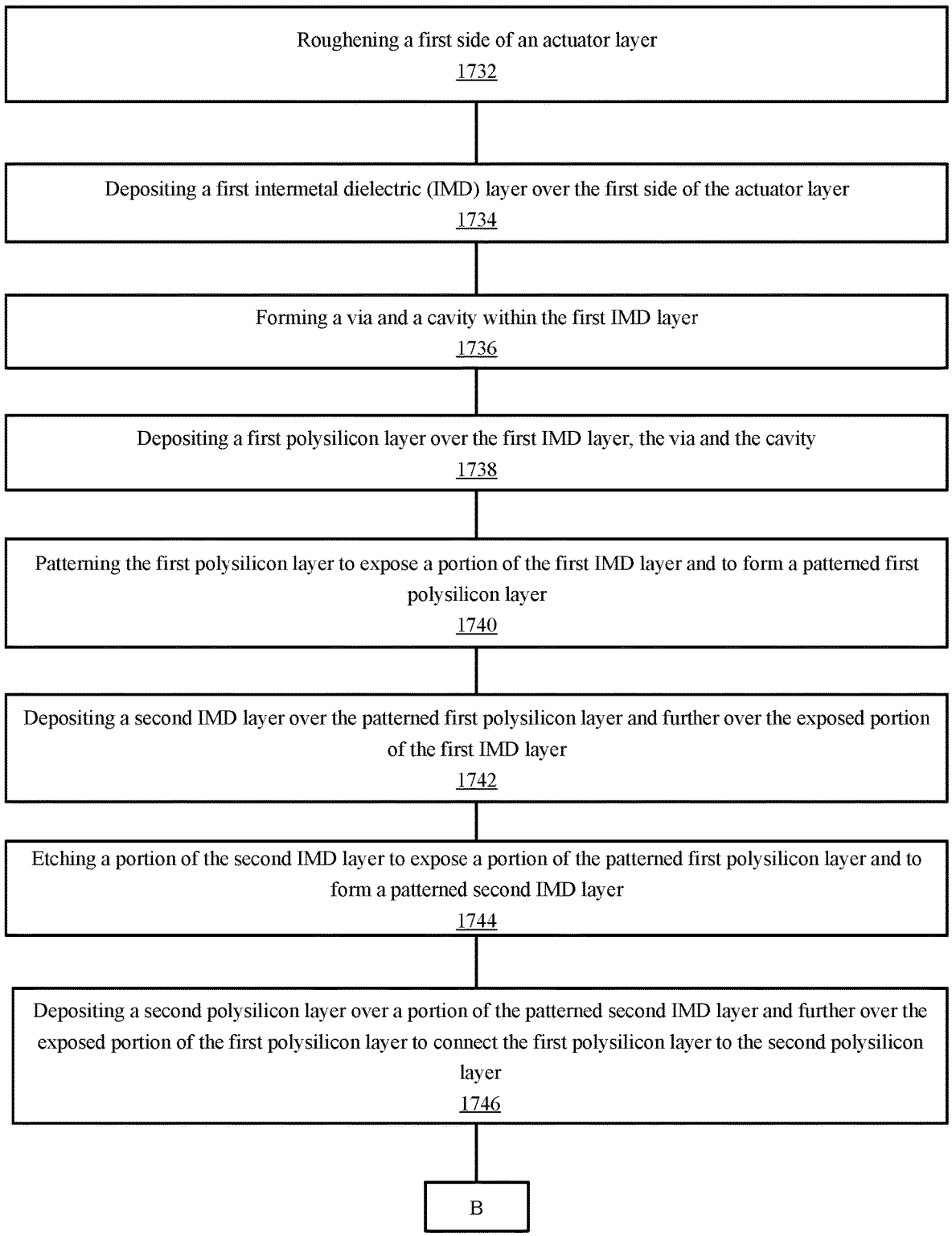
Figure 17D:
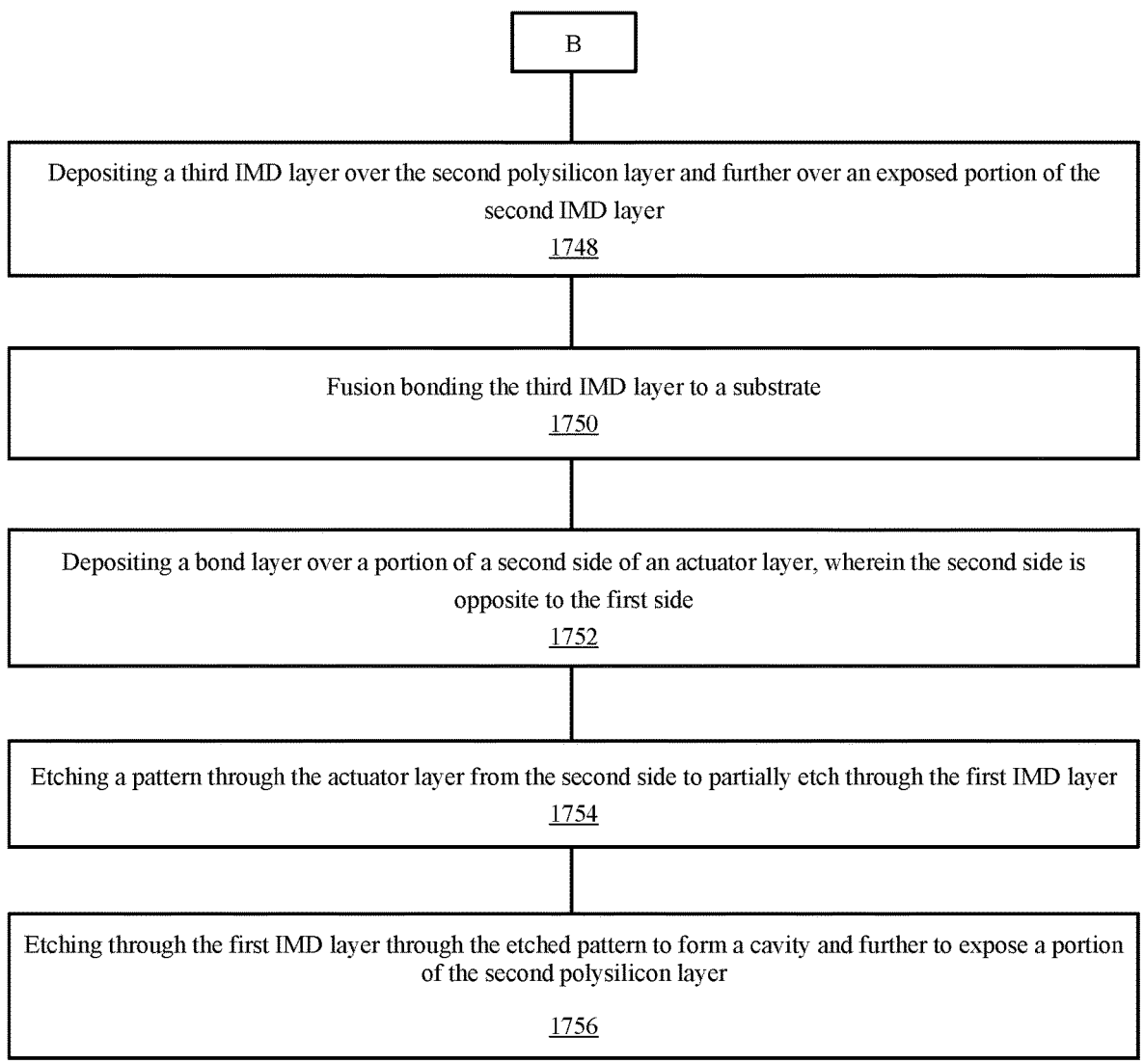
Figure 18:
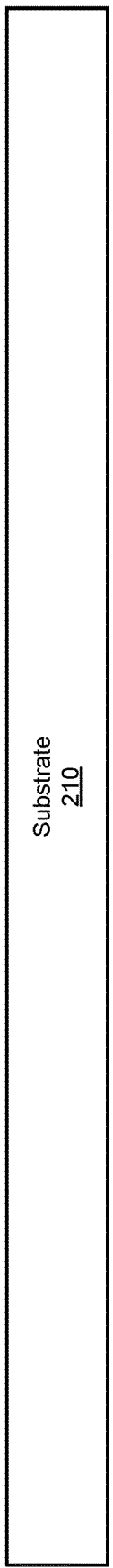

FIGS. 17A-17D show method flows for fabricating a MEMS device layer according to one aspect of the present embodiments. Referring to FIGS. 17A-17B show a first method flow for fabricating a MEMS device layer while FIGS. 17C-17D show a second method flow for fabricating a MEMS device layer according to one aspect of the present embodiments.

At step 1702, a first polysilicon layer is deposited over a first side of an actuator layer, as described with respect to FIGS. 1-16. At step 1704, a first IMD layer is formed over the first polysilicon layer, as described with respect to FIGS. 1-16. At step 1706, the first IMD layer is etched to form a via that exposes the first polysilicon layer and further to form a bump region, as described with respect to FIGS. 1-16. At step 1708, a second polysilicon layer is deposited over the first IMD layer, the via, and the bump region, as described with respect to FIGS. 1-16. At step 1710, a portion of the second polysilicon layer is etched to expose a portion of the first IMD layer and to form a patterned second polysilicon layer, as described with respect to FIGS. 1-16. At step 1712, a second IMD layer is deposited over the patterned second polysilicon layer and further over the exposed portion of the first IMD layer, as described with respect to FIGS. 1-16. At step 1714, a portion of the second IMD layer is etched to expose a portion of the patterned second polysilicon layer and to form a patterned second IMD layer, as described with respect to FIGS. 1-16. At step 1716, a third polysilicon layer is deposited over the patterned second IMD layer and further over the exposed portion of the second polysilicon layer, as described with respect to FIGS. 1-16. At step 1718, the third polysilicon layer is etched to form a patterned third polysilicon layer, as described with respect to FIGS. 1-16. At step 1720, a third IMD layer is deposited over the patterned third polysilicon layer and further over an exposed portion of the second IMD layer, as described with respect to FIGS. 1-16. At step 1722, the third IMD layer is fusion bonded to a substrate, as described with respect to FIGS. 1-16. At step 1724, a bond layer is deposited over a second side of an actuator, wherein the second side is opposite to the first side, as described with respect to FIGS. 1-16. At step 1726, the bond layer is patterned to form a patterned bond layer. At step 1728, a pattern is etched through the actuator layer, the first polysilicon layer and partially through the first IMD layer, as described with respect to FIGS. 1-16. At step 1730, the first IMD layer is etched through to form a cavity and further to expose a portion of the second polysilicon layer, as described with respect to FIGS. 1-16. It is appreciated that the cap layer may be thinned through DRIE and a bond pad may be patterned and opened outside of the at least one cavity.

Referring now to FIGS. 17C-17D, a second method flow for fabricating a MEMS device layer according to one aspect of the present embodiments is shown. At step 1732, a first side of an actuator layer is roughened, e.g., depositing a rough material or through a roughening process. At step 1734, a first IMD layer is deposited over the first side of the actuator layer, as described with respect to FIGS. 1-16. At step 1736, a via and a cavity are formed within the first IMD layer, as described with respect to FIGS. 1-16. At step 1738, a first polysilicon layer is deposited over the first IMD layer, the via, and the cavity, as described with respect to FIGS. 1-16. At step 1740, the first polysilicon layer is patterned to expose a portion of the first IMD layer and to form a patterned first polysilicon layer, as described with respect to FIGS. 1-16. At step 1742, a second IMD layer is deposited over the patterned first polysilicon layer and further over the exposed portion of the first IMD layer, as described with respect to FIGS. 1-16. At step 1744, a portion of the second IMD layer is etched to expose a portion of the patterned first polysilicon layer and to form a patterned second IMD layer, as described with respect to FIGS. 1-16. At step 1746, a second polysilicon layer is deposited over a portion of the patterned second IMD layer and further over the exposed portion of the first polysilicon layer to connect the first polysilicon layer to the second polysilicon layer, as described with respect to FIGS. 1-16. At step 1748, a third IMD layer is deposited over the second polysilicon layer and further over an exposed portion of the second IMD layer, as described with respect to FIGS. 1-16. At step 1750, the third IMD layer is fusion bonded to a substrate, as described with respect to FIGS. 1-16. At step 1752, a bond layer is deposited over a portion of a second side of an actuator layer, wherein the second side is opposite to the first side, as described with respect to FIGS. 1-16. At step 1754, a pattern is etched through the actuator layer from the second side to partially etch through the first IMD layer, as described with respect to FIGS. 1-16. At step 1756, the first IMD is etched through to form a cavity and further to expose a portion of the second polysilicon layer. It is appreciated that the cap layer may be thinned through DRIE and a bond pad may be patterned and opened outside of the at least one cavity.

Referring now to FIGS. 18-36B, fabrication process for another MEMS device layer according to another aspect of the present embodiments. Substrate 210 is provided. The substrate 210 may be a p-silicon substrate or an n-silicon substrate. The fabrication is described with respect to a p-silicon substrate for illustrative purposes and should not be construed as limiting the scope of the embodiments. For example, an n-silicon substrate may be used.

Figure 19:
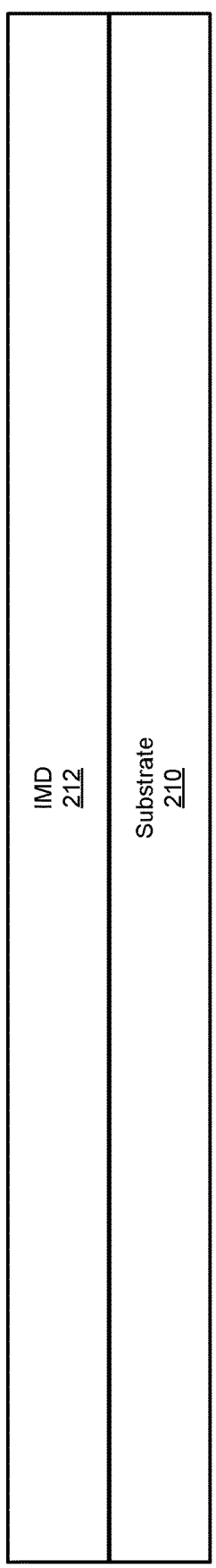
Figure 20:
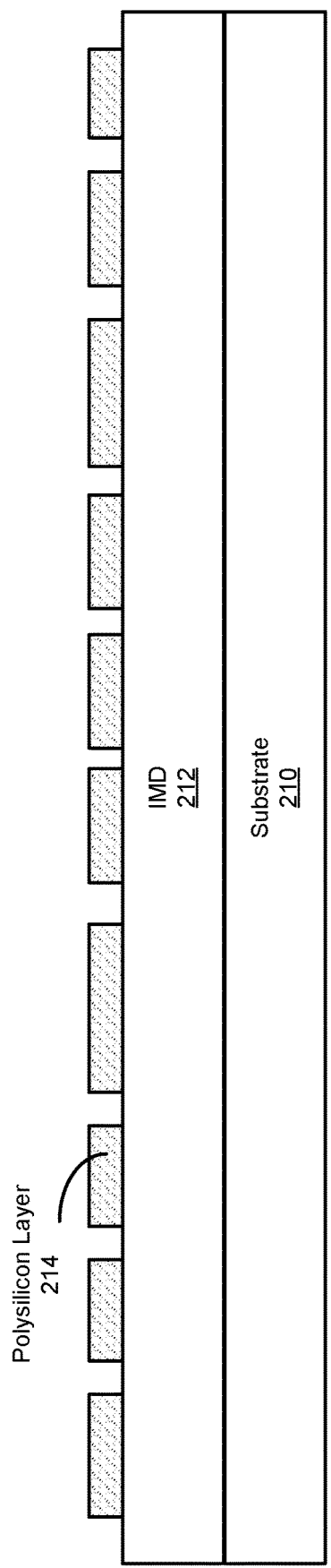

Referring now to FIG. 19, an IMD 212 layer is deposited over the substrate 210, i.e., on a first side of the substrate 210. The IMD layer 212 may include material such as $SiO_2$, SiN, etc. Referring now to FIG. 20, a polysilicon layer 214 is deposited over the IMD 212 layer and patterned, using a mask. In one nonlimiting example, the polysilicon layer 214 may be doped in-situ or ion implantation may occur after undoped poly is deposited. Moreover, polysilicon may form one or more electrodes, thereby reducing hillock effects.

Referring now to FIG. 21, an IMD 216 layer is deposited over the patterned polysilicon layer 214 and further on the exposed IMD 212 layer. The IMD 216 layer may compose of the same material as the IMD 212 layer. Once the IMD 216 layer is deposited it may go through the CMP process. In one optional embodiment, the IMD 216 layer may be deposited, a CMP may be performed, a passivation layer such as SiN may be deposited, and another layer of IMD may be deposited over the passivation layer.

Referring now to FIG. 22, a patterned mask is used to etch bumpstops into the IMD 216 layer. In one nonlimiting example, a patterned mask covers the bumpstops regions on the IMD 216 layer that is associated with bumpstops, which enables the exposed portions of the IMD 216 layer to be etched, thereby forming the bumpstops 218. In one alternative embodiment where a passivation layer and another layer of IMD is deposited, the passivation layer and the another layer of IMD layer is etched.

Figure 23:
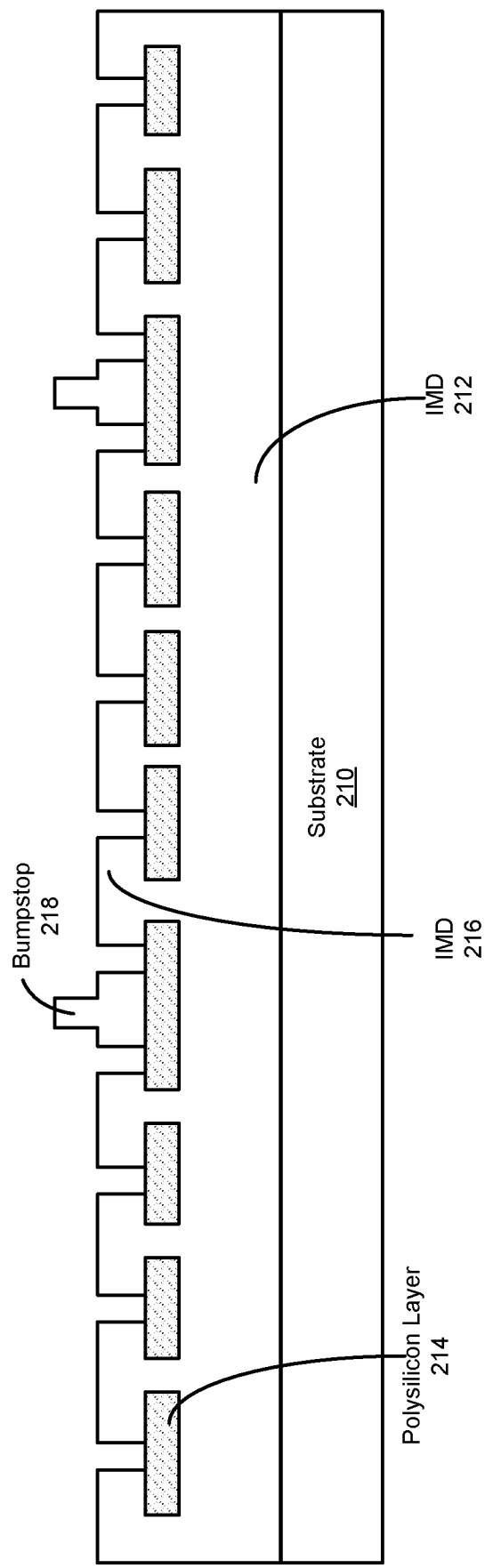
Figure 24:
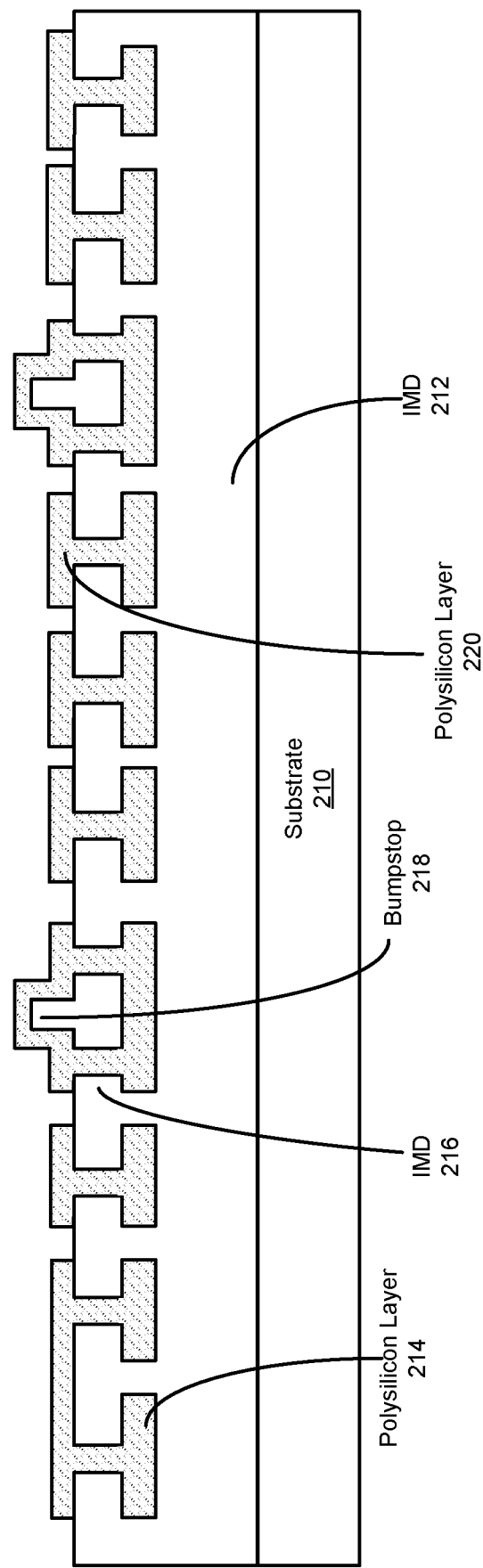

Referring now to FIG. 23, a patterned mask may be used to etch vias in the IMD 216 layer. For example, a mask may be formed over the IMD 216 layer where the exposed regions of IMD 216 layer correspond to the via regions. Etching the IMD 216 layer forms the vias. It is appreciated that in some embodiments, the vias expose the polysilicon layer 214. Referring now to FIG. 24, a polysilicon layer 220 is deposited over the IMD 216 layer and also over the exposed polysilicon layer 214. The polysilicon layer 220 may include the same material as the polysilicon layer 214. The polysilicon layer 220 may be patterned, using a patterned mask in a similar fashion as described above. The polysilicon layer 220 becomes in contact with the polysilicon layer 214. It is appreciated that the polysilicon layer 220 provides roughness that is advantages to improve stiction. It is appreciated that the polysilicon layer 220 (except for the portion covering the bumpstops 218) are coplanar and that the polysilicon layer 214 are coplanar.

Figure 25:
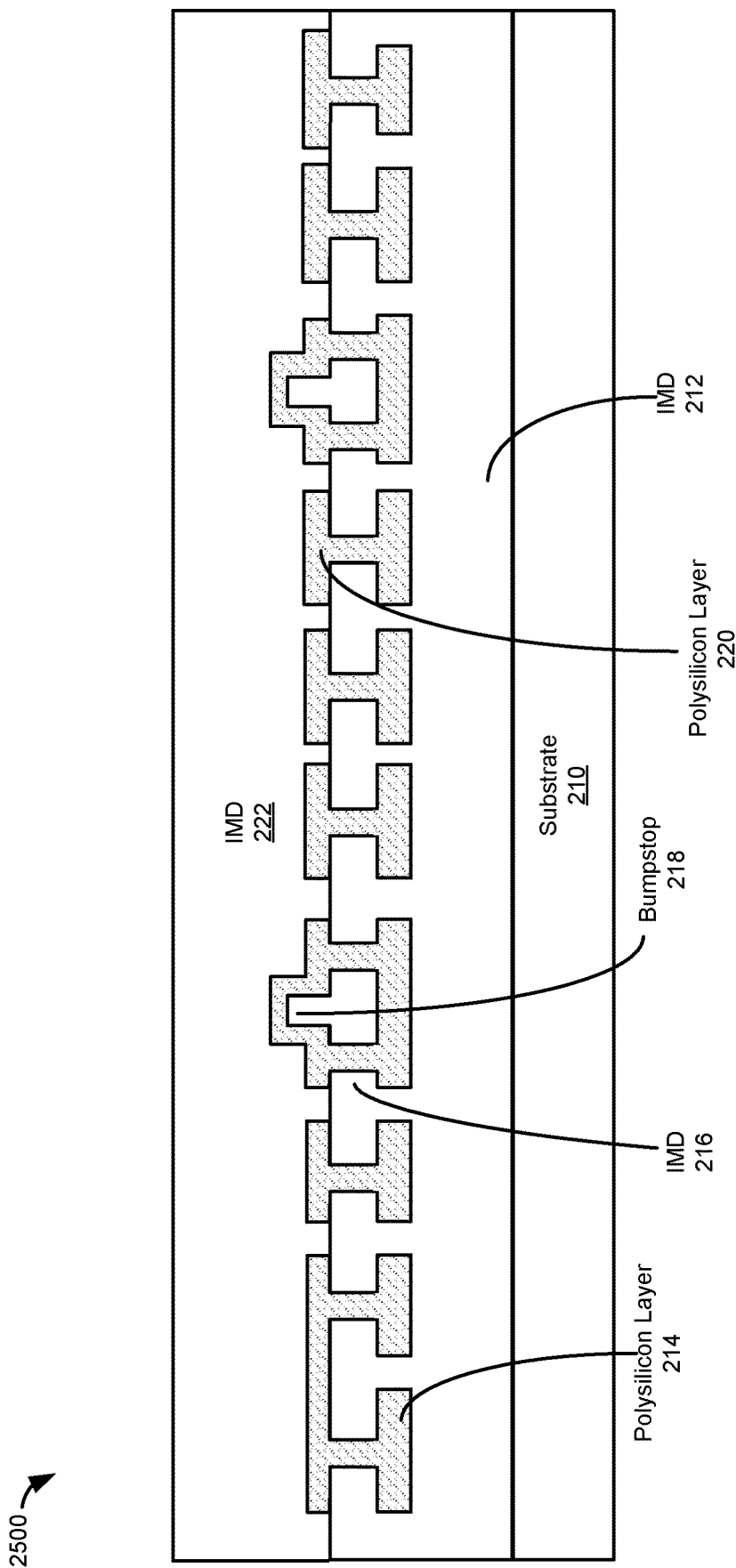

Referring now to FIG. 25, an IMD 222 layer is deposited over the polysilicon layer 220 and further on the exposed regions of IMD 216. Once deposited, the IMD 222 layer may go through a CMP process and a substrate 2500 is formed.

Figure 26:
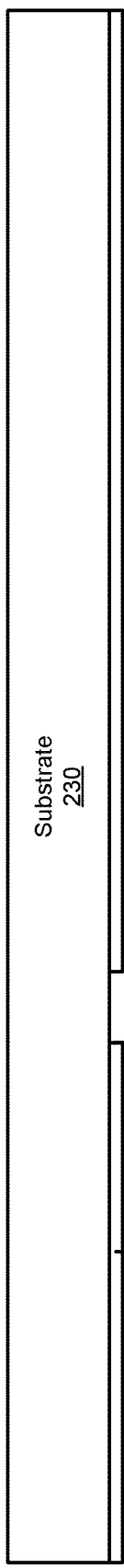
Figure 27:
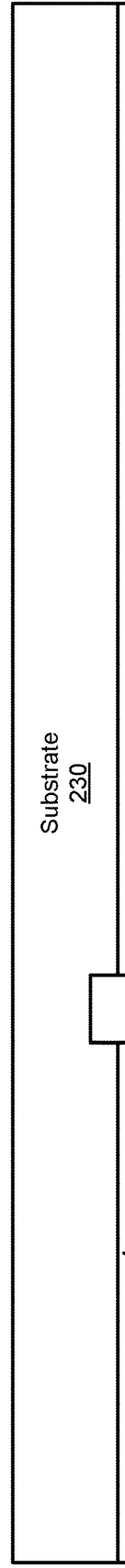
Figure 28:
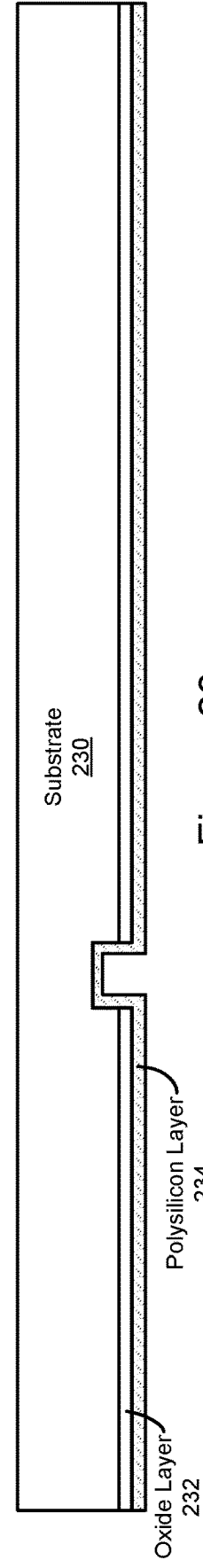

Referring now to FIG. 26, a substrate 230 is provided. The substrate 230 may be a p-silicon substrate or an n-silicon substrate. The fabrication is described with respect to a p-silicon substrate for illustrative purposes and should not be construed as limiting the scope of the embodiments. For example, an n-silicon substrate may be used. The substrate 230 will eventually form the actuator layer of the MEMS device layer and will be bonded to the substrate 2500. A mask, e.g., an oxide layer 232, may be deposited on the substrate 230 and subsequently patterned. Referring now to FIG. 27, the exposed portion of the substrate 230 is etched to form a recess. Referring now to FIG. 28, a polysilicon layer 234 is deposited over the oxide layer 232 as well as the recess. The polysilicon layer 234 may be similar to other polysilicon layers used, as described above.

Referring now to FIG. 29, the polysilicon layer 234 is patterned such that polysilicon layer 234 on the oxide layer 232 is removed while maintaining the polysilicon layer 234 within the recess region. Referring now to FIG. 30, the oxide layer 232 is removed.

Figure 31:
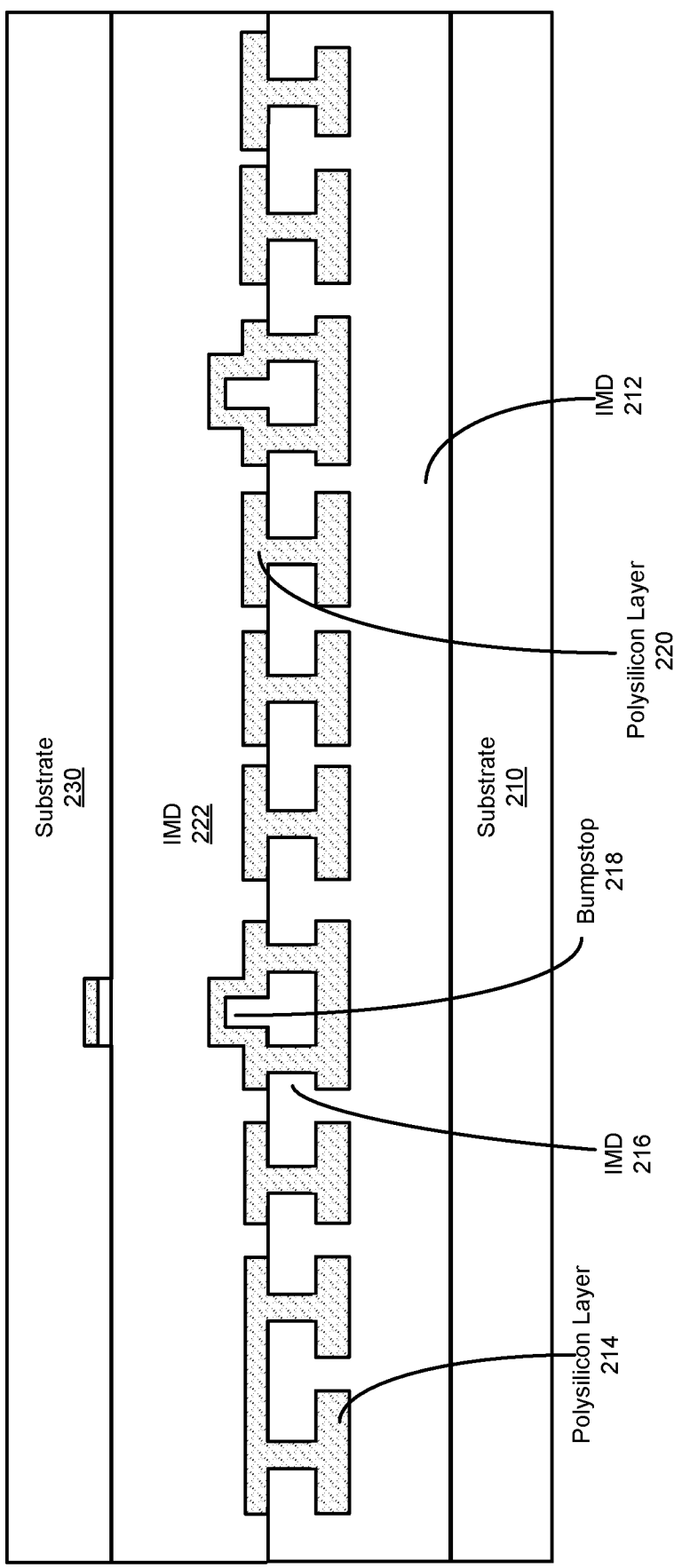

Referring now to FIG. 31, the substrate 230 is bonded to the substrate 2500, as illustrated in FIG. 25. It is appreciated that the substrate 2500 may be aligned for fusion bonding with the substrate 230 of FIG. 31. In some embodiments, the substrate 230 may be thinned down to define the actuator layer.

Figure 32:
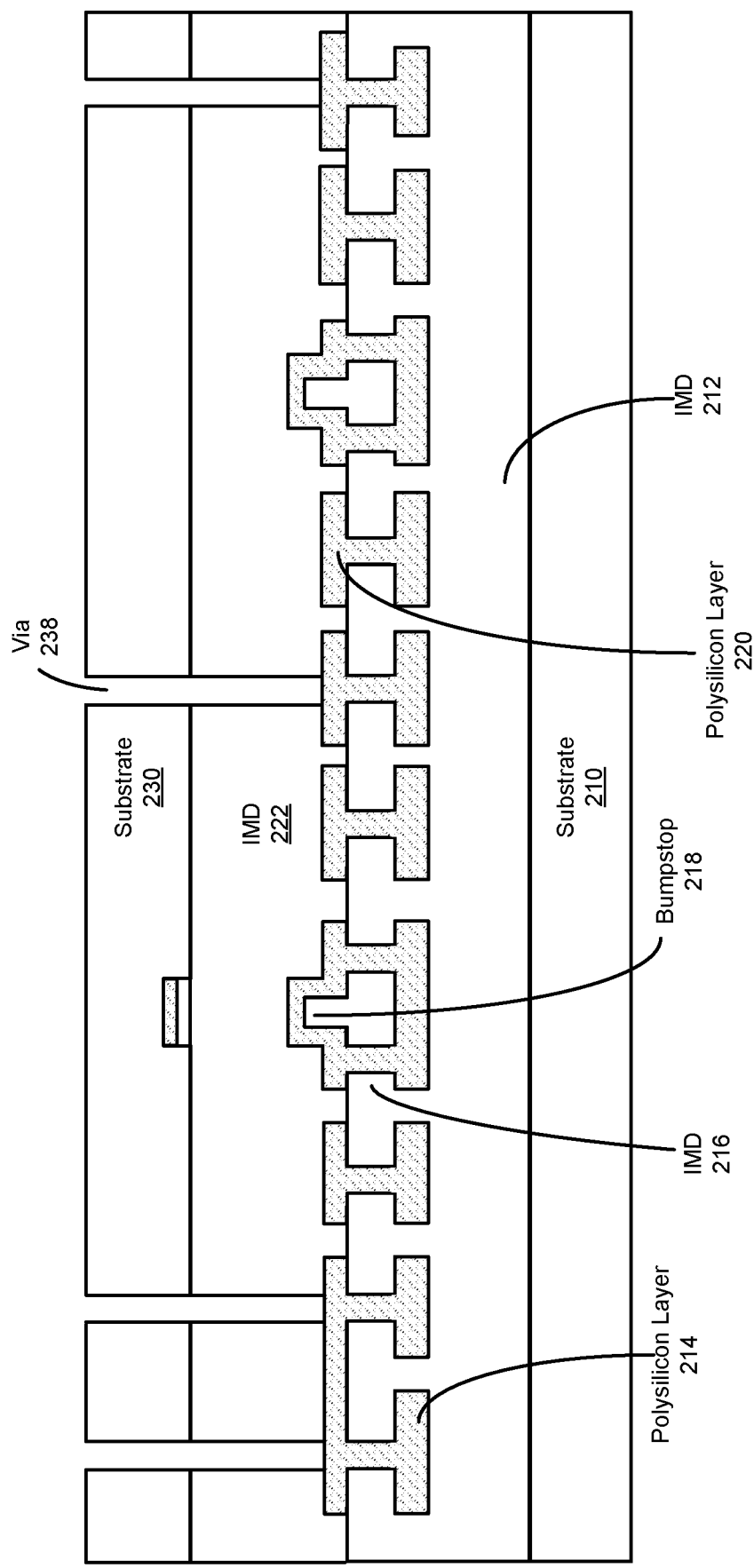
Figure 33:
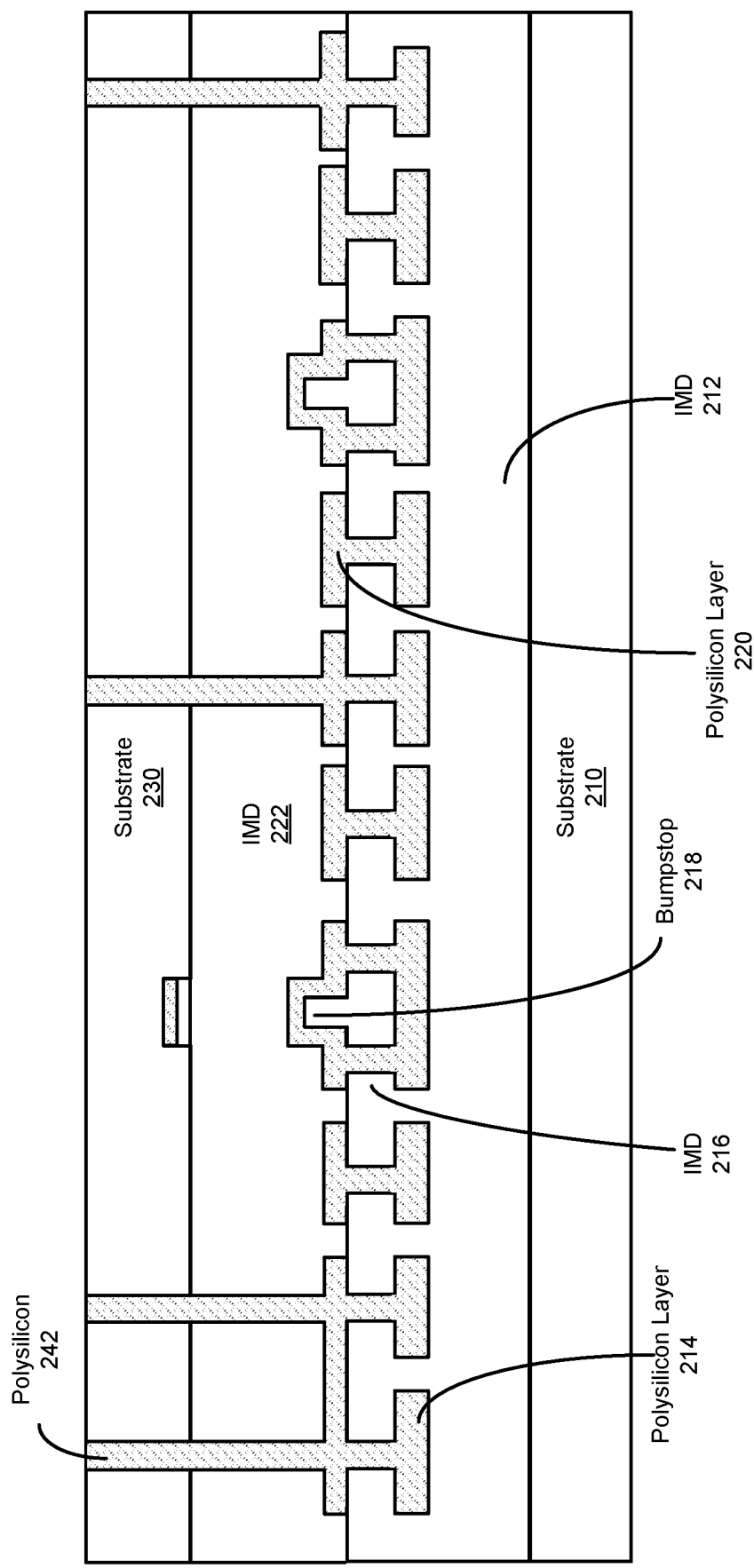

Referring now to FIG. 32, actuator layer is etched, i.e., going through the substrate 230 through the IMD 222 layer to reach the polysilicon layer 220, by forming vias 238, using a patterned mask. The actuator layer etch may be performed using DRIE process. Referring now to FIG. 33, the vias 238 are filled with polysilicon 242 (similar to other polysilicon layers described above) and the substrate goes through a CMP process.

Figure 34:
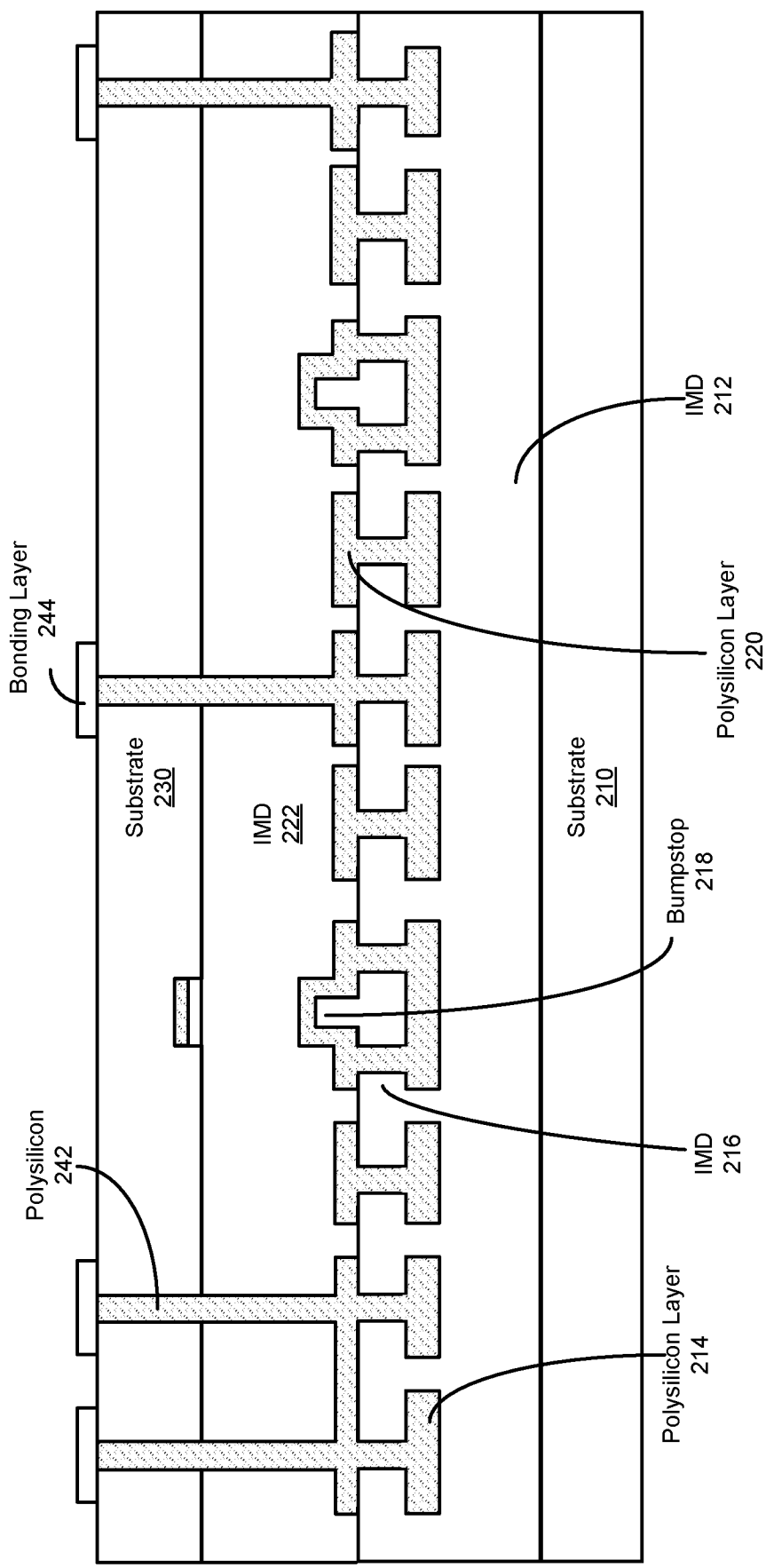

Referring now to FIG. 34, a bonding layer 244 is deposited on a second side of the substrate 230 and is subsequently patterned using a patterned mask. The bonding layer 244 may include material such as Al, Ge, AlCu, etc.

Figure 35:
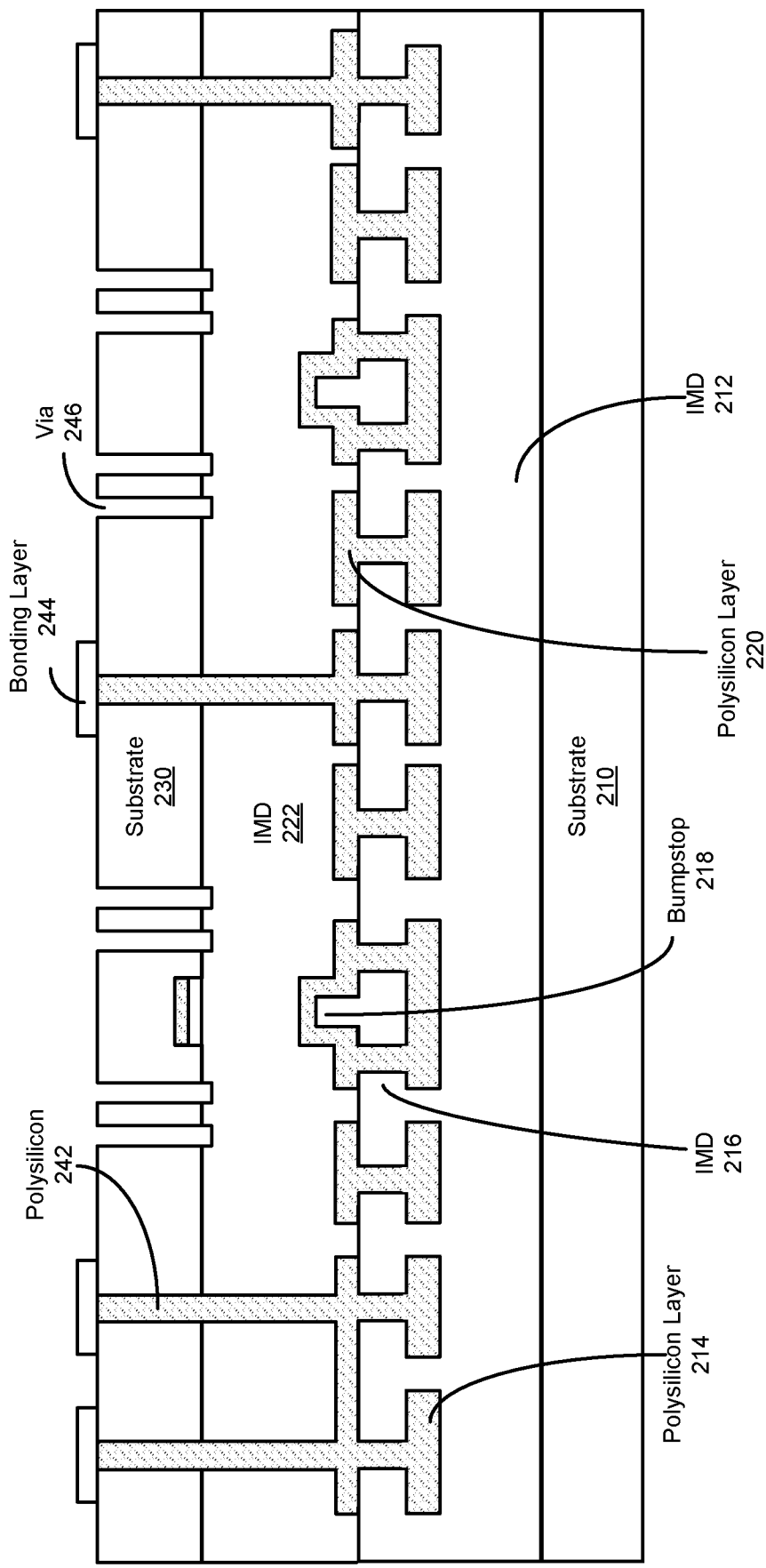

Referring now to FIG. 35, vias 246 are formed from the second side of the substrate 230 to reach the first side of the substrate 230 and further partially into the IMD 222 layer, using a patterned mask. The vias 246 are used in DRIE process to etch the actuator layer.

Figure 36A:
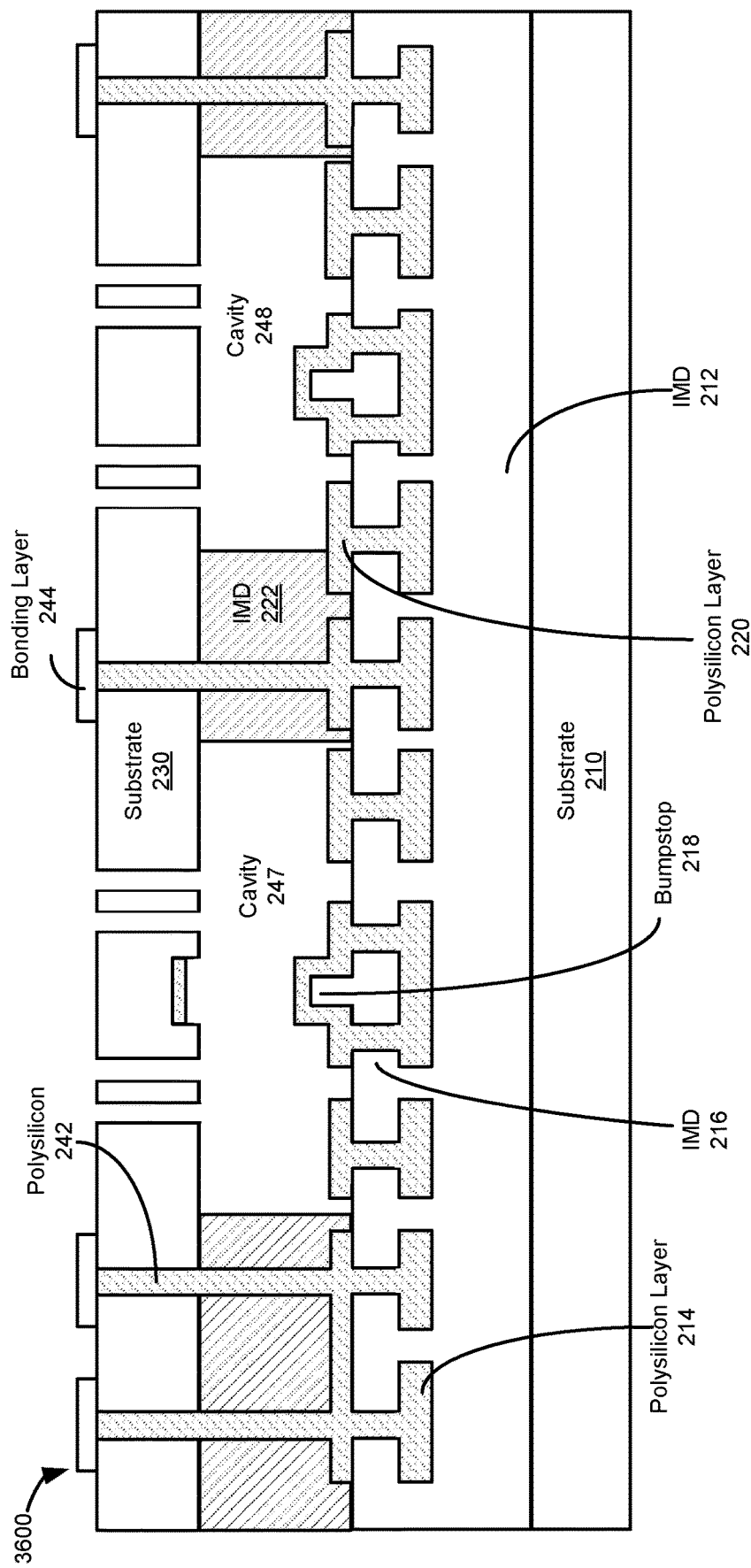

Referring now to FIG. 36A, the MEMS device layer 3600 is formed when the actuator layer is released using timed vapor HF etch. In other words, the vapor HF etching using the vias 246 removes a portion of the IMD layer 222 and forms cavities 247 and 248 according to some embodiments. It is appreciated that a top portion of each cavity may be defined by the actuator layer, the side walls by the IMD 222 layer and the bottom by the bumpstops 218 that are covered with polysilicon layer, thereby improving stiction. It is also appreciated that polysilicon layers at the bottom of the cavities 247 and 248 may form the electrodes that are connected to other polysilicon interconnection layer, thereby removing hillock effects. In this illustrated example, a portion of the top of the cavity 247 is also coated with polysilicon layer, thereby improving stiction when it becomes into contact with the polysilicon bumpstop 218. In some optional embodiments, IMD 222 may be fully encapsulated by polysilicon layer 242 with a closed loop via in IMD 222. In some optional embodiments, IMD 216 may contain SiN layer. The polysilicon layer 242 and/or the SiN layer may serve as the etch stop layer for the vapor HF etching.

Figure 36B:
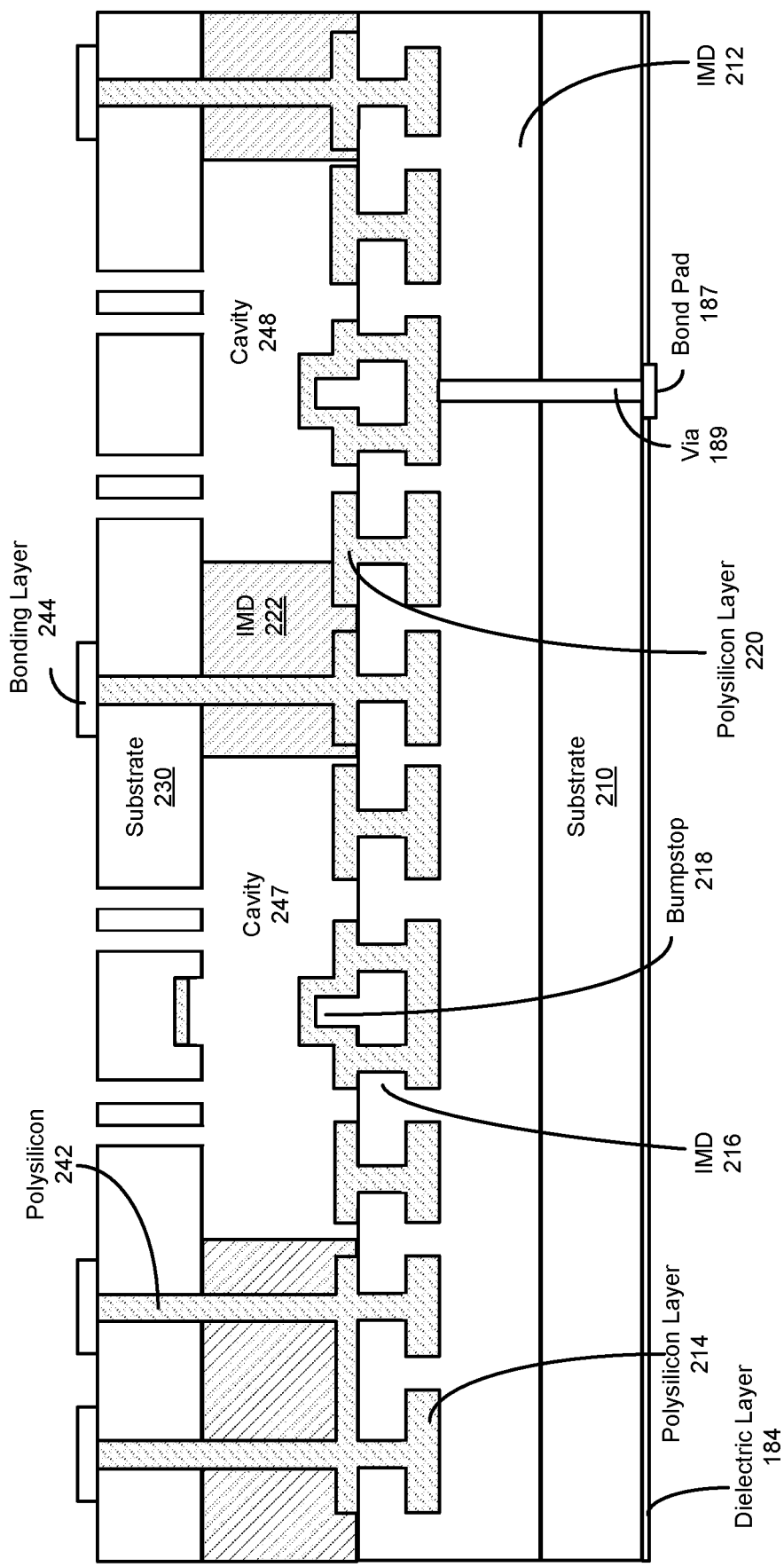

Referring now to FIG. 36B, similar to FIG. 14B, the MEMS device layer with a bond pad formed on the back side of the MEMS device according to one aspect of the present embodiments is shown. In this embodiment, a bond pad 187 may be formed on the back side of the substrate 210, thereby reducing the chip size. In this embodiment, a via 189 is formed by depositing a dielectric 184 layer on the substrate 201, etching through the dielectric layer, the back of the substrate 210 and the IMD 212 layer to connect the bond pad 187 to an electrode, comprising polysilicon material in this example. In one embodiment, the interior of the formed via 189 is insulated by depositing material such as an oxide. Thereafter, a conductive layer such as polysilicon, Ti, TiN, Cu, etc., may line the interior of the formed via 189. The bond pad 187 comprising conductive material is deposited on the back side of the substrate 210 and patterned to cover the formed via 189. It is appreciated that the backside bond pad 187 may be formed before the MEMS device layer is bonded to a cap layer, e.g., eutecticly bonded.

Figure 37:
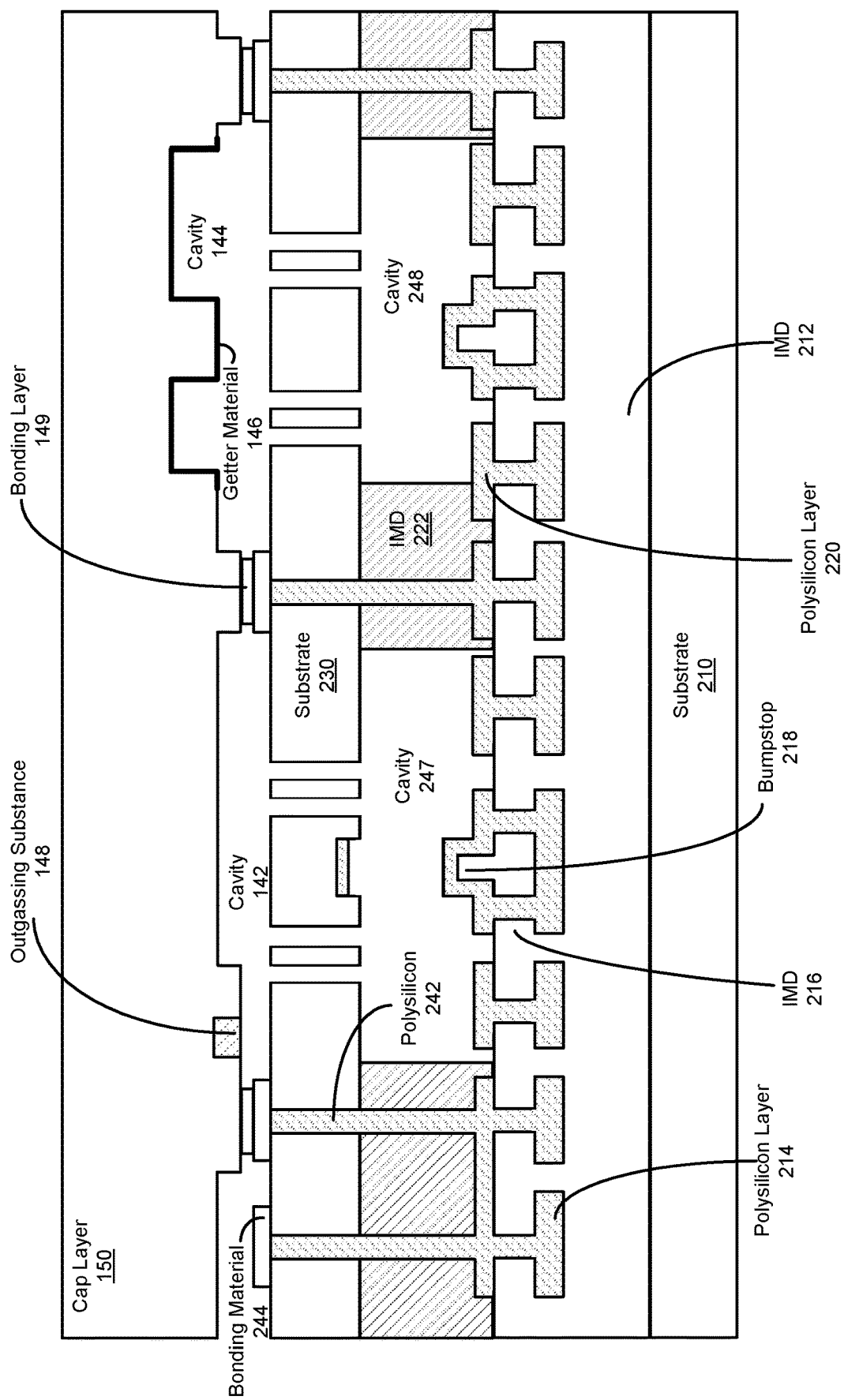
FIGS. 37 and 38 show bonding of a MEMS device layer to a cap layer forming a MEMS layer, MEMS layer thinning and opening a bond pad according to another aspect of the present embodiments.

Referring now to FIG. 37, bonding of a MEMS device layer 3600 to a cap layer 150 is shown. The bonding layer 149 of the cap layer 150 may bond to the bonding layer 244 on the MEMS device layer to bond them together and to form the cavities 142 and 144. The cap layer 150 may include an outgassing substance 148 by depositing HDP in that region. The outgassing substance 148 may be used for damping purposes in accelerometer cavity 247 with high cavity pressure. An upper surface of the cap layer 150 cavity 144 may be lined with a getter material 146, e.g., Ti, TiN, etc., to stabilize the cavity 248 pressure, making it suitable for gyro measurements.

Figure 38:
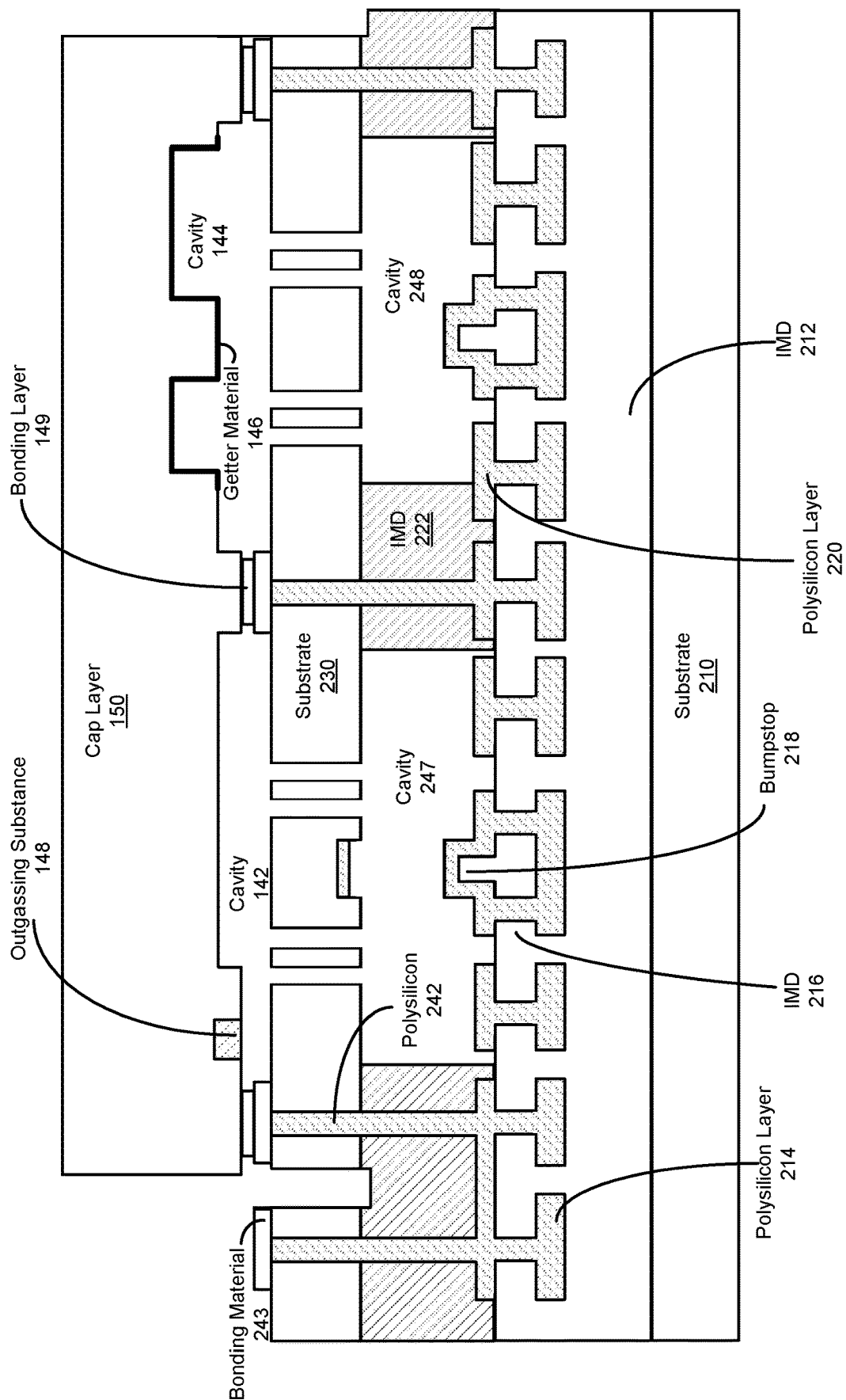

Referring now to FIG. 38, the cap layer 150 is thinned and etched, e.g., DRIE, to open the bond pad 243.

Figure 39:
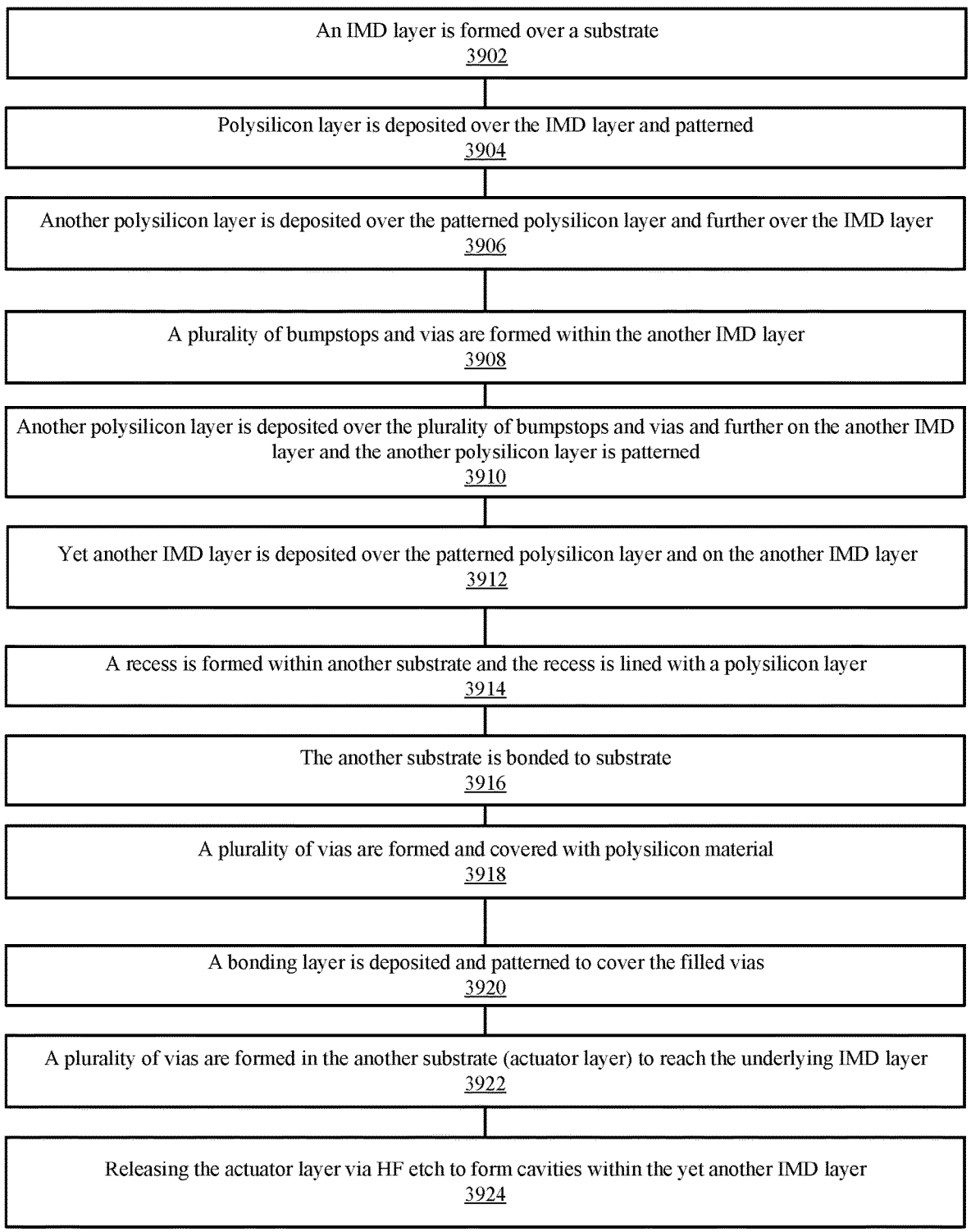
FIG. 39 shows another method flow for fabricating a MEMS device layer according to another aspect of the present embodiments.

FIG. 39 shows another method flow for fabricating a MEMS device layer according to another aspect of the present embodiments. At step 3902, an IMD layer is formed over a substrate, as described above in FIGS. 18-38. At step 3904, a polysilicon layer is deposited over the IMD layer and patterned, as described above in FIGS. 18-38. At step 3906, another IMD layer is deposited over the patterned polysilicon layer and further over the IMD layer, as described above in FIGS. 18-38. At step 3908, a plurality of bumpstops and vias are formed within the another IMD layer, as described above in FIGS. 18-38. At step 3910, another polysilicon layer is deposited over the plurality of bumpstops and vias and further on the another IMD layer and the another polysilicon layer is patterned, as described above in FIGS. 18-38. At step 3912, yet another IMD layer is deposited over the patterned polysilicon layer and on the another IMD layer, as described above in FIGS. 18-38. At step 3914, a recess is formed within another substrate and the recess is lined with a polysilicon layer, as described above in FIGS. 18-38. At step 3916, the another substrate is bonded to substrate, as described above in FIGS. 18-38. At step 3918, a plurality of vias is formed and covered with polysilicon material, as described above in FIGS. 18-38. At step 3920, a bonding layer is deposited and patterned to cover the filled vias, as described above in FIGS. 18-38. At step 3922, a plurality of vias are formed in the another substrate (actuator layer) to reach the underlying IMD layer, as described above in FIGS. 18-38. At step 3924, releasing the actuator layer via HF etch to form cavities within the yet another IMD layer, as described above in FIGS. 18-38.

Figure 40:
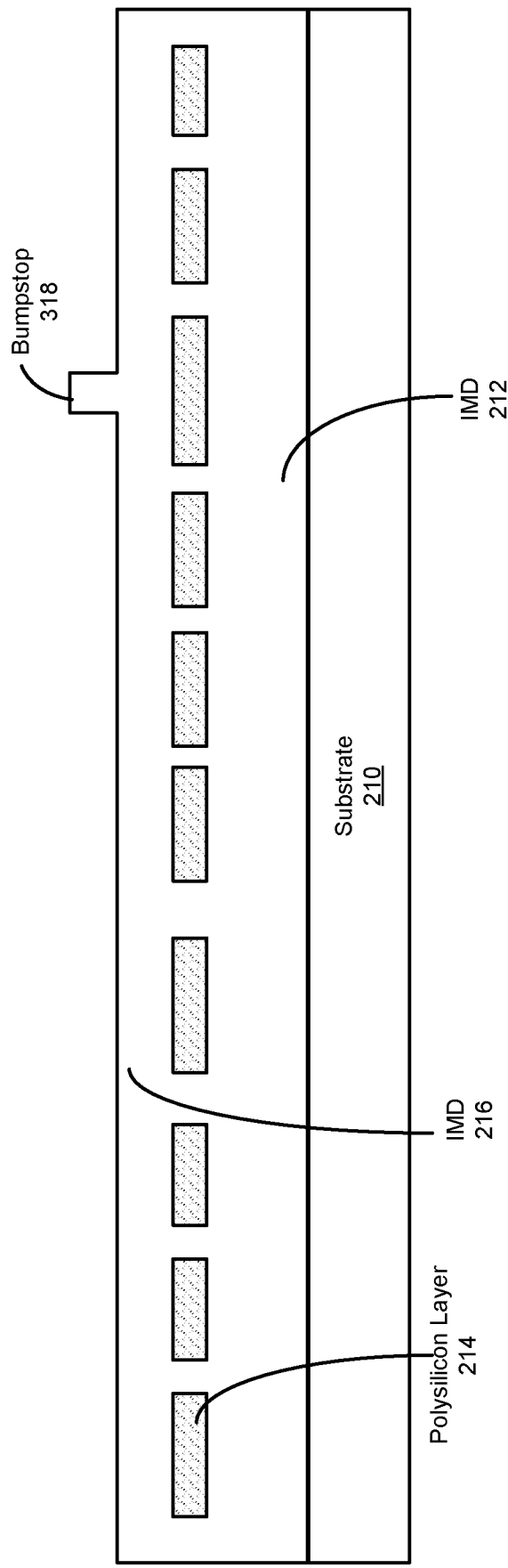
Figure 41:
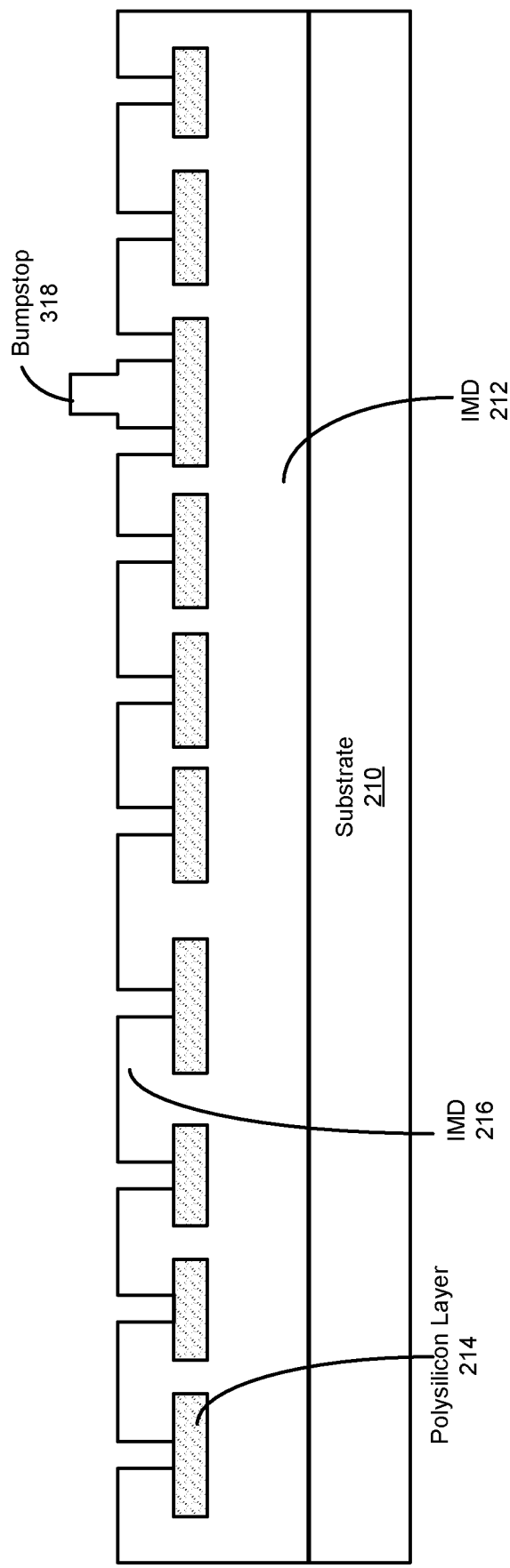

Referring now to FIGS. 40-52, fabrication process for a MEMS device layer according to yet another aspect of the present embodiments is shown. FIG. 40 may a continuation from FIG. 20 above. In FIG. 40, an IMD 216 layer is deposited over the patterned polysilicon layer 214. The IMD 216 layer may be etched to forms one or more bumpstops 318 (herein one is shown). It is appreciated that a patterned mask may be used and the exposed portions of the IMD 216 layer may be etched in order to form the bumpstops 318, in a similar fashion as described above. Referring now to FIG. 41, a plurality of vias is formed to expose the patterned polysilicon layer 214 underneath the IMD 216 layer. It is appreciated that formation of the vias may be similar to that of FIG. 23.

Figure 42:
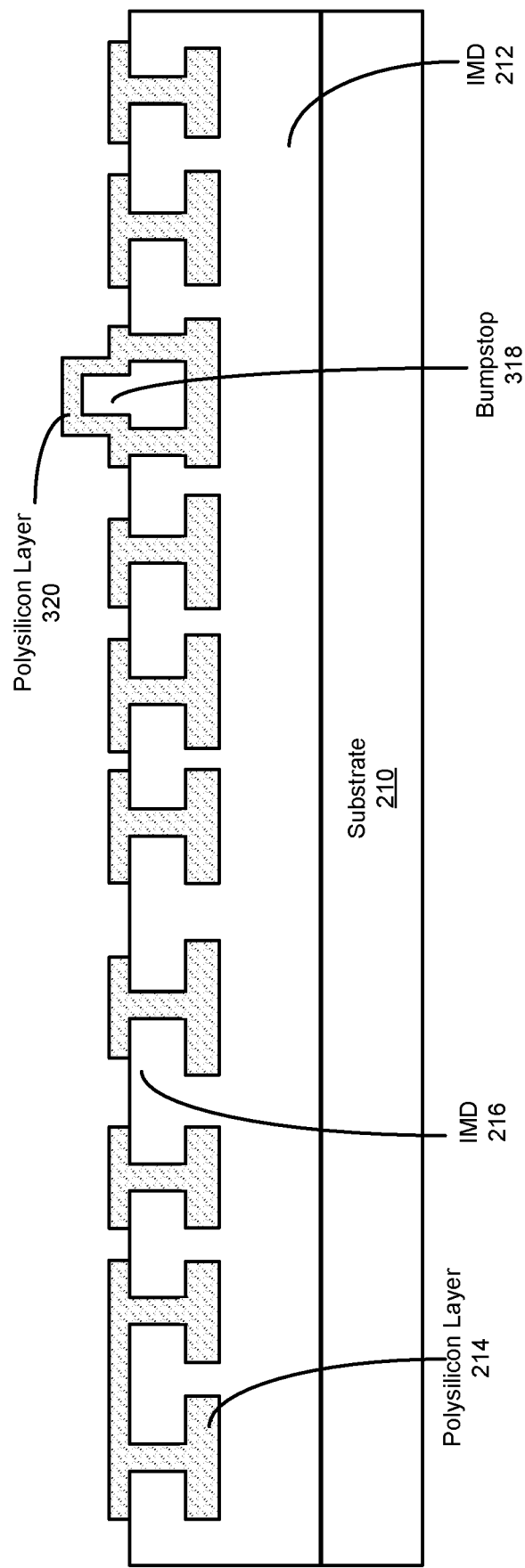
Figure 43:
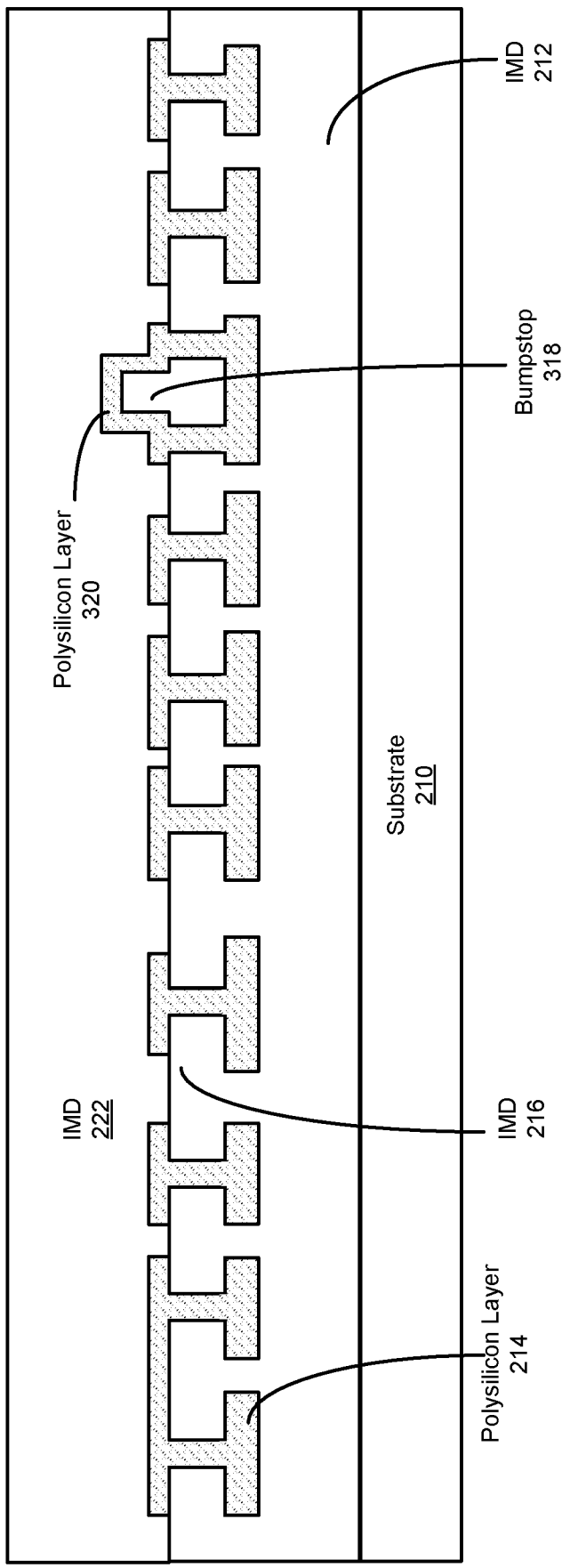

Referring now to FIG. 42, a polysilicon layer 320 (similar to the polysilicon layers described above) is deposited over the IMD 216 layer and further within the formed vias of FIG. 41. The polysilicon layer 320 may be patterned, similar to the process above described above. Referring now to FIG. 43, an IMD 222 layer (similar to other IMD layers described above) is deposited over the patterned polysilicon layer 320, similar to the process described above.

Figure 44:
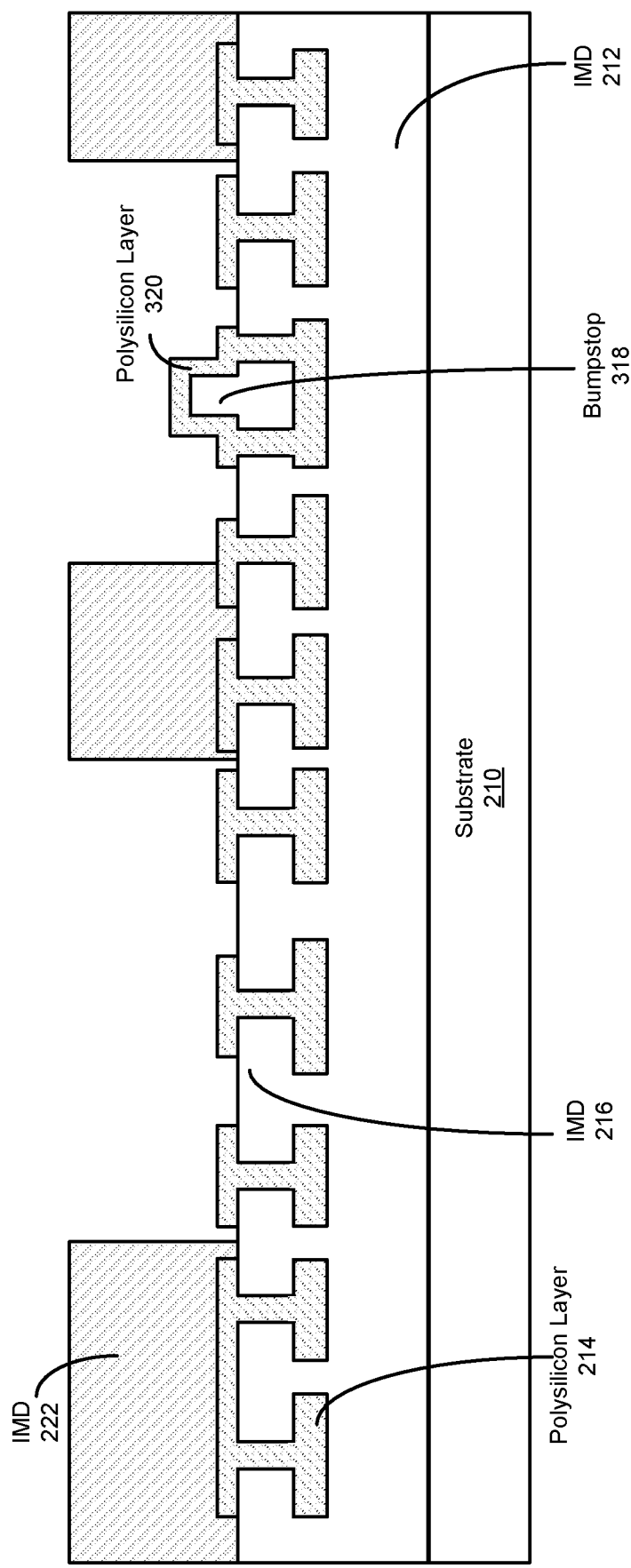

Referring now to FIG. 44, a patterned mask may be formed over the IMD 222 layer and the exposed portions of the IMD 222 layer may be etched to expose a subset of the polysilicon layer 320 underneath. In one nonlimiting example, two regions within the IMD 222 layer is formed, where a first region correspond to a future accelerometer cavity and a second region corresponding to a future cavity of a gyro cavity. Accordingly, a substrate is formed that will subsequently be bonded with the actuator layer to form the MEMS device layer.

Referring now to FIG. 45, the substrate 230 is provided and the oxide layer 232 is deposited and patterned such that the exposed portion of the substrate 230 correspond to a polysilicon bumpstop. A polysilicon bumpstop 322 may be formed by depositing a polysilicon layer on the exposed portion of the substrate 230 and by subsequently patterning the polysilicon layer.

Referring now to FIG. 46, the oxide layer 232 is patterned. The patterned oxide layer 232 may correspond to the cavities in the MEMS device layer, e.g., accelerometer cavity and the gyro cavity.

Figure 47:
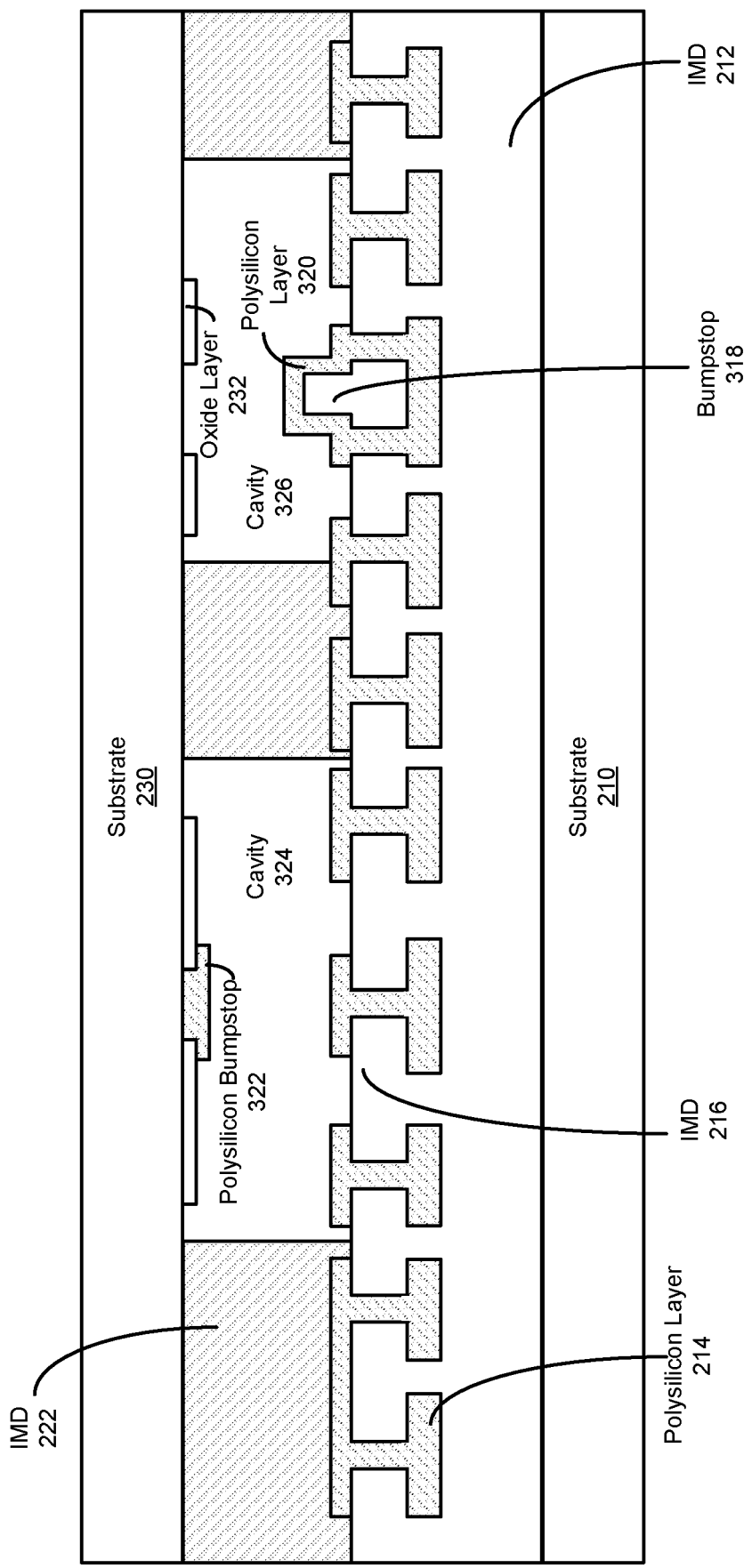

Referring now to FIG. 47, the substrate 230 is bonded to the IMD 222 layer of the substrate 210, e.g., fusion bonded in one nonlimiting example. As illustrated, the fusion bonding forms cavities 324 and 326 that correspond to the accelerometer cavity and the gyro cavity respectively.

Figure 48:
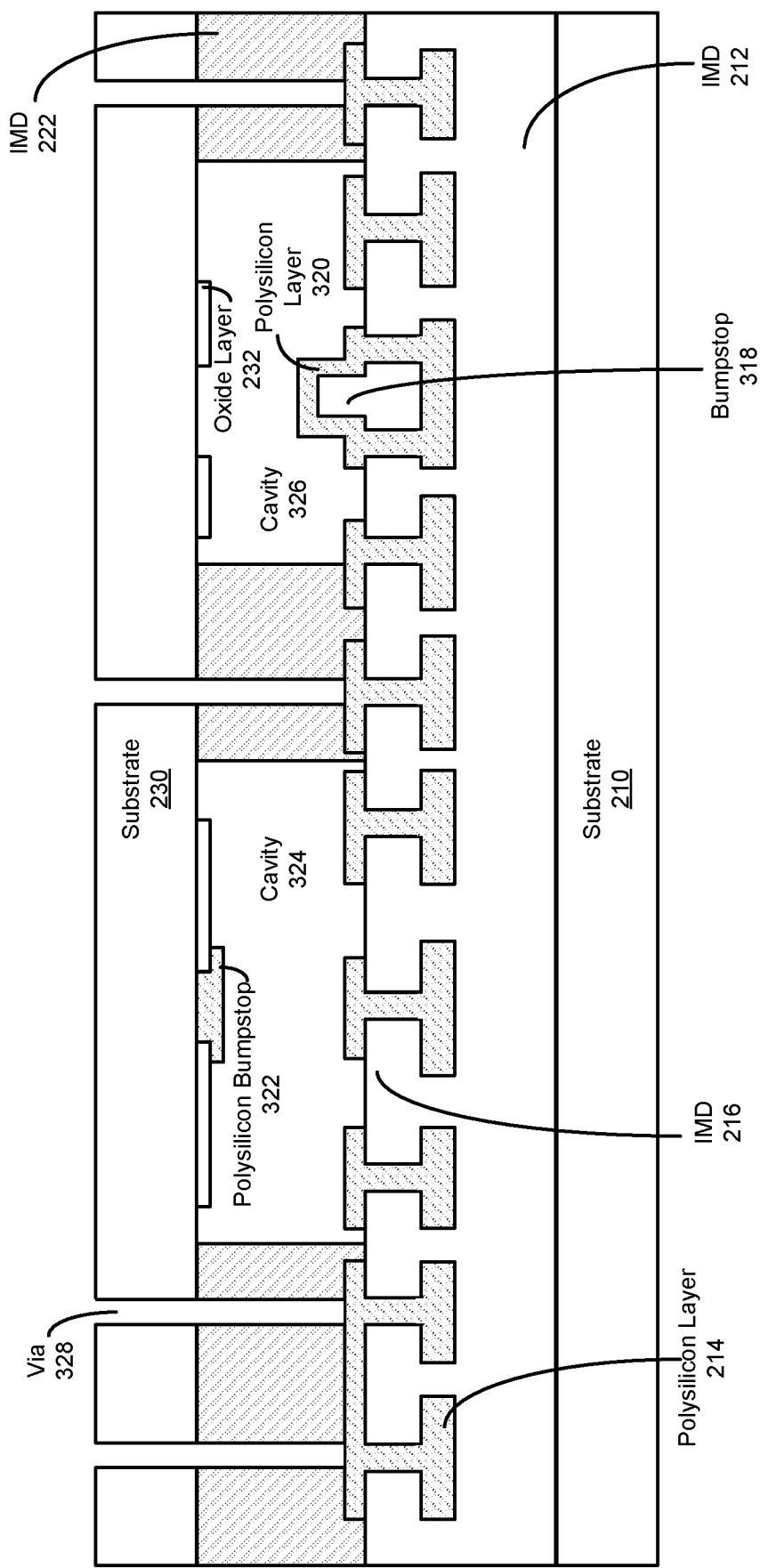

Referring now to FIG. 48, vias 328 are formed (using processes similar to that described above) to go through the substrate 230 and the IMD 222 layer to expose the patterned polysilicon layer 320 underneath. It is appreciated that in one nonlimiting example the positioning of the vias 328 correspond to the location of subsequent bonding of the MEMS device layer to a cap layer and further to a bond pad location.

Figure 49:
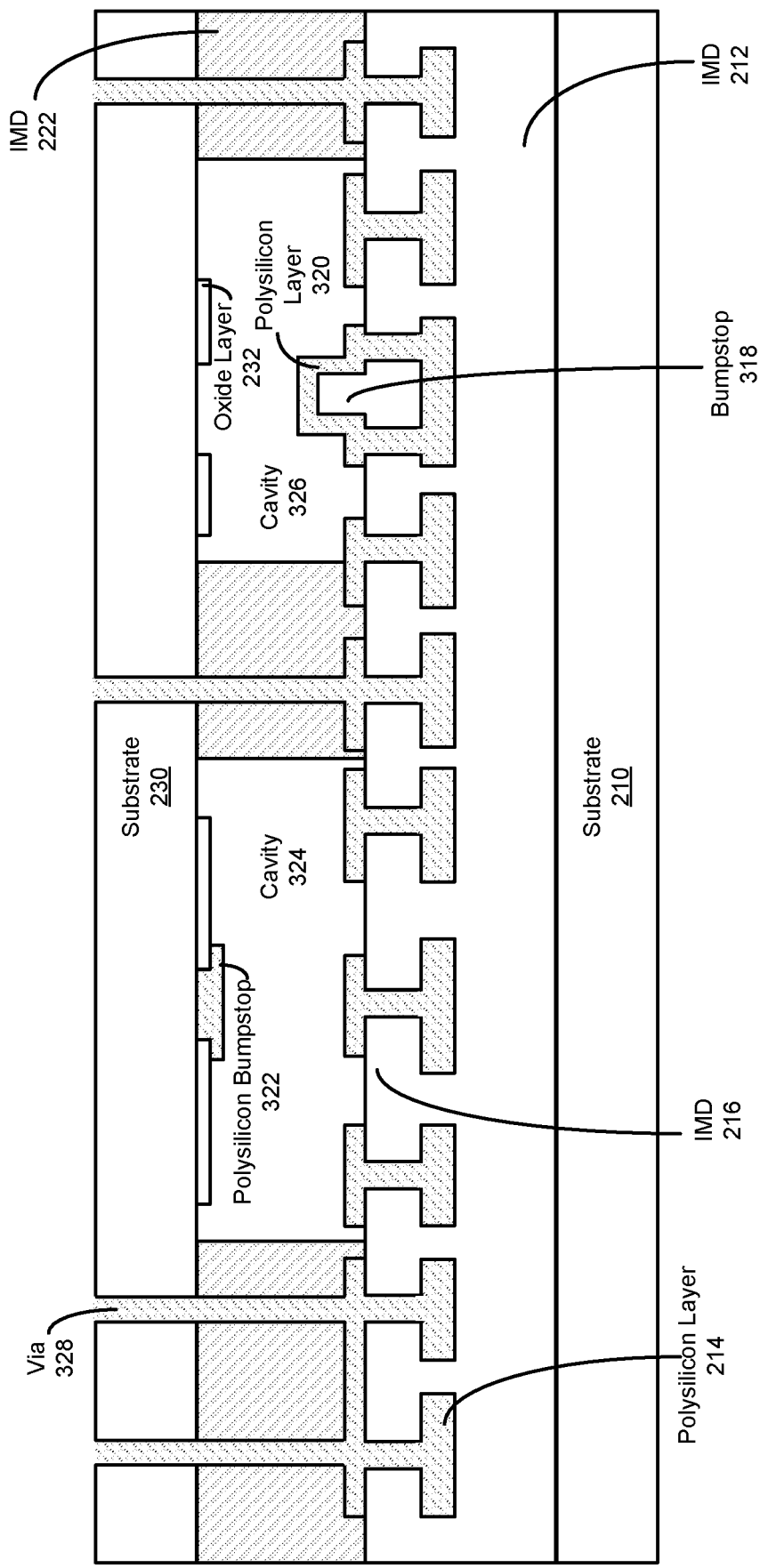
Figure 50:
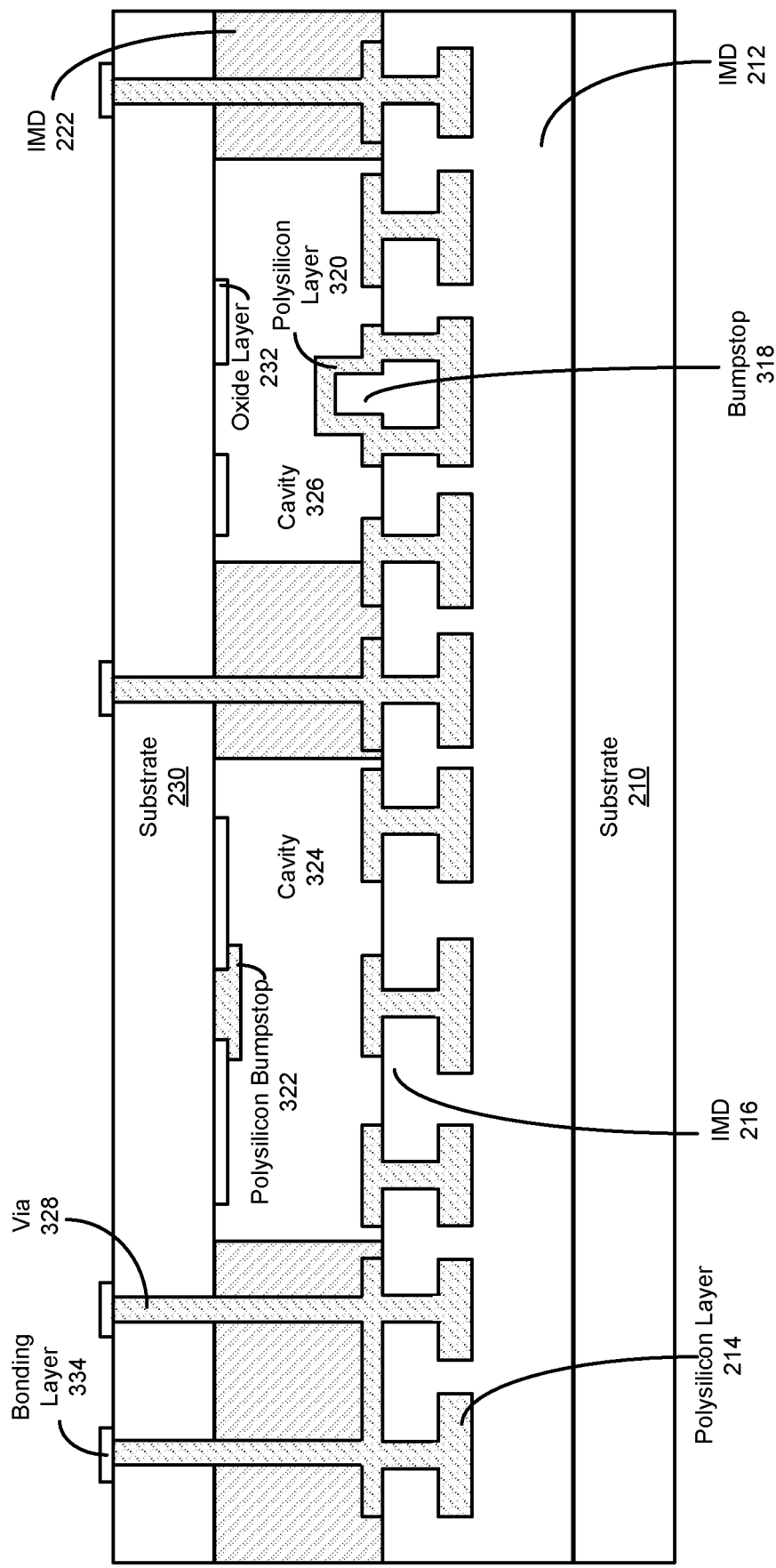

Referring now to FIG. 49, the vias 328 are filled with polysilicon material. The substrate 230 may go through a CIVIP process. Referring now to FIG. 50, a bonding layer 324 may be deposited over a second side of the substrate 230 and subsequently patterned. The bonding layer 324 may include Al, AlCu, Ge, etc.

Figure 51:
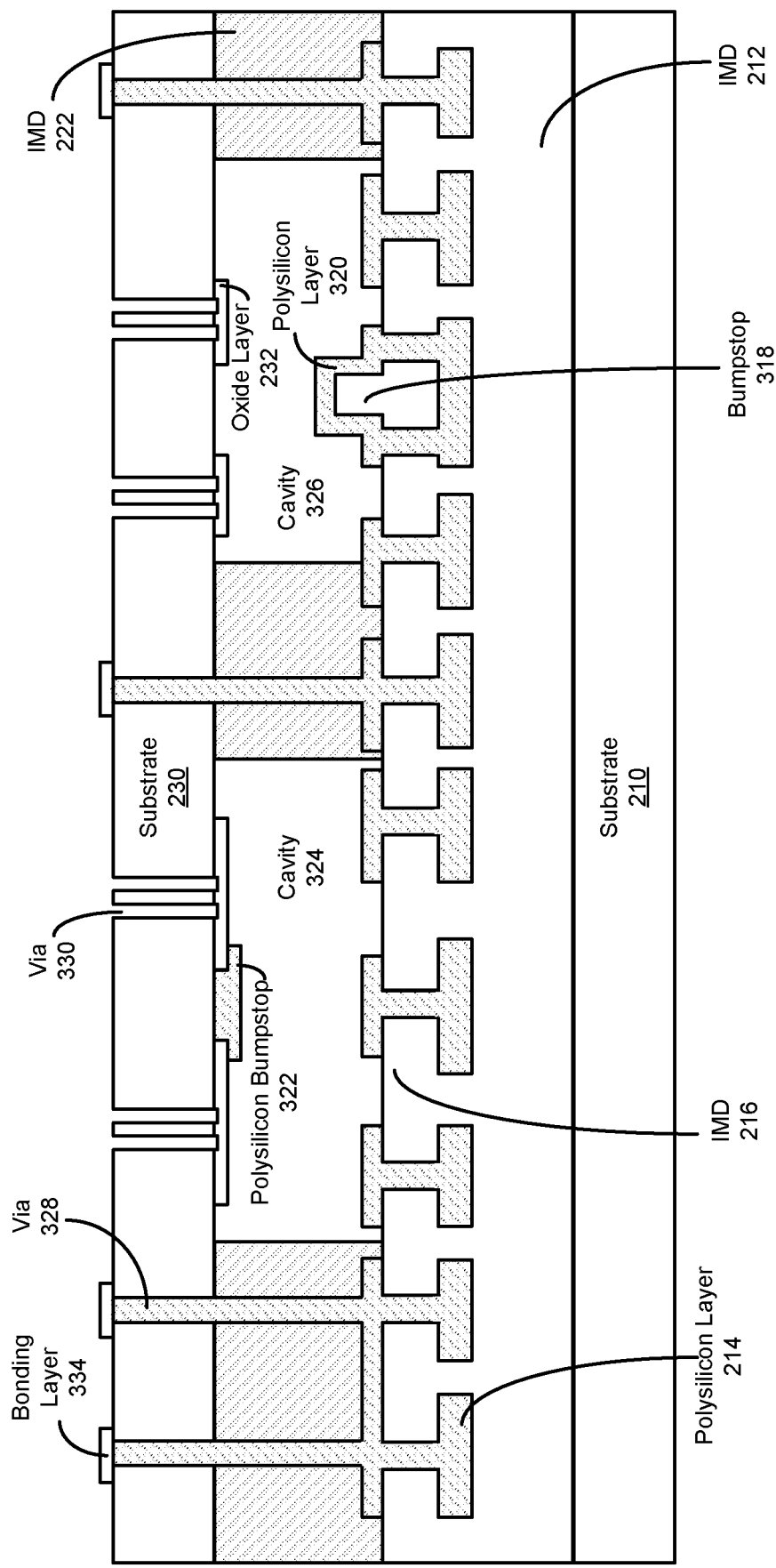
Figure 52:
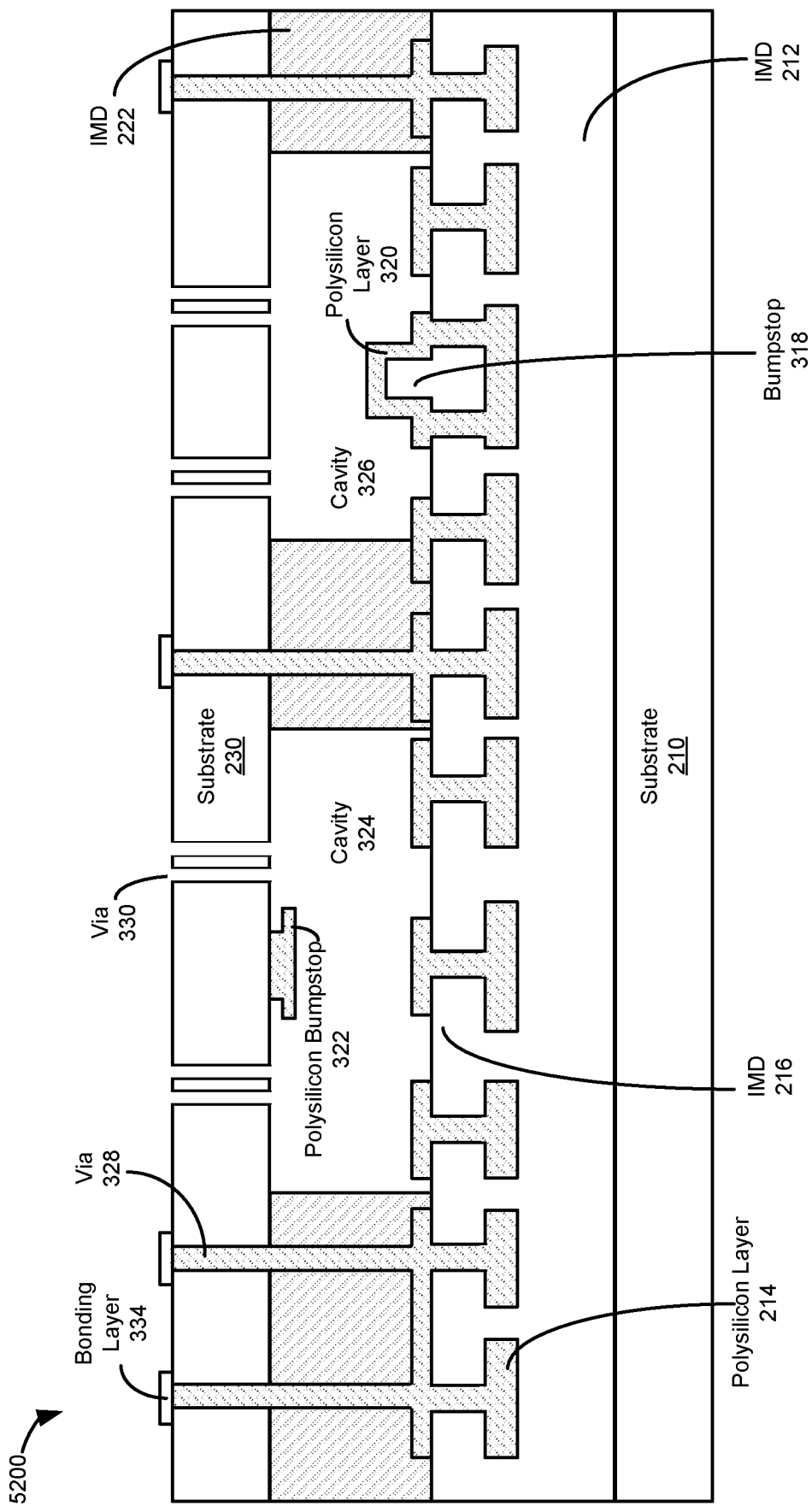

Referring now to FIG. 51, a plurality vias 330 are formed for performing actuator etch in order to form the actuator layer. The vias 330 may be formed using a DRIE process and reaches the oxide layer 232 (oxide acts as etch stop). Referring now to FIG. 52, the oxide layer 232 is etched using timed vapor HF, and the actuator layer is released and the MEMS device layer 5200 is formed. In some optional embodiments, a SAM coating may be applied to the interior of cavities 324 and 326 to improve stiction.

Figure 53:
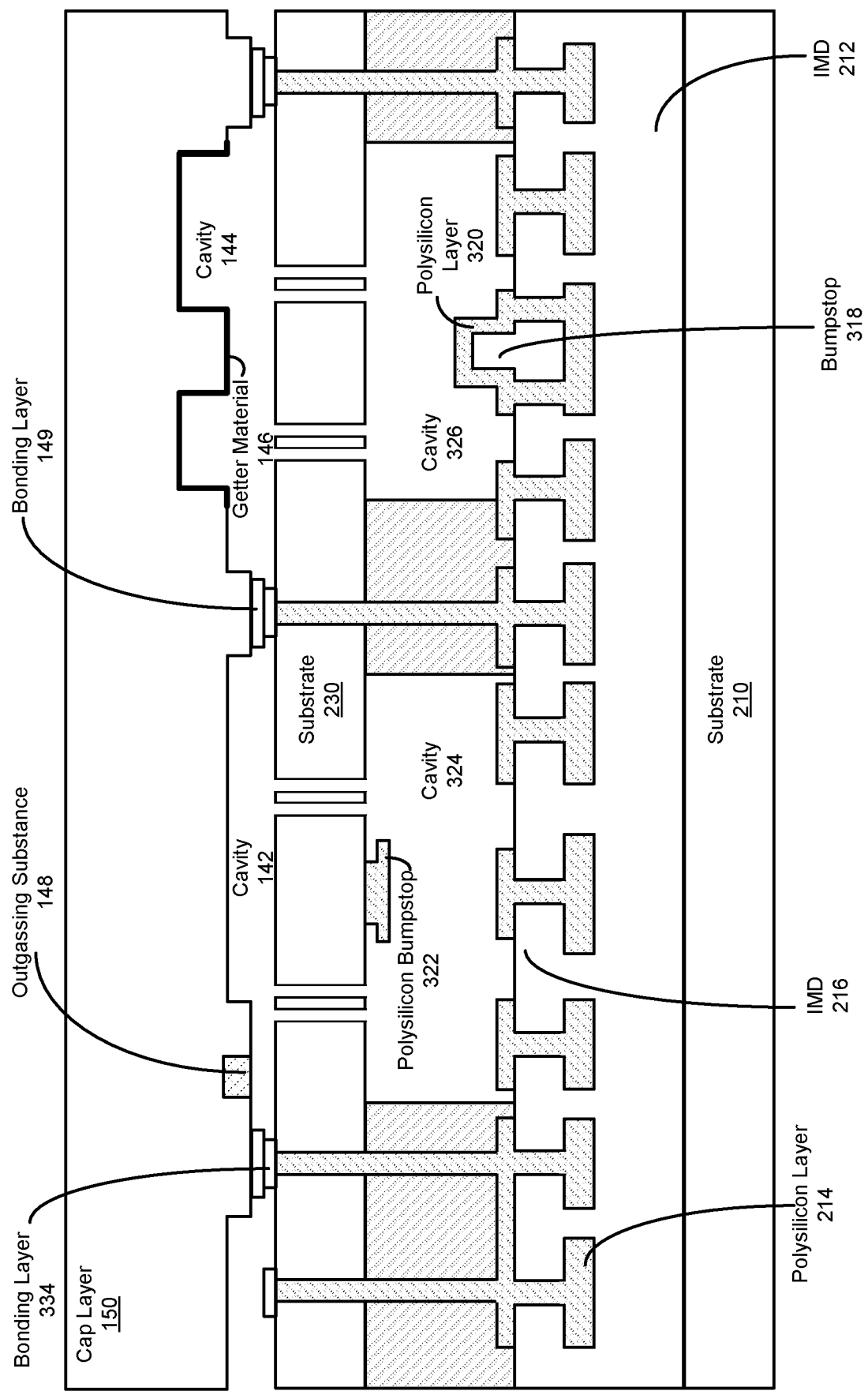
FIGS. 53 and 54 show bonding of a MEMS device layer to a cap layer forming a MEMS layer, MEMS layer thinning and opening a bond pad according to yet another aspect of the present embodiments.

Referring now to FIG. 53 bonding of a MEMS device layer 5200 to a cap layer 150 is shown. The bonding layer 149 of the cap layer 150 may bond to the bonding layer 334 on the MEMS device layer to bond them together and to form the cavities 324 and 326. The cap layer 150 may include an outgassing substance 148 by depositing HDP in that region. The outgassing substance 148 may be used for damping purposes in accelerometer cavity 324 with high cavity pressure. An upper surface of the cap layer 150 cavity 144 may be lined with a getter material 146, e.g., Ti, TiN, etc. to stabilize the cavity 326 pressure, making it suitable for gyro measurements.

Figure 54:
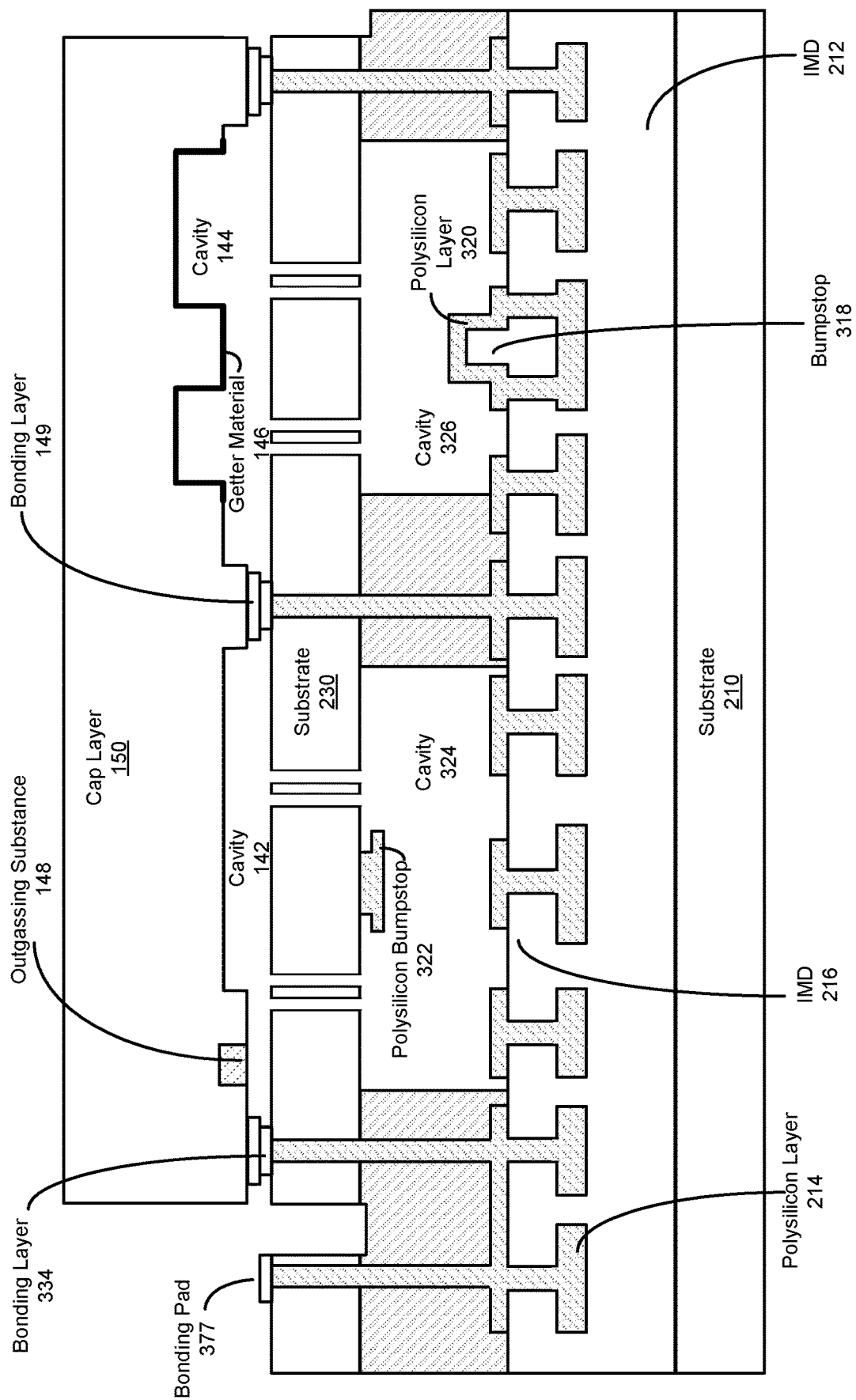

Referring now to FIG. 54, the cap layer 150 is thinned and etched, e.g., DRIE, to expose the bonding pad 377.

Figure 55:
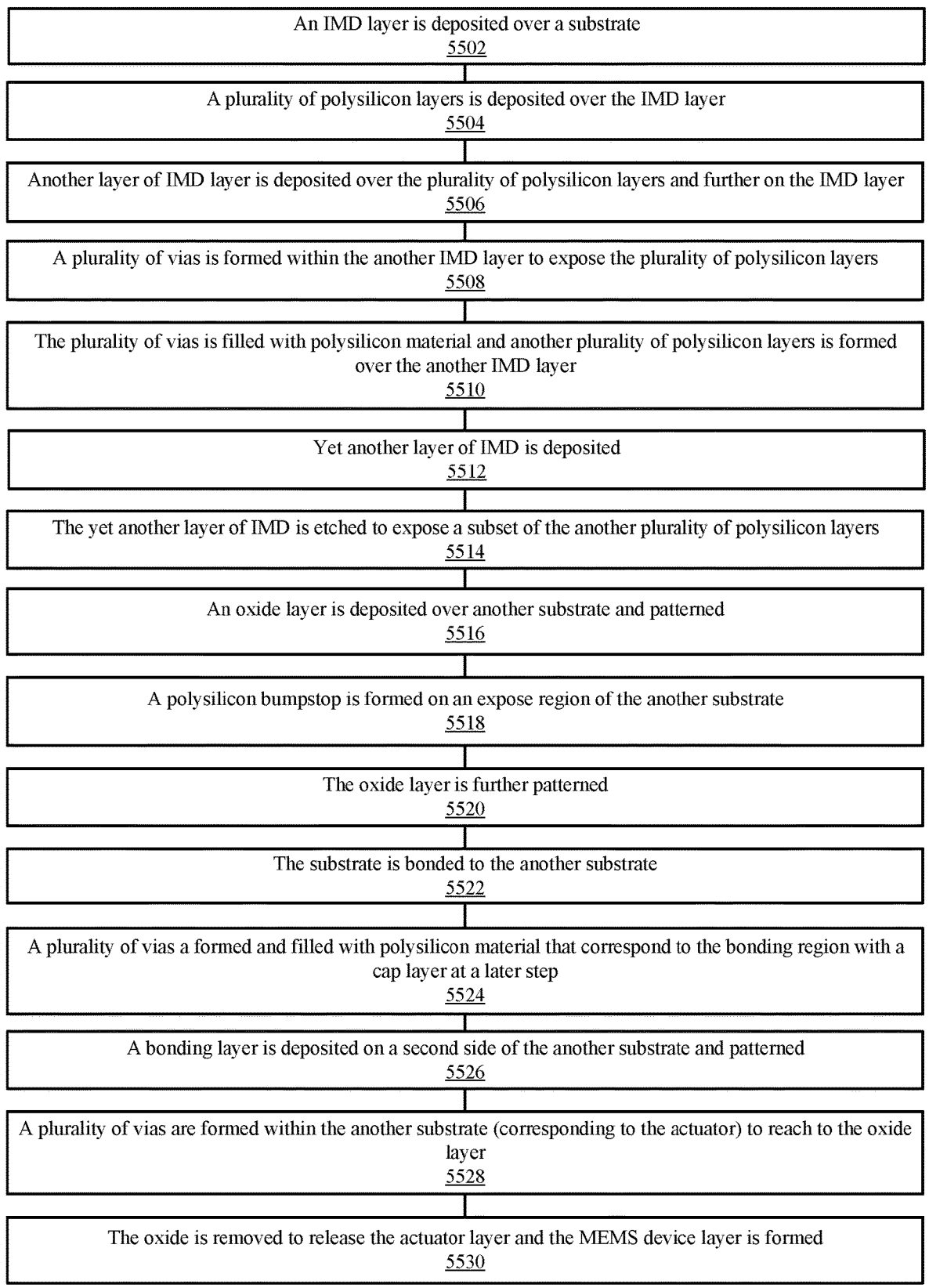
FIG. 55 shows another method flow for fabricating a MEMS device layer according to yet another aspect of the present embodiments.

FIG. 55 shows another method flow for fabricating a MEMS device layer according to yet another aspect of the present embodiments. At step 5502, an IMD layer is deposited over a substrate, as described above with respect to FIGS. 40-54. At step 5504, a plurality of polysilicon layers is deposited over the IMD layer, as described above with respect to FIGS. 40-54. At step 5506, another layer of IMD layer is deposited over the plurality of polysilicon layers and further on the IMD layer, as described above with respect to FIGS. 40-54. At step 5508, a plurality of bumpstops and vias are formed within the another IMD layer to expose the plurality of polysilicon layers, as described above with respect to FIGS. 40-54. At step 5510, another polysilicon layer is deposited over the plurality of bumpstops and vias and further on the another IMD layer and the another polysilicon layer is patterned, as described above with respect to FIGS. 40-54. At step 5512, yet another layer of IMD is deposited, as described above with respect to FIGS. 40-54. At step 5514, the yet another layer of IMD is etched to expose a subset of the another plurality of polysilicon layers, as described above with respect to FIGS. 40-54. At step 5516, an oxide layer is deposited over another substrate and patterned, as described above with respect to FIGS. 40-54. At step 5518, a polysilicon bumpstop is formed on an expose region of the another substrate, as described above with respect to FIGS. 40-54. At step 5520, the oxide layer is further patterned, as described above with respect to FIGS. 40-54. At step 5522, the substrate is bonded to the another substrate, as described above with respect to FIGS. 40-54. At step 5524, a plurality of vias a formed and filled with polysilicon material, as described above with respect to FIGS. 40-54. At step 5526, a bonding layer is deposited on a second side of the another substrate and patterned, as described above with respect to FIGS. 40-54. At step 5528, a plurality of vias are formed within the another substrate (corresponding to the actuator) to reach to the oxide layer, as described above with respect to FIGS. 40-54. At step 5530, the oxide is removed to release the actuator layer and the MEMS device layer is formed. It is appreciated that the MEMS device layer may be bonded to a cap layer.

FIGS. 56-69A show fabrication process for a cap layer according to a first aspect of the present embodiments. Referring now to FIG. 56, a substrate 410 is provided. The substrate 410 may be a p-silicon substrate or an n-silicon substrate. The fabrication is described with respect to a p-silicon substrate for illustrative purposes and should not be construed as limiting the scope of the embodiments. For example, an n-silicon substrate may be used.

Referring now to FIG. 57, a mask 412 is formed and patterned over a substrate 410. The mask 412 is used to expose a region within the substrate 410 that corresponds to an outgas region. Referring now to FIG. 58, HDP is deposited into the substrate 410 that is uncovered by the patterned mask 412 in order to form the outgassing substance 414. The outgassing substance 414 such as HDP may be used for damping purposes, e.g., in accelerometer cavity with high cavity pressure. HDP may be patterned by CMP after deposition. Referring now to FIG. 59, the mask 412 is removed and a bonding layer 416 is deposited on the substrate 410 and subsequently patterned, using a patterned mask as described above. The bonding layer 416 may include Al, AlCu, Ge, etc.

Referring now to FIG. 60, a mask is deposited over the substrate 410 and further on the bonding layer 416. It is appreciated that the mask may include more than one layer, e.g., passivation layer 418 and oxide 420 layer. The passivation layer 418 may include SiN. Referring now to FIG. 61, the mask is patterned to cover and protect the bonding layer 416 and the outgassing substance 414, which correspond to the standoff regions associated with standoffs. Referring now to FIG. 62, a photoresist layer 422 is deposited and patterned. The exposed regions of the substrate 410 correspond to a first and a second cavity regions within a same cavity.

Figure 63:
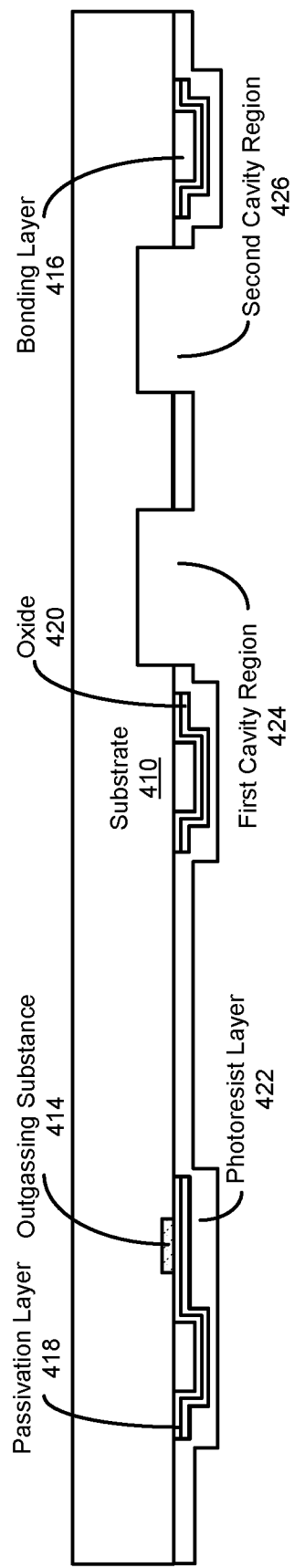
Figure 64:
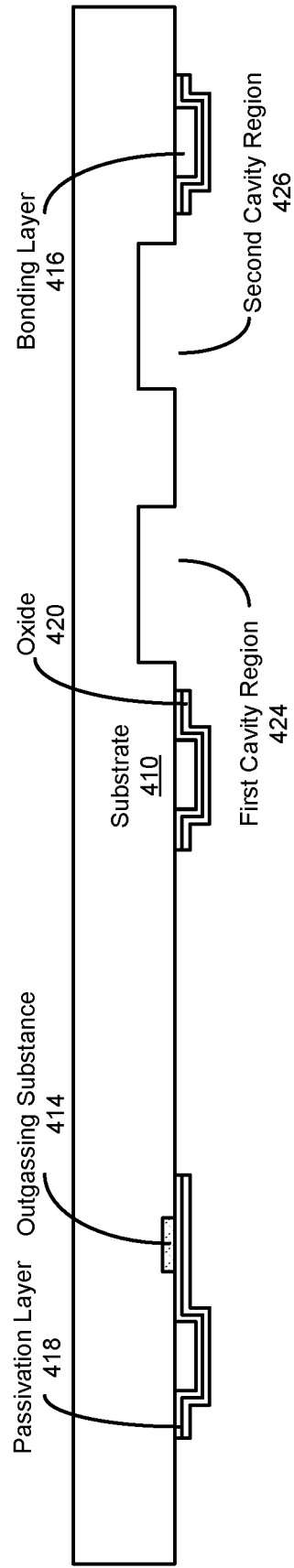
Figure 65:
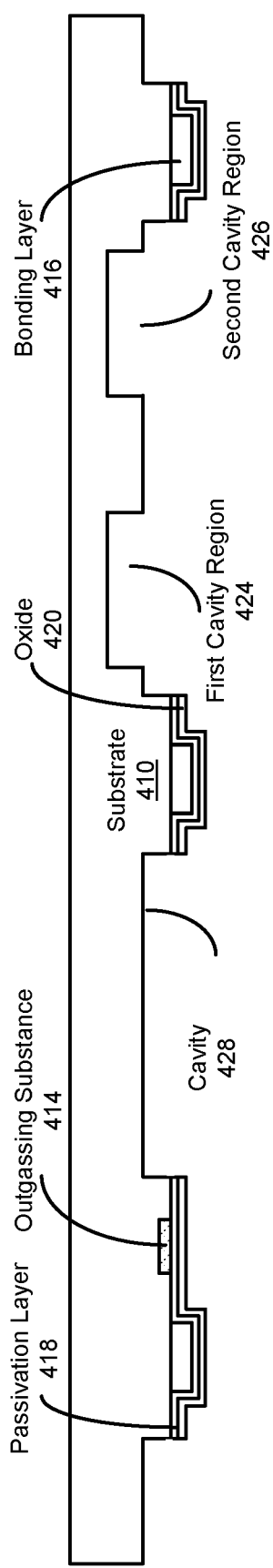
Figure 66:
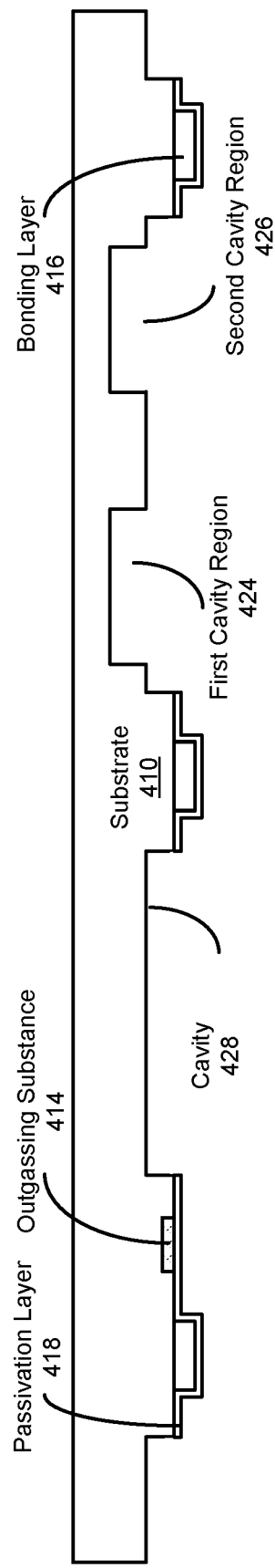

Referring now to FIG. 63, the exposed regions of the substrate 410 is etched to form the first cavity region 424 and the second cavity region 426 that are positioned within a same cavity. Referring now to FIG. 64, the photoresist 422 is removed. Referring now to FIG. 65, exposed regions (i.e., not covered by the oxide 420 layer and the passivation layer 418) of the substrate 410 are etched. Accordingly, a cavity 428 is formed. It is appreciated that in some embodiments, the cavity 428 corresponds to the accelerometer cavity while the first cavity region 424 and the second cavity region 426 that are within a same cavity correspond to the gyro cavity region. Referring now to FIG. 66, the oxide 420 layer is removed.

Figure 67:
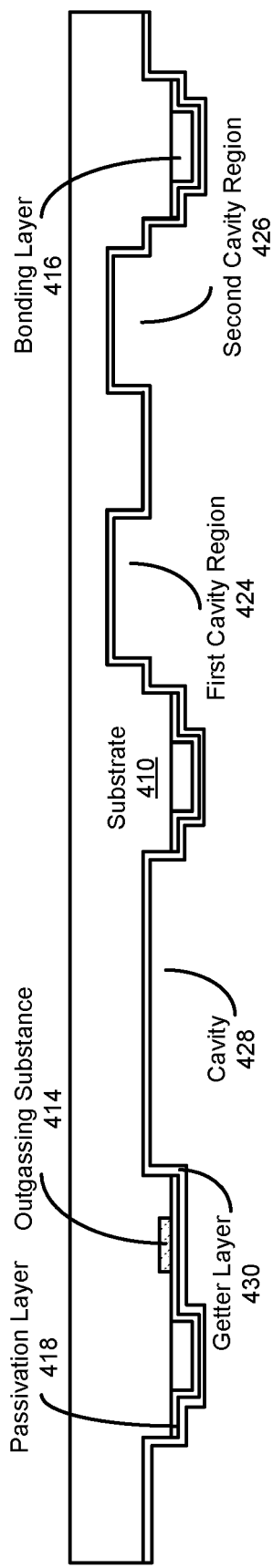
Figure 68:
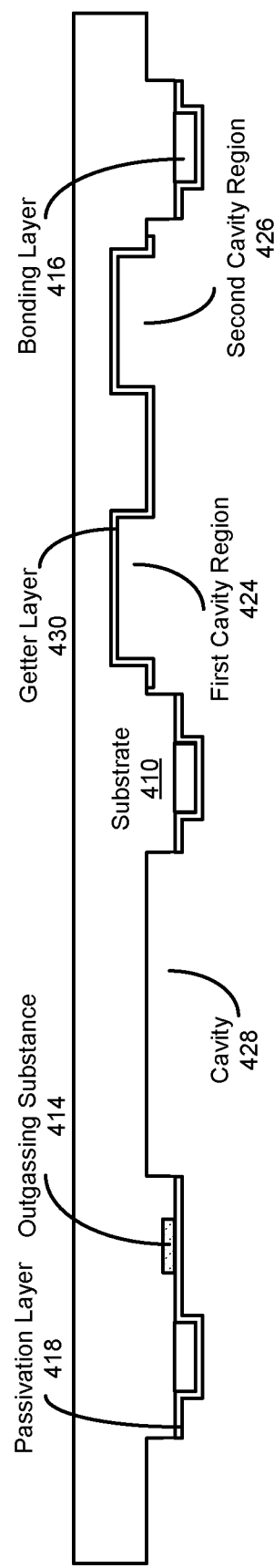

Referring now to FIG. 67, a getter layer 430 is deposited, thereby coating the surface of the upper surface of cavity 428 and further upper surface of the first and the second cavity regions 424 and 426 respectively. The getter material may include Ti, TiN, etc., to stabilize the cavity pressure. Referring now to FIG. 68, the getter layer 430 is patterned using a photoresist mask. It is appreciated that in one optional embodiment, the getter layer 430 is deposited followed by a hardmask deposition, spray photoresist coating, patterning the photoresist using a getter mask, hardmask patterning using a photoresist mask, and etching the getter layer and subsequently removing the hardmask. In yet another optional embodiment, the getter layer 430 is deposited using a getter layer shadow mask.

As illustrated, three standoffs are formed where each two standoffs define a cavity within. In one nonlimiting example, the standoff on the right hand side along with the middle standoff are coated with the bonding layer and form the first and the second cavity regions 424 and 426 while the standoff on the left and the middle standoff form the cavity 428. The depth of the two cavity regions may be the same or different while they are separated by an extrusion of the substrate 410 that is covered by the getter layer 430. In other words, the extrusion of the substrate 410 defines the first and the second cavity regions 424 and 426 respectively.

Figure 69A:
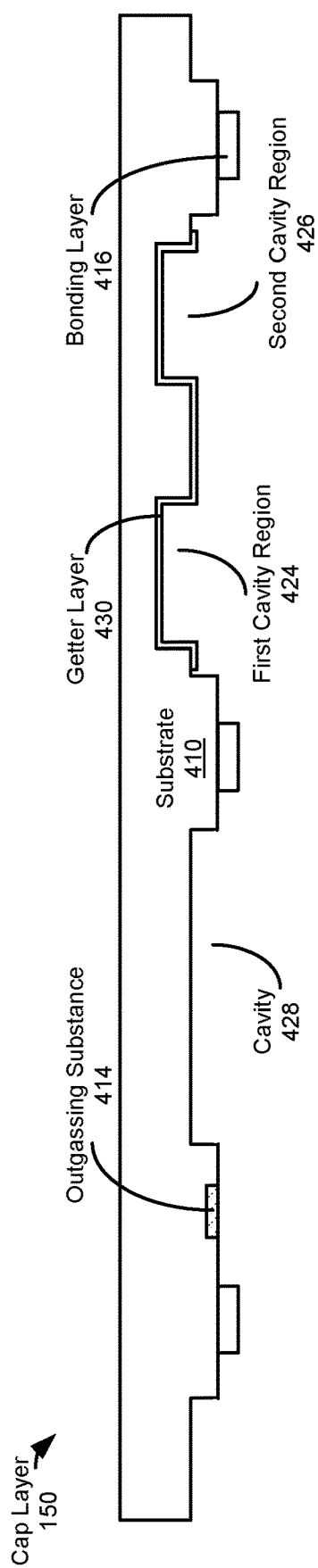
Figure 69B:
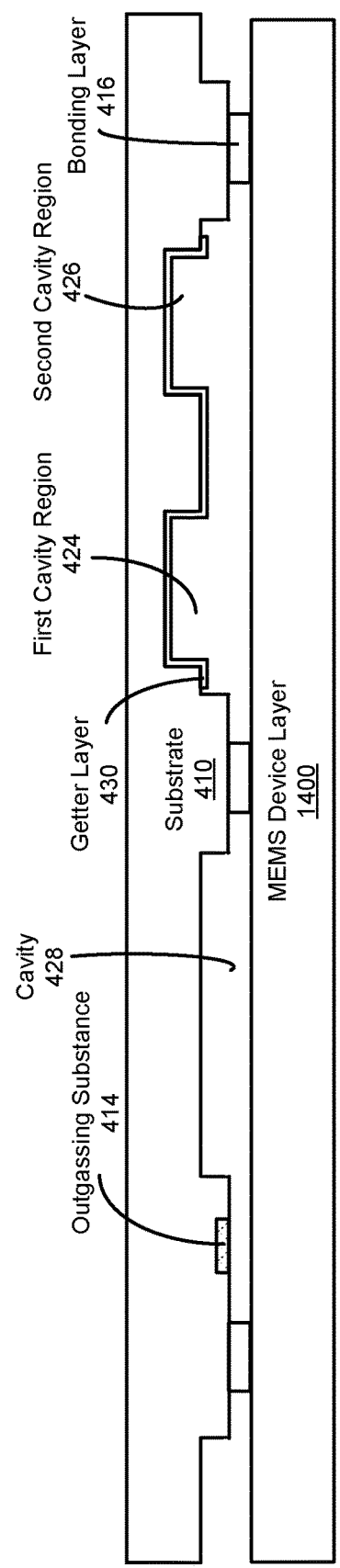
FIGS. 69B-69D show bonding of a MEMS device layer to a cap layer according to a first aspect of the present embodiments.
Figure 69C:
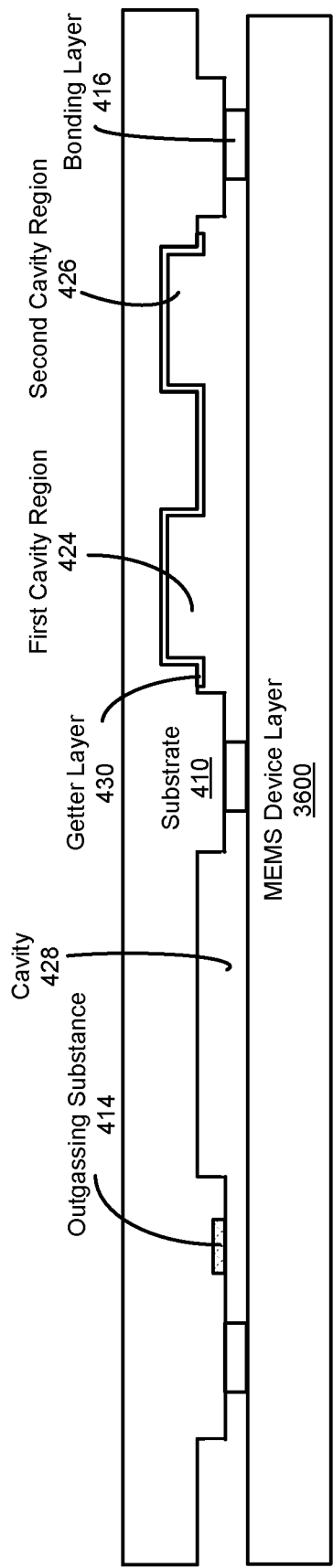
Figure 69D:
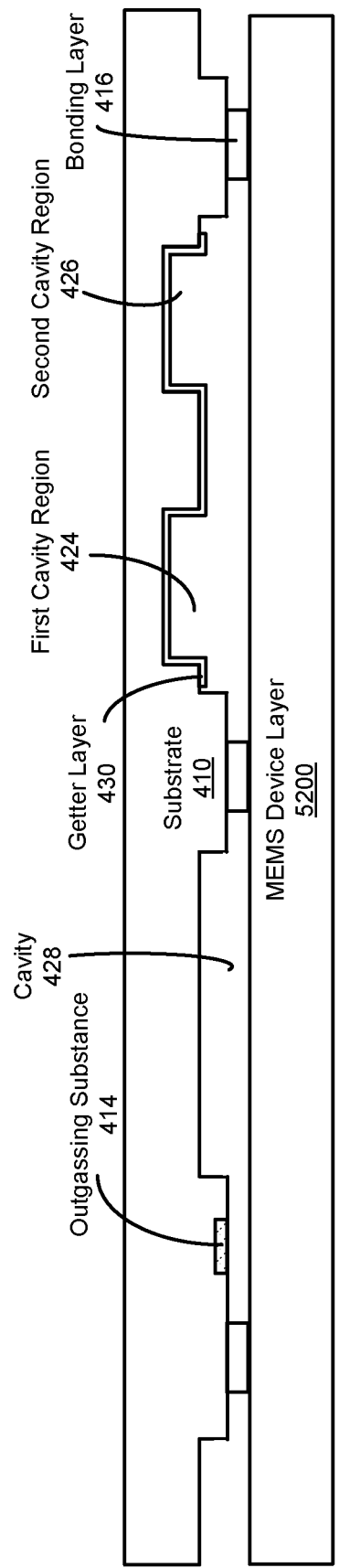

Referring now to FIG. 69A, the passivation layer 418 is removed to expose the bonding layer 416 and the outgassing substance 414. Referring now to FIGS. 69B-69D, bonding layer 334 of a MEMS device layer (1400, 3600, and 5200) to bonding layer 416 of a cap layer 150 according to a first aspect of the present embodiments are shown. In an example, eutectic bond is formed by germanium of bonding layer 416 and aluminum of bonding layer 334.

FIG. 70 shows a method flow for fabricating a cap layer according to a first aspect of the present embodiments. At step 7002, a bonding material is deposited on a first, a second, and a third portion of a substrate, wherein the first, the second and the third portions are associated with a first, a second, and a third standoff regions, as described above in FIGS. 56-69D. At step 7004, a mask is deposited and patterned over a fourth portion of the substrate that is exposed and further on the bonding material, wherein a first exposed portion of the patterned mask is associated with a first cavity region positioned between the first and the second standoff regions and a second exposed portion of the patterned mask is associated with a second cavity region positioned between the second and the third standoff regions, as described above in FIGS. 56-69D. At step 7006, a photoresist mask is deposited and patterned over the patterned mask to expose at least two regions within the first cavity region, as described above in FIGS. 56-69D. At step 7008, the at least two regions are etched to form a first cavity, as described above in FIGS. 56-69D. At step 7010, a remainder of the photoresist mask is removed to expose the first cavity region and the second cavity region, as described above in FIGS. 56-69D. At step 7012, the first cavity region and the second cavity region are etched, wherein the etching the first cavity region increases a depth of the first cavity and wherein the etching the second cavity region forms a second cavity between the second and the third standoff regions, and wherein a depth of the first cavity region within the first cavity is greater than a depth of the second cavity, as described above in FIGS. 56-69D. At step 7014, a getter material is deposited and patterned to cover a portion of the first cavity, as described above in FIGS. 56-69D. At step 7016, the patterned mask is removed to expose the bonding material, as described above in FIGS. 56-69D.

As illustrated, in the first cap layer embodiment, the getter material is maximized within the gyro cavity to stabilize the cavity pressure.

Figure 74:
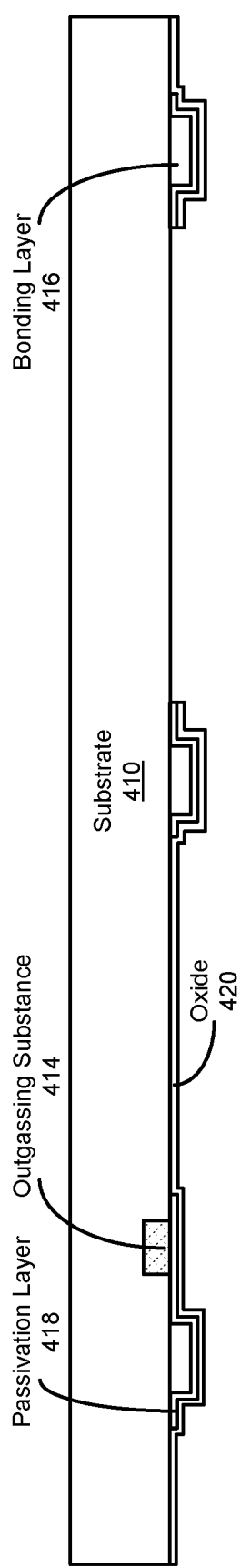
Figure 75:
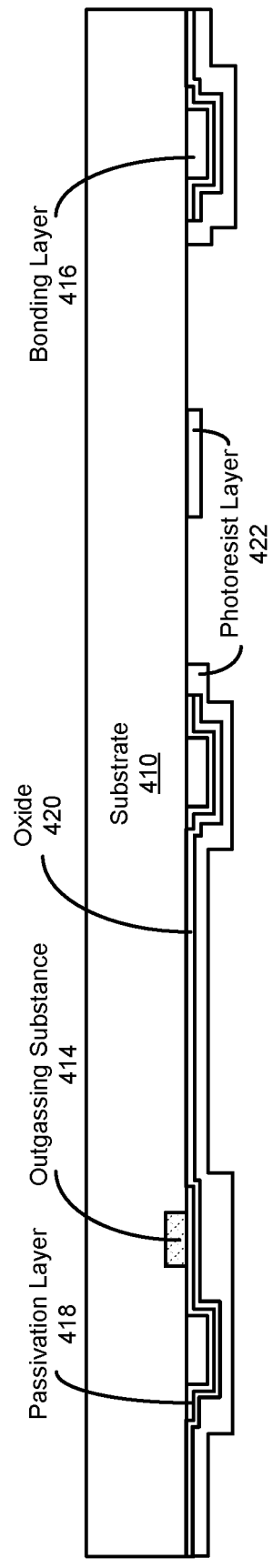
Figure 76:
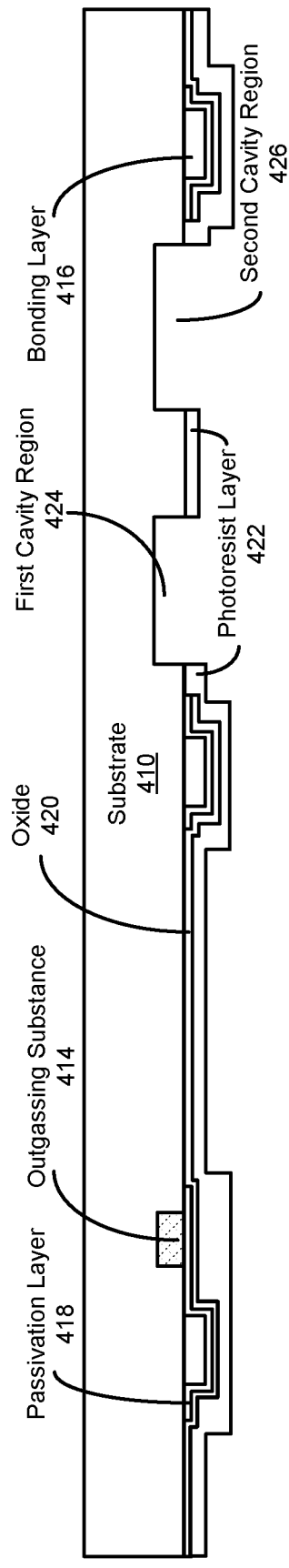
Figure 77:
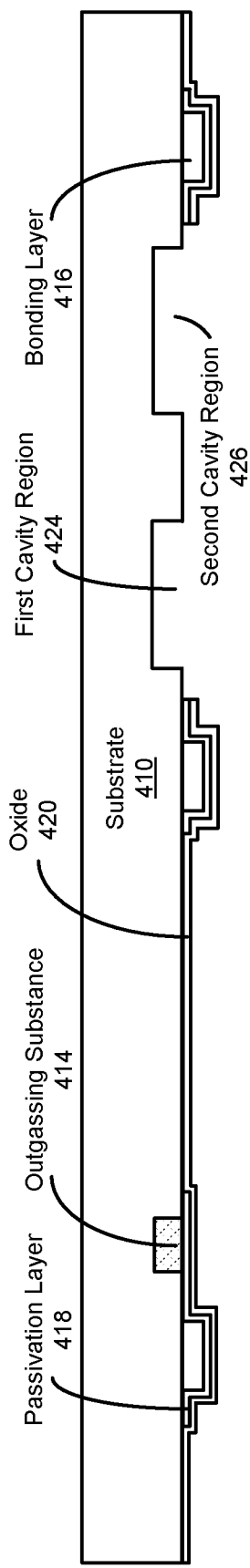
Figure 78:
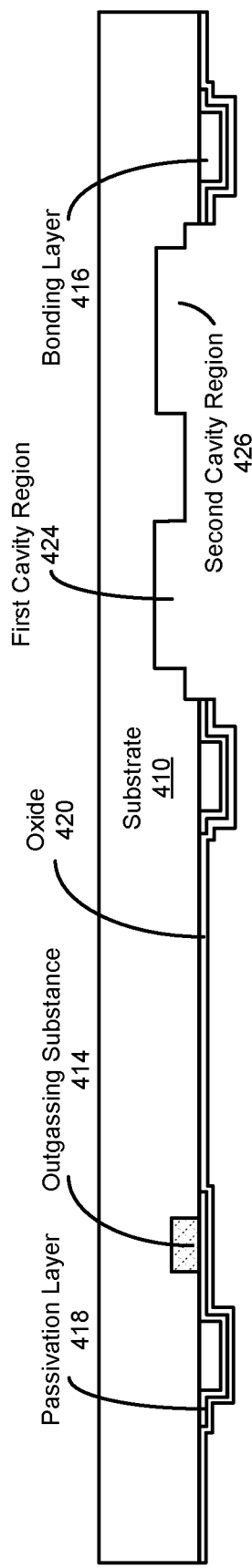
Figure 79:
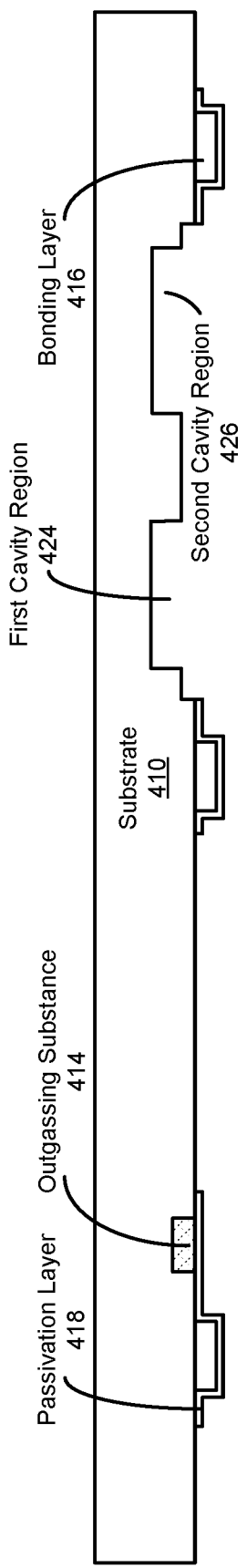
Figure 80:
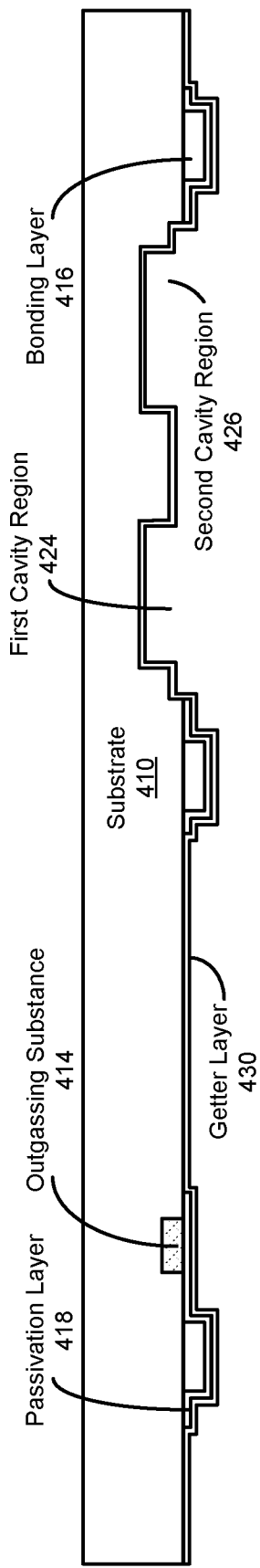
Figure 81:
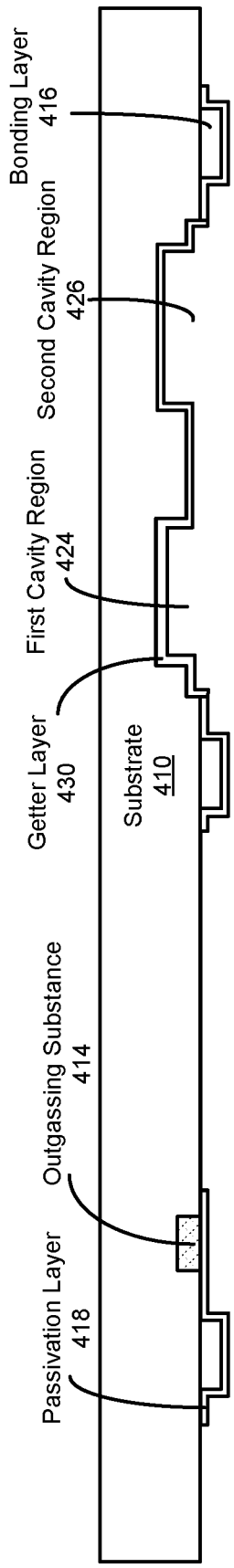

FIGS. 71-83A show fabrication process for a cap layer according to a second aspect of the present embodiments. FIG. 71 is the same as FIG. 59 and goes through the same process, as described above. Referring now to FIG. 72, the mask which is the passivation layer 418 is patterned, similar to the process described above. As such, the passivation layer 418 protects the bonding layer 416 and the outgassing substance 414 in subsequent fabrication steps from being damaged or degraded. Referring now to FIG. 73, the oxide 420 is deposited to cover the passivation layer 418 as well as the exposed regions of the substrate 410. Referring now to FIG. 74, the oxide 420 layer and the passivation layer 418 may be patterned similar to the processes as described above. Thus, the oxide 420 layer leaving a portion of the substrate 410 exposed while protecting the standoff regions (corresponding to the standoffs). Referring now to FIG. 75, a photoresist layer 422 is deposited and patterned such that it leaves a portion of the substrate 410 exposed. Referring now to FIG. 76, the exposed portion of the substrate 410 is etched, thereby forming the first and the second cavity regions 424 and 426 respectively that are within a same cavity. Referring now to FIG. 77, the photoresist layer 422 removed and the exposed portions of the substrate 410 are etched as illustrated in FIG. 78. Referring now to FIG. 79, the oxide 420 layer is removed. Referring now to FIG. 80, a getter layer 430 is deposited on the substrate 410 and on the passivation layer 418. Similar to the process, as described above, the getter layer 430 is patterned, as illustrated in FIG. 81. As such, the getter layer 430 coats the first and the second cavity regions 416 and 424.

Figure 82:
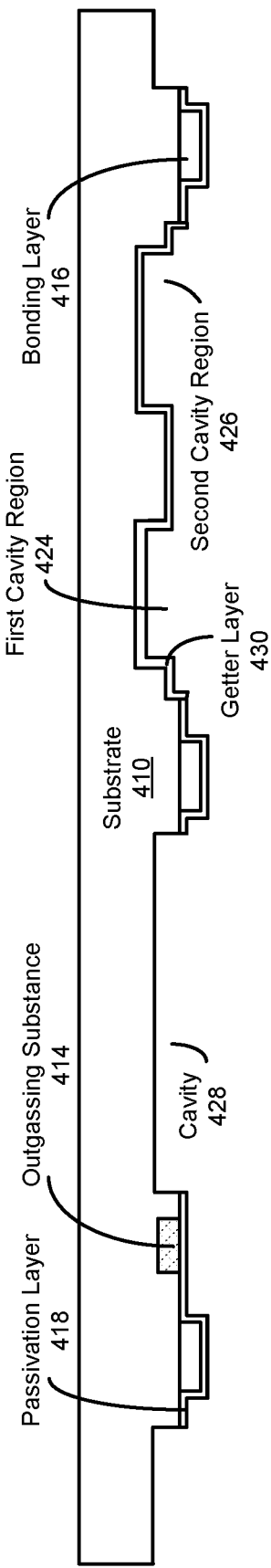

Referring now to FIG. 82, a photoresist mask may be used to protect the getter layer 430 and the passivation layer 418 protects the bonding layer 416 and the outgassing substance 414 and the exposed portions of the substrate 410 is etched to form the cavity 428. Once the cavity 428 is formed, the photoresist mask is removed.

Figure 83A:
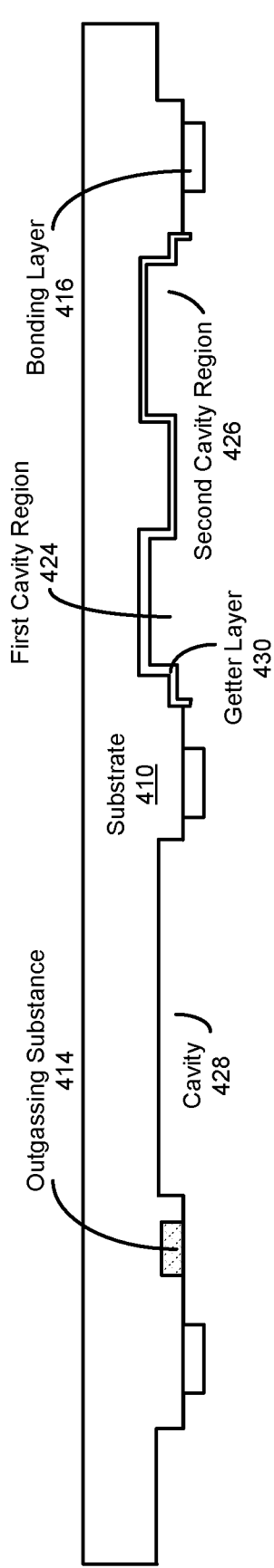
Figure 83B:
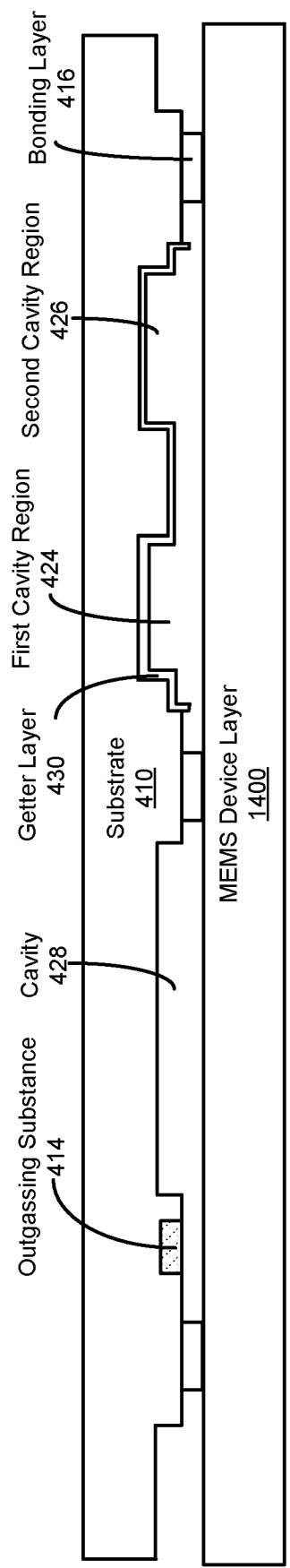
FIGS. 83B-83D show bonding of a MEMS device layer to a cap layer according to a second aspect of the present embodiments.
Figure 83C:
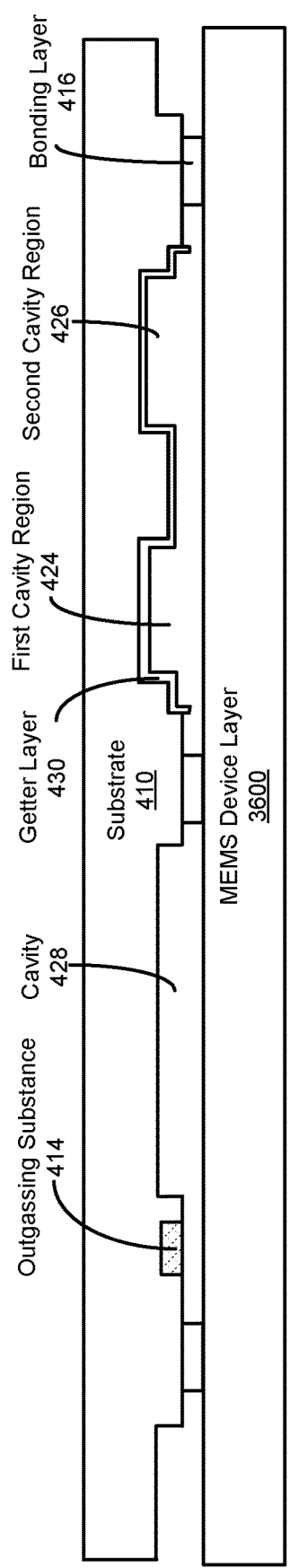
Figure 83D:
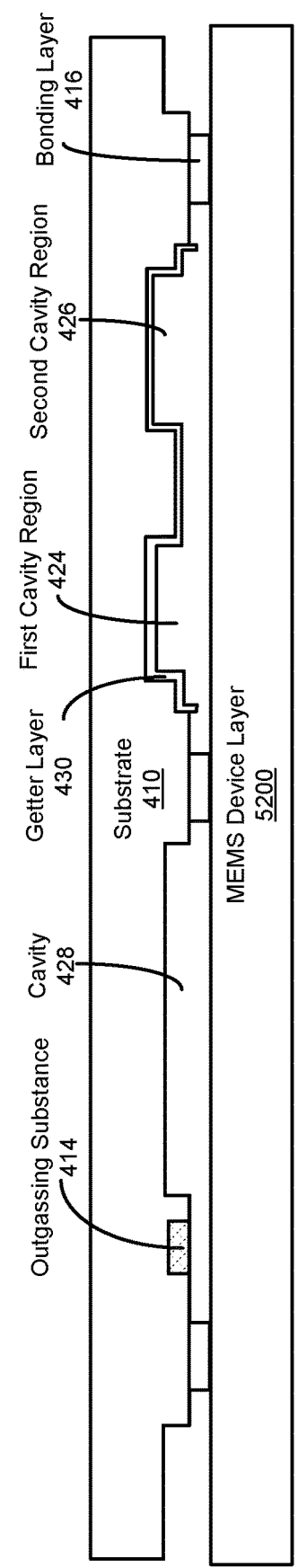

Referring now to FIG. 83A, the passivation layer 418 is removed to expose the outgassing substance 414. Referring now to FIGS. 83B-83D bonding of a MEMS device layer (1400, 3600, and 5200) to a cap layer according to a second aspect of the present embodiments are shown. In an example, eutectic bond is formed by germanium of bonding layer 416 and aluminum of bonding layer 334.

As illustrated, three standoffs are formed where each two standoffs define a cavity within. In one nonlimiting example, the standoff on the right hand side along with the middle standoff are coated with the bonding layer and form the first and the second cavity regions 424 and 426 while the standoff on the left and the middle standoff form the cavity 428. The depth of the two cavity regions may be the same while they are separated by an extrusion of the substrate 410 that is covered by the getter layer 430. In other words, the extrusion of the substrate 410 defines the first and the second cavity regions 424 and 426 respectively.

FIG. 84 shows a method flow for fabricating a cap layer according to a second aspect of the present embodiments. At step 8402, a bonding material is deposited on a first, a second, and a third portion of a substrate, wherein the first, the second and the third portions are associated with a first, a second, and a third standoff regions, as described above in FIGS. 71-83A. At step 8404, a mask is formed over a fourth portion of the substrate that is exposed and further on the bonding material, as described above in FIGS. 71-83A. At step 8406, the mask is patterned to form a first patterned mask, wherein a first exposed portion of the patterned mask is associated with a first cavity region positioned between the first and the second standoff regions, and wherein the mask covers a second cavity region positioned between the second and the third standoff regions and further covers the bonding material, as described above in FIGS. 71-83A. At step 8408, an oxide mask is deposited and patterned over the substrate and the mask to form an exposed second cavity region of the substrate, as described above in FIGS. 71-83A. At step 8410, a photoresist mask is formed over the patterned mask and further on an exposed second cavity region of the substrate, as described above in FIGS. 71-83A. At step 8412, the photoresist mask is patterned to expose a section of the second cavity region, as described above in FIGS. 71-83A. At step 8414, the section of the second cavity region is etched to form two second cavities, as described above in FIGS. 71-83A. At step 8416, a remainder of the photoresist mask is removed to expose a remainder of substrate in the first cavity region, as described above in FIGS. 71-83A. At step 8418, the first cavity region is etched and the first cavity, as described above in FIGS. 71-83A. At step 8420, the first patterned mask is patterned to form a second patterned mask, wherein the second patterned mask exposes a section of the second cavity region while covering the first, the second, and the third standoff regions, as described above in FIGS. 71-83A. At step 8422, a getter material is deposited in the first cavity region, as described above in FIGS. 71-83A. At step 8424, exposed portions of the substrate uncovered by the second patterned mask is etched to form a first, a second, and a third standoffs associated with the first, the second, and the third standoff regions and further to form a second cavity positioned between the second and the third standoff regions, as described above in FIGS. 71-83A. At step 8426, the second patterned mask is removed to expose the bonding material, as described above in FIGS. 71-83A.

As illustrated, in the first cap layer embodiment, the getter material is maximized within the gyro cavity to stabilize the cavity pressure.

Figure 85:
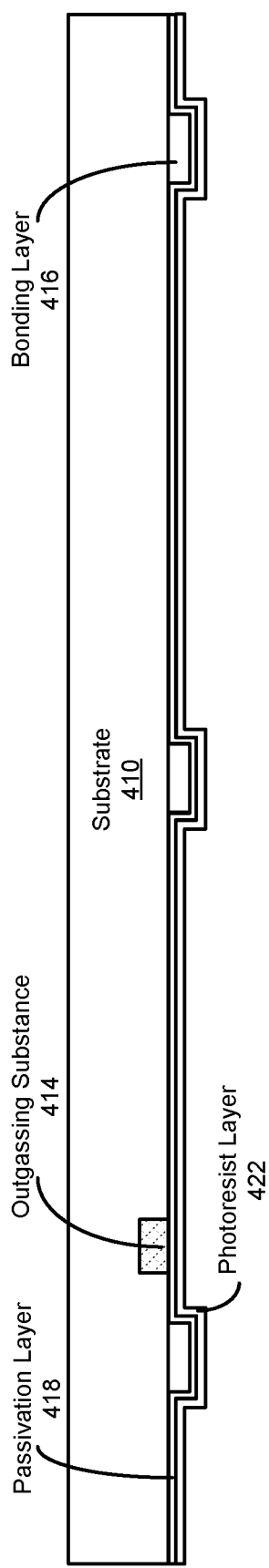
Figure 86:
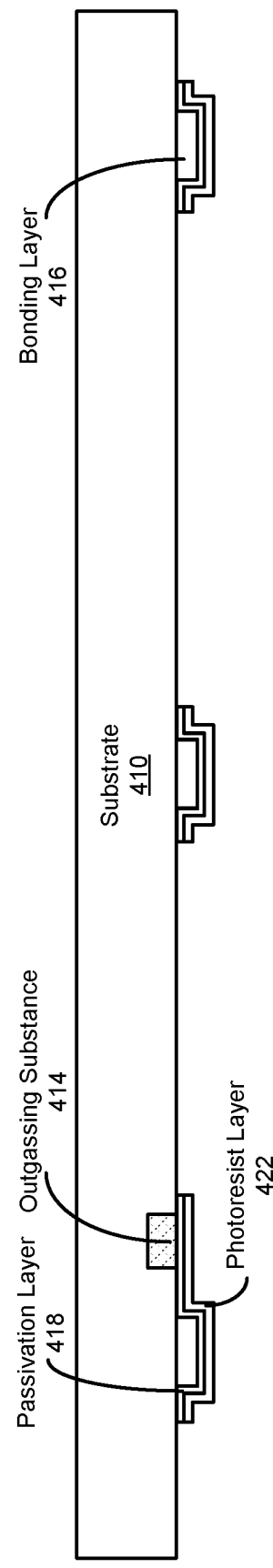
Figure 87:
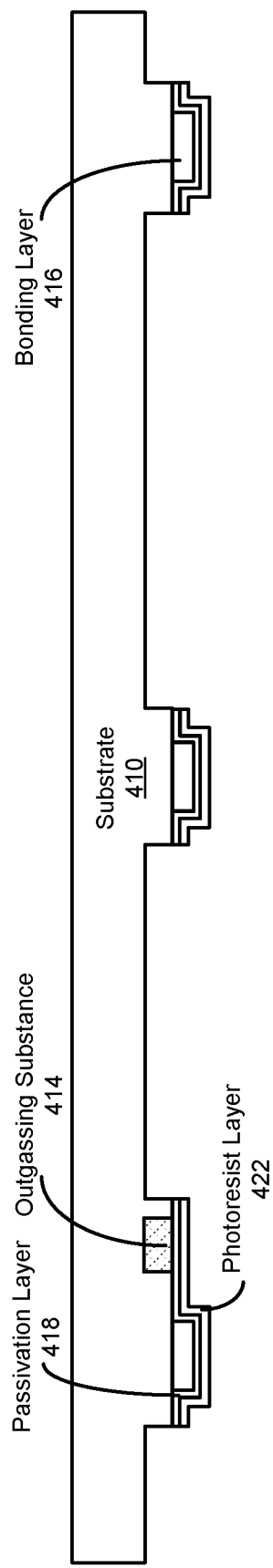
Figure 88:
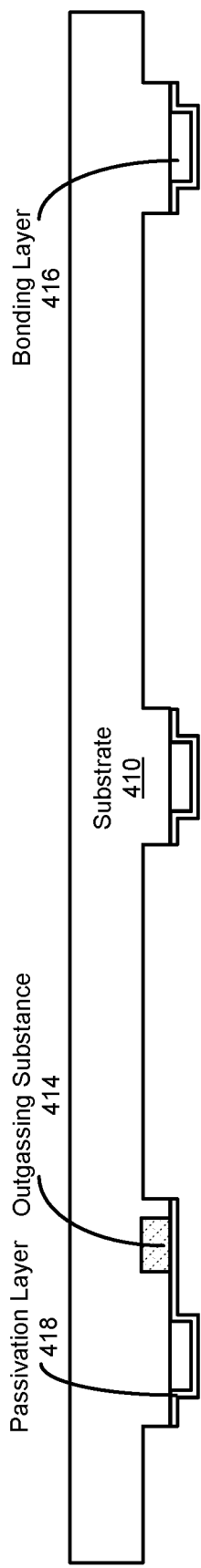
Figure 89:
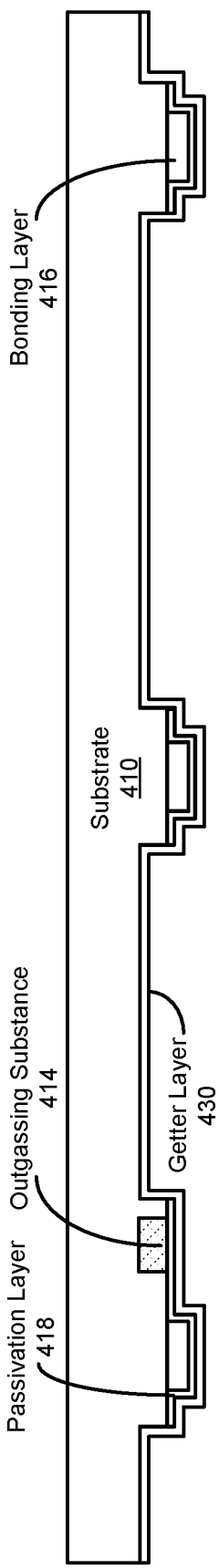
Figure 90:
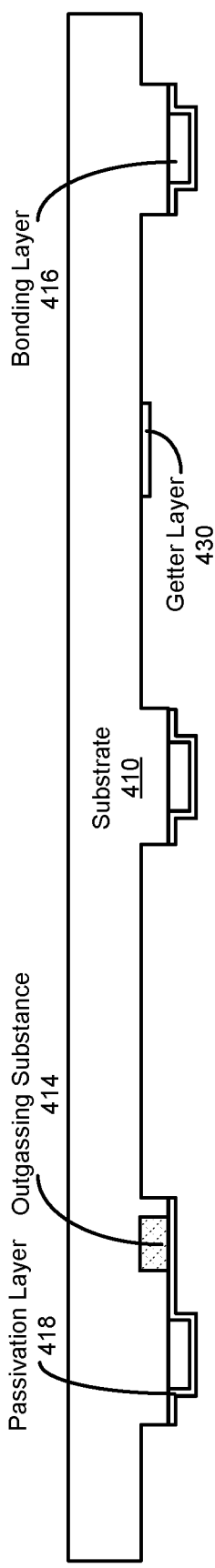
Figure 91:
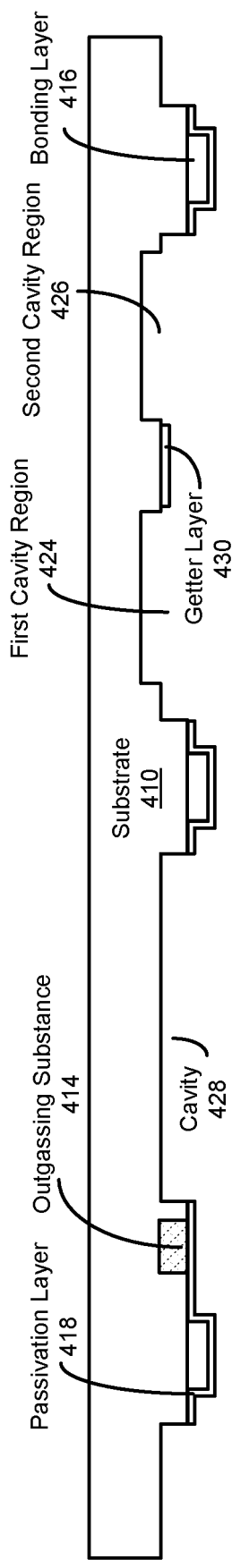

FIGS. 85-92A show fabrication process for a cap layer according to a third aspect of the present embodiments. Referring now to FIG. 85 is a continuation of FIG. 71. In FIG. 85, a photoresist layer 422 is deposited over the passivation layer 418. Referring now to FIG. 86, the photoresist layer 422 is patterned that exposes certain regions of the substrate 410 exposed that correspond to the cavities. It is appreciated that the standoff regions associated with the standoff that may include the bonding layer 416 and the outgassing substance 414 are protected. Referring now to FIG. 87, the exposed regions of the substrate 410 are etched forming standoffs and cavity regions. Referring now to FIG. 88, the photoresist layer 422 is removed. Referring now to FIG. 89, a getter layer 430 is deposited on the substrate 410 and the passivation layer 418. Referring now to FIG. 90, the getter layer 430 is patterned leaving a patterned layer 430 in a gyro cavity to stabilize the cavity pressure. Referring now to FIG. 91, a mask may be deposited and patterned to leave a portion of the substrate 410 that correspond to the first and the second cavity regions 424 and 426 respectively. The exposed regions of the substrate 410 are etched forming the first and the second cavity regions 424 and 426 respectively. The depth of the two cavity regions may be the same while they are separated by an extrusion of the substrate 410 that is covered by the getter layer 430. In other words, the extrusion of the substrate 410 defines the first and the second cavity regions 424 and 426 respectively.

Figure 92A:
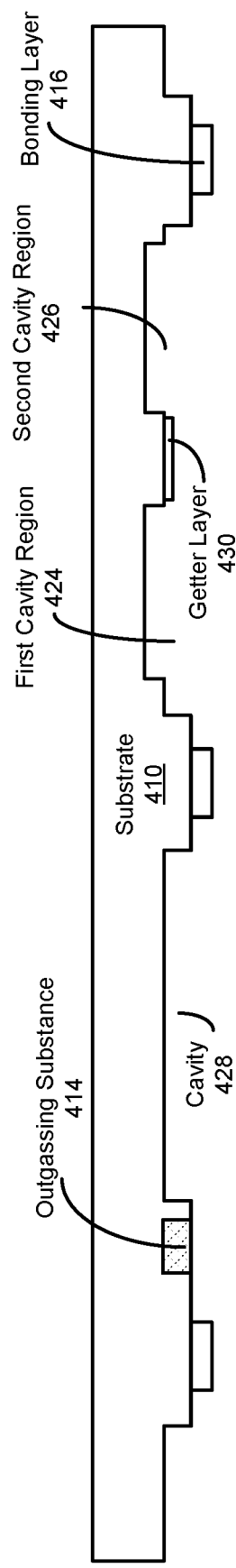
Figure 92B:
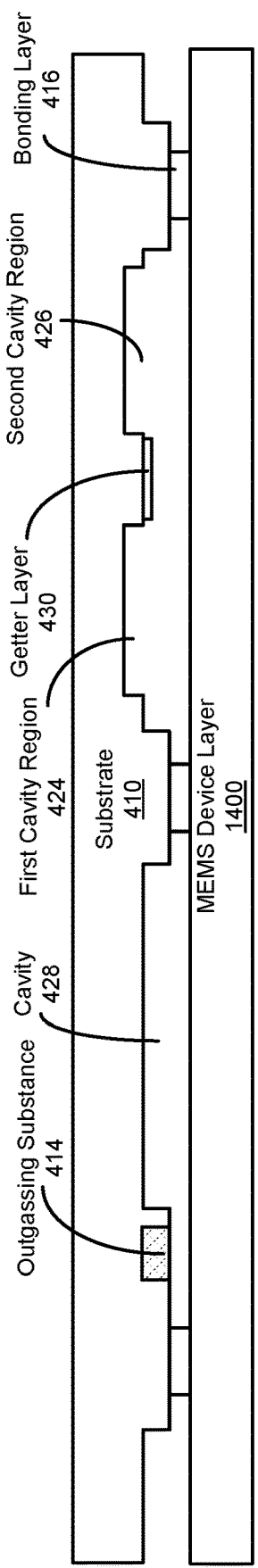
FIGS. 92B-92D show bonding of a MEMS device layer to a cap layer according to a third aspect of the present embodiments.
Figure 92C:
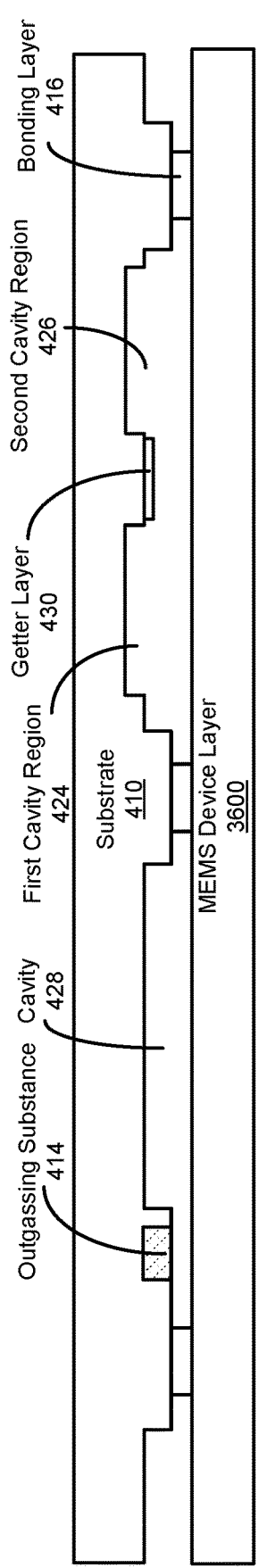
Figure 92D:
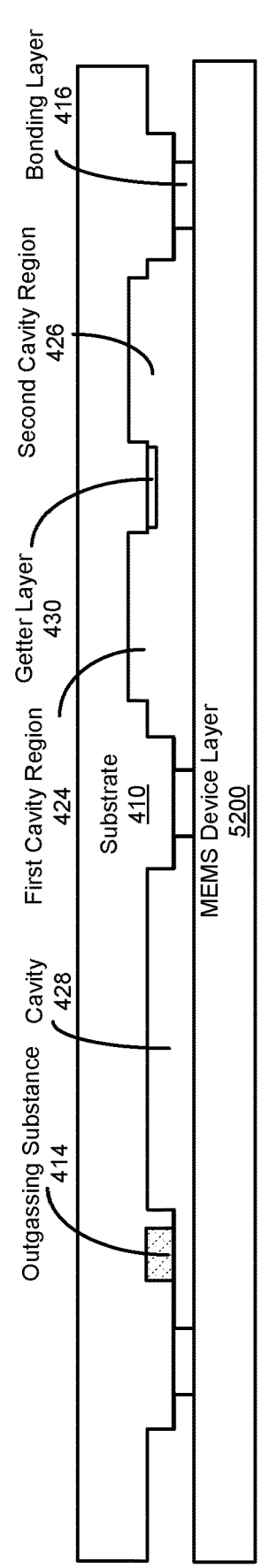

Referring now to FIG. 92A, the passivation layer 418 is removed to expose the outgassing substance 414. Moreover, removing the passivation layer 418 exposes the bonding layer 416 that may be used to bond the cap layer to the MEMS device layer. Referring now to FIGS. 92B-92D, bonding of a MEMS device layer (1400, 3600, and 5200) to a cap layer according to a third aspect of the present embodiments are shown. In an example, eutectic bond is formed by germanium of bonding layer 416 and aluminum of bonding layer 334.

FIG. 93 shows a method flow for fabricating a cap layer according to a third aspect of the present embodiments. At step 9302, a bonding material is deposited on a first, a second, and a third portion of a substrate, wherein the first, the second and the third portions are associated with a first, a second, and a third standoff regions, as described above in FIGS. 85-92D. At step 9304, a mask is formed over a fourth portion of the substrate that is exposed and further on the bonding material, as described above in FIGS. 85-92D. At step 9306, the mask is patterned, wherein a first exposed portion of the patterned mask is associated with a first cavity region positioned between the first and the second standoff regions and a second exposed portion of the patterned mask is associated with a second cavity region positioned between the second and the third standoff regions, and wherein the patterned mask covers the first, the second, and the third standoff regions, as described above in FIGS. 85-92D. At step 9308, exposed portions of the substrate are etched to form a first cavity within the first cavity region, a second cavity within the second cavity region, wherein a depth of the first cavity is the same as a depth of the second cavity, and wherein the etching further forms a first, a second, and a third standoffs associated with the first, the second, and the third standoff regions respectively, as described above in FIGS. 85-92D. At step 9310, a getter material is formed over the patterned mask and further on exposed portions of the first and the second cavity regions, as described above in FIGS. 85-92D. At step 9312, the getter material is patterned to cover a portion of the first cavity, as described above in FIGS. 85-92D. At step 9314, a photoresist mask is formed over exposed portion of the substrate in the second cavity and further over exposed portion of the substrate in the first cavity and further over the patterned getter material, as described above in FIGS. 85-92D. At step 9316, the photoresist mask is patterned to expose a portion of the first cavity region while covering the patterned getter, as described above in FIGS. 85-92D. At step 9318, the exposed portion of the first cavity region is etched to form a first and a second region associated with the first cavity, and wherein a depth of the first and the second cavity regions is greater than the depth of the second cavity, as described above in FIGS. 85-92D. At step 9320, the patterned mask is removed to expose the bonding material, as described above in FIGS. 85-92D.

As illustrated, the getter layer patterning is achieved with less topography and the getter material area is reduced.

Figure 94:
Figure 95:
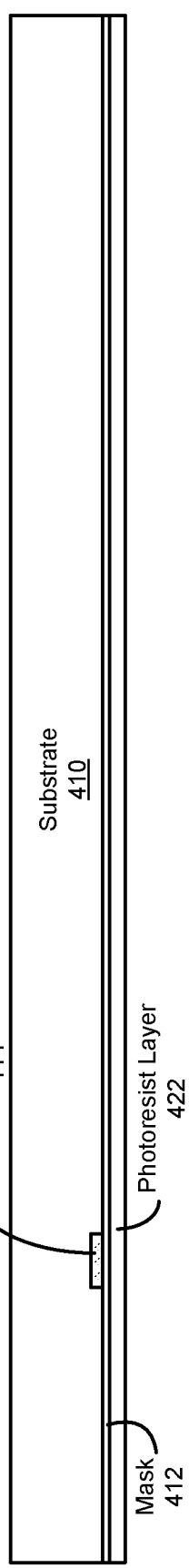
Figure 96:
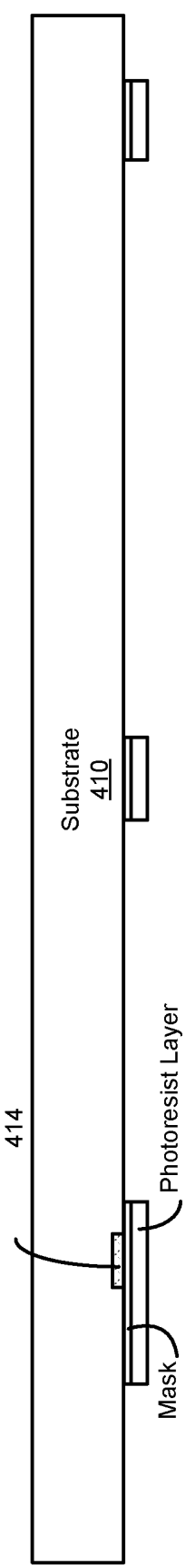
Figure 97:
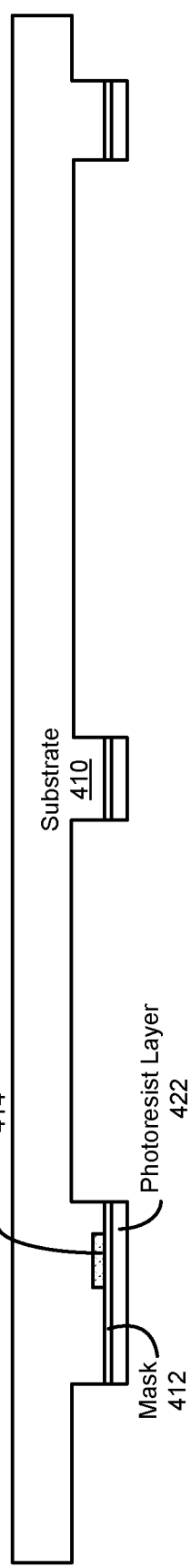

FIGS. 94-103A show fabrication process for a cap layer according to a fourth aspect of the present embodiments. Referring now to FIG. 94 is a continuation of FIG. 58. A mask 412 (e.g., a passivation layer such as SiN) is deposited over the substrate 410 and the outgassing substance 414. Referring now to FIG. 95, a photoresist layer 422 is deposited over the mask 412. Referring now to FIG. 96, the photoresist layer 422 is patterned. The patterned photoresist layer 422 covers the regions corresponding to the standoff regions associated with the standoff that may include the outgassing substance 414 in order to protect those regions from being damaged or degraded in subsequent fabrication processing steps. Referring now to FIG. 97, the exposed regions of the substrate 410 are etched to form the cavities and the standoffs.

Referring now to FIG. 98, the photoresist layer 422 is removed. Referring now to FIG. 99, a polysilicon layer 432 (similar to polysilicon material as described above) is deposited over the mask 412 and further over the substrate 410. Subsequent to depositing the polysilicon layer 432, a getter layer 430 is deposited over the polysilicon layer 432. Referring now to FIG. 100, the getter layer 430 is patterned, such that the getter layer 430 is disposed within a gyro cavity.

Figure 101:
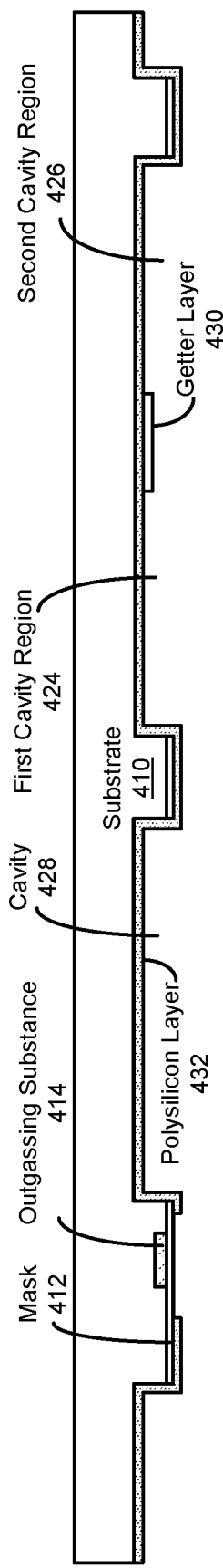

Referring now to FIG. 101, the polysilicon layer 432 is patterned using a mask to expose the mask 412 covering the outgassing substance 414. As illustrated, the first and the second cavity regions 424 and 426 respectively within a same cavity and a cavity 428 that is separate from the first and the second cavity regions 424 and 426 are formed.

Figure 102:
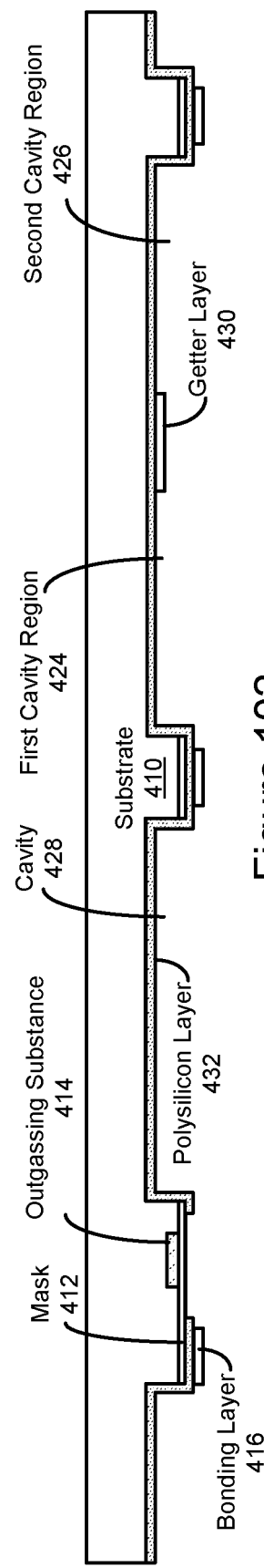
Figure 103A:
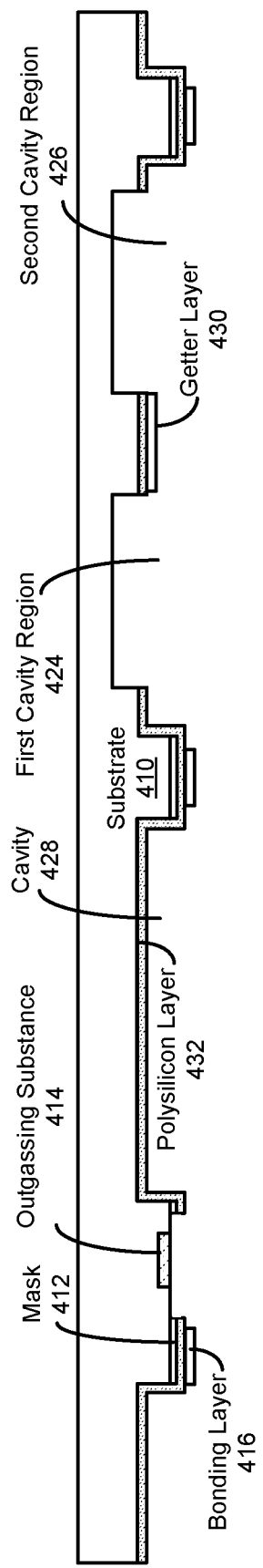

Referring now to FIG. 102, a bond layer 416 is deposited and patterned, as described above. The patterned bond layer 416 are positioned on the standoffs and within the standoff regions. Referring now to FIG. 103A, a patterned mask is used that correspond to the first and the second cavity regions 424 and 426 respectively (exposing the first and the second cavity regions 424 and 426 respectively). The polysilicon layer 432 and a portion of the substrate 410 corresponding to the first and the second cavity regions 424 and 426 are etched to increase the depth of the first and the second cavity regions 424 and 426. It is appreciated that the depth of the first and the second cavity regions 424 and 426 may be the same while the two regions are separated by the extrusion of the substrate 410 covered with the getter layer 430. Subsequent to the etching, the mask 412 covering the outgassing substance 414 is removed to expose the outgassing substance 414.

Figure 103B:
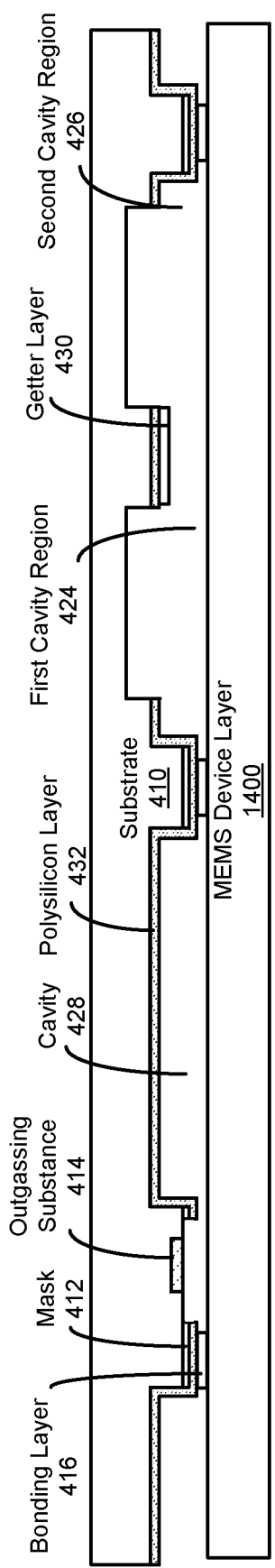
FIGS. 103B-103D show bonding of a MEMS device layer to a cap layer according to a fourth aspect of the present embodiments.
Figure 103C:
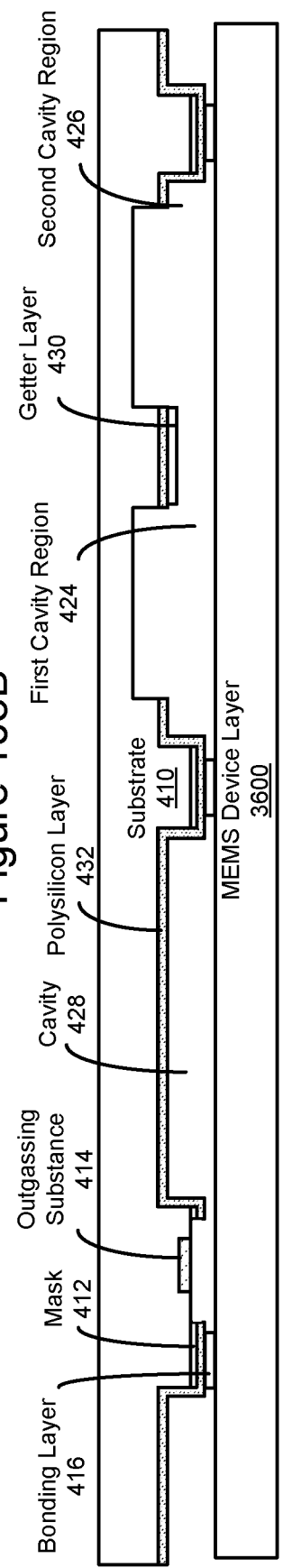
Figure 103D:
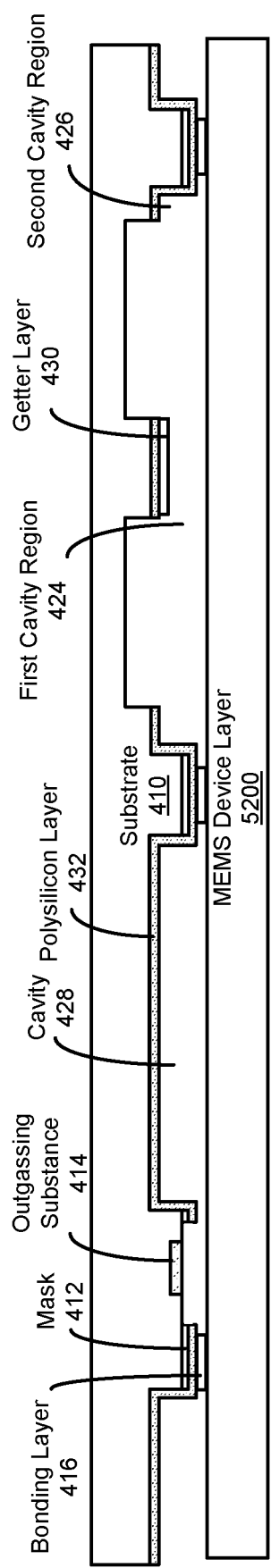

FIGS. 103B-103D show bonding of a MEMS device layer (1400, 3600, and 5200) to a cap layer according to a fourth aspect of the present embodiments.

Figure 104:
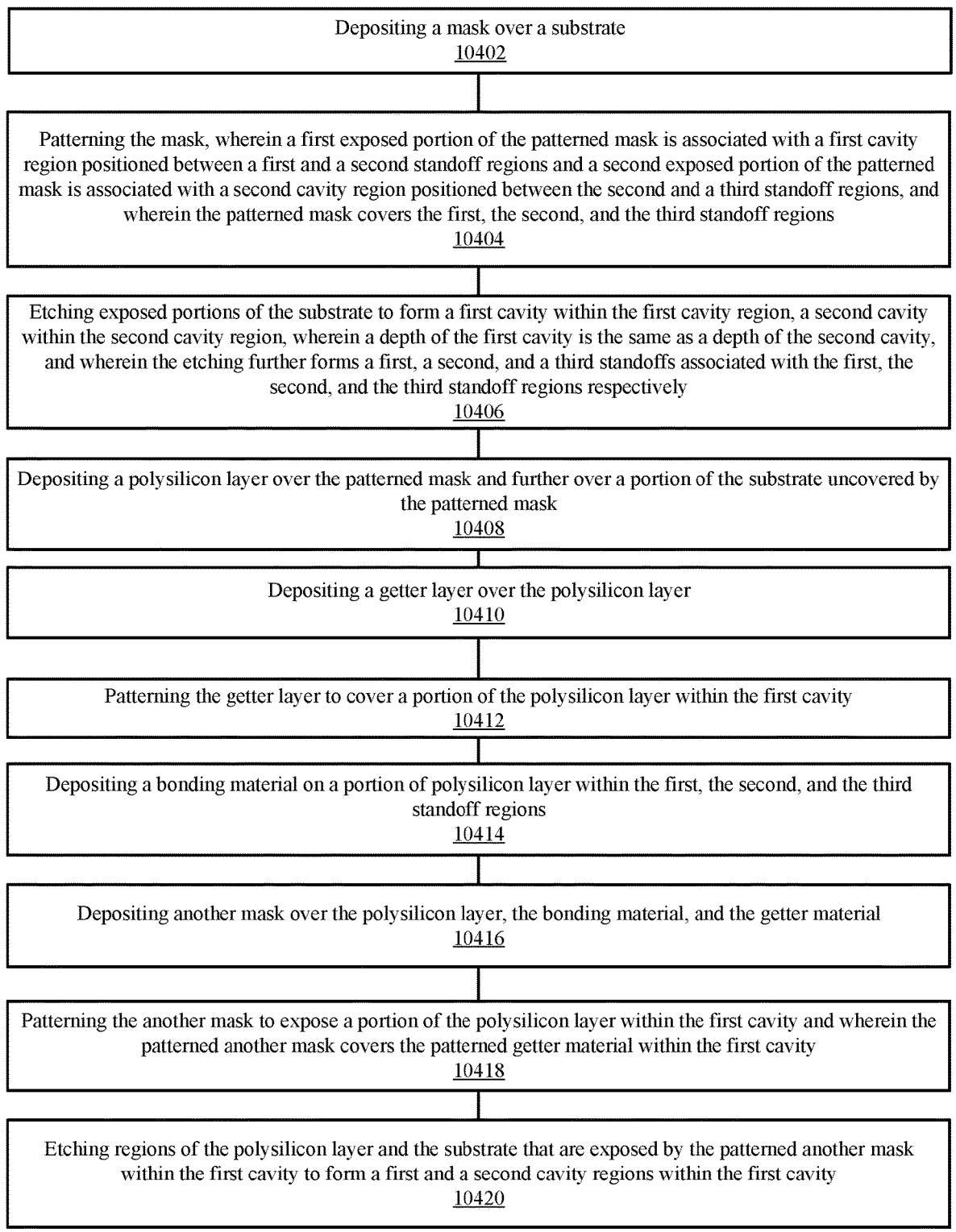
FIG. 104 shows a method flow for fabricating a cap layer according to a fourth aspect of the present embodiments.

FIG. 104 shows a method flow for fabricating a cap layer according to a fourth aspect of the present embodiments. At step 10402, a mask is deposited over a substrate, as described above in FIGS. 94-103D. At step 10404, the mask is patterned, wherein a first exposed portion of the patterned mask is associated with a first cavity region positioned between a first and a second standoff regions and a second exposed portion of the patterned mask is associated with a second cavity region positioned between the second and a third standoff regions, and wherein the patterned mask covers the first, the second, and the third standoff regions, as described above in FIGS. 94-103D. At step 10406, exposed portions of the substrate are etched to form a first cavity within the first cavity region, a second cavity within the second cavity region, wherein a depth of the first cavity is the same as a depth of the second cavity, and wherein the etching further forms a first, a second, and a third standoffs associated with the first, the second, and the third standoff regions respectively, as described above in FIGS. 94-103D. At step 10408, a polysilicon layer is deposited over the patterned mask and further over a portion of the substrate uncovered by the patterned mask, as described above in FIGS. 94-103D. At step 10410, a getter layer is deposited over the polysilicon layer, as described above in FIGS. 94-103D. At step 10412, the getter layer is patterned to cover a portion of the polysilicon layer within the first cavity, as described above in FIGS. 94-103D. At step 10414, a bonding material is deposited on a portion of polysilicon layer within the first, the second, and the third standoff regions, as described above in FIGS. 94-103D. At step 10416, another mask is deposited over the polysilicon layer, the bonding material, and the getter material, as described above in FIGS. 94-103D. At step 10418, the another mask is patterned to expose a portion of the polysilicon layer within the first cavity and wherein the patterned another mask covers the patterned getter material within the first cavity, as described above in FIGS. 94-103D. At step 10420, regions of the polysilicon layer and the substrate that are exposed by the patterned another mask within the first cavity are etched to form a first and a second cavity regions within the first cavity, as described above in FIGS. 94-103D.

As illustrated, the getter layer patterning is achieved with less topography and the getter material area is reduced.

Figure 105:
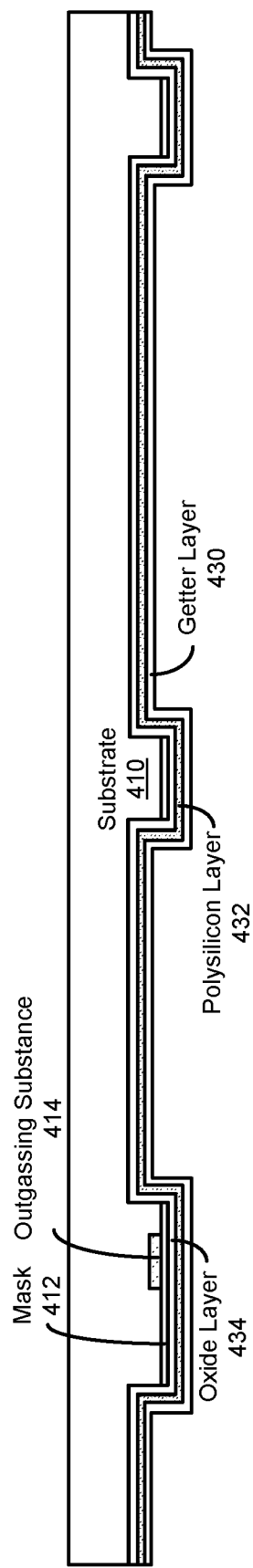
Figure 106:
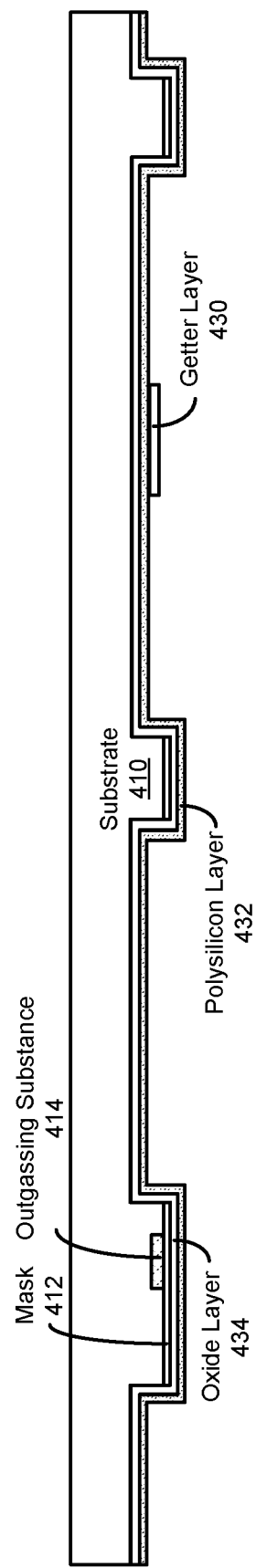
Figure 107:
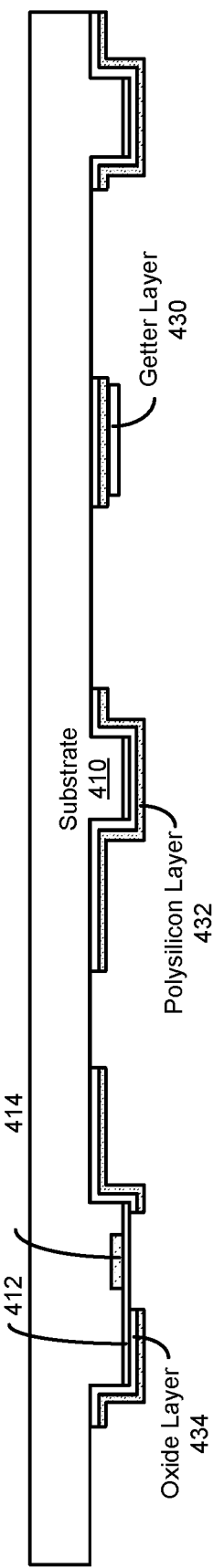
Figure 108:
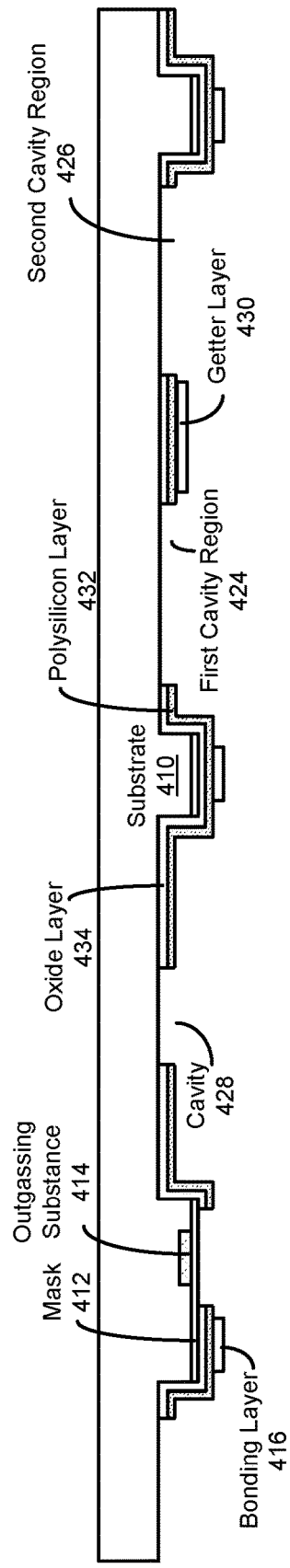
Figure 109:
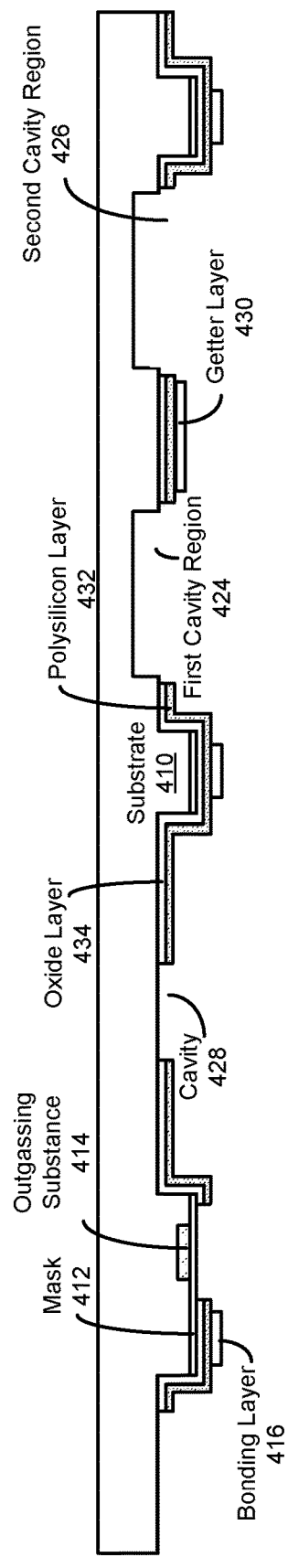
Figure 110A:
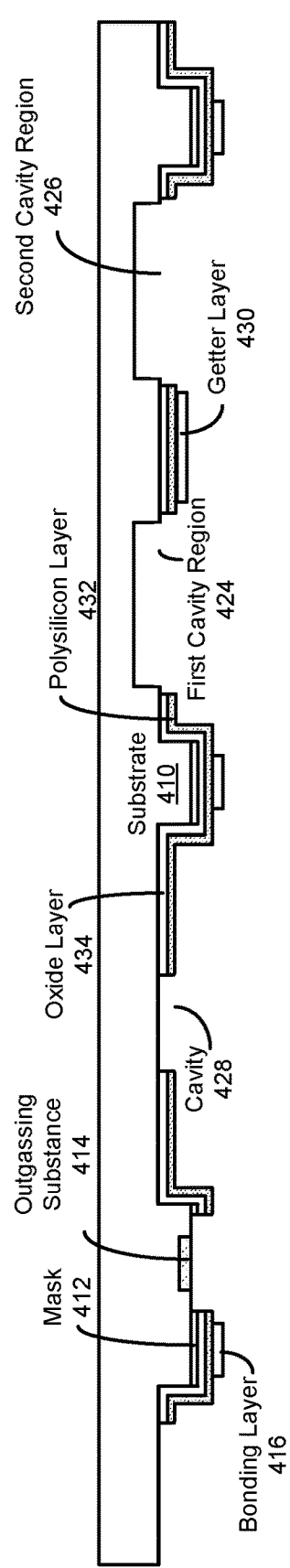

Referring now to FIGS. 105-110A, fabrication process for a cap layer according to a fifth aspect of the present embodiments is shown. FIG. 105 is similar to that of FIG. 98 except that an oxide layer 434 is disposed between the mask 412 and the polysilicon layer 432. Referring now to FIG. 106, the getter layer 430 is patterned, as described above. Referring now to FIG. 107, the oxide layer 434 and the polysilicon layer 432 are patterned using a photoresist mask, thereby exposing the substrate 410 within the first and the second cavities (corresponding to the accelerometer and gyro cavities) as well as exposing the mask 412 covering the outgassing substance 414. Referring now to FIG. 108, a bond layer 416 is deposited and patterned to cover the standoffs within the standoff regions, as described above. Referring now to FIG. 109, a mask may be formed over the bonding layer 416, the polysilicon layer 432, the mask 412, the getter layer 430, and the surfaces of the cavities. The mask may be patterned to expose the substrate 410 that corresponds to the first and the second cavity regions 424 and 426 respectively. The exposed regions of the substrate 410 are etched to form the first and the second cavity regions 424 and 426 respectively. Referring now to FIG. 110A, the mask 412 covering the outgassing substance 414 is removed to expose the outgassing substance 414.

FIGS. 110B-110D show bonding of a MEMS device layer (1400, 3600, and 5200) to a cap layer according to a fifth aspect of the present embodiments. The patterned polysilicon layers 432 may be routed to multiple electrical signal paths due to the underlying oxide layer and may serve as sensing, shield, and actuating electrodes. A method flow for fabricating the cap layer according to the fifth aspect of the present embodiments is similar to that of FIG. 104 described above.

As illustrated, the getter layer patterning is achieved with less topography and the getter material area is reduced.

Figure 117:
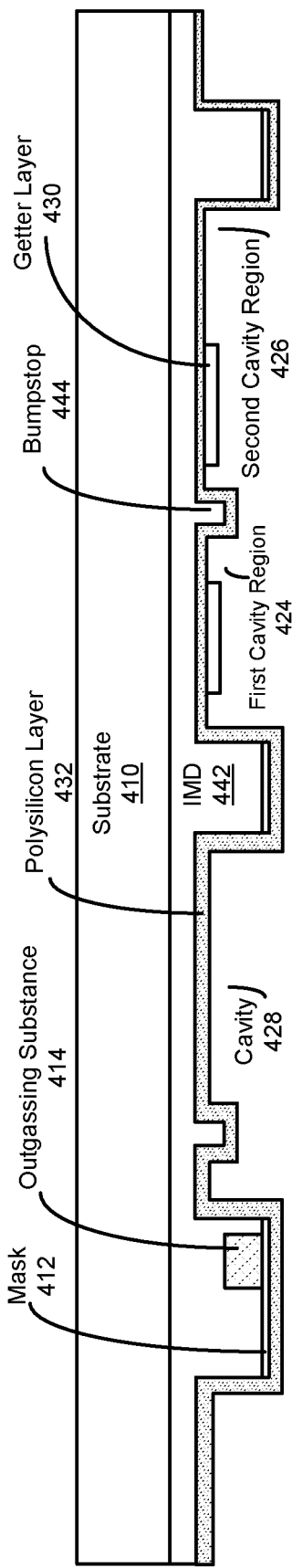

FIGS. 111-120B show fabrication process for a cap layer according to a sixth aspect of the present embodiments. Referring to FIG. 111, an IMD 442 layer is formed over the substrate 410. The IMD 442 layer may be similar to other IMD layer, as described above. Similar to other processes described above, HDP may be deposited within a region of the IMD 442 layer to form the outgassing substance 414. HDP may be patterned by CMP after deposition. The mask 412, e.g., a passivation layer comprising SiN, is deposited over the IMD 442 layer and the outgassing substance 414, thereby protecting the outgassing substance 414 from being damaged in subsequent fabrication processing steps. The mask 412 may be patterned to cover the standoff regions, as illustrated in FIG. 112. Referring now to FIG. 113, the exposed portions of the IMD 442 may be etched to form cavities. Referring now to FIG. 114, a mask is formed and patterned over the IMD 442 to form the bumpstops regions. Once the exposed portions are etched, the bumpstops 444 are formed, similar to the bumpstops formation as described above. Moreover, the cavity 428 and the first and the second cavity regions 424 and 426 respectively are formed. Referring now to FIG. 115, a polysilicon layer 432 is deposited over the mask 412 and the IMD 442 layer. Polysilicon deposition improves stiction due to the roughness of the polysilicon surface. Referring now to FIG. 116, a getter layer 430 is deposited over the polysilicon layer 432. Referring now to FIG. 117, the getter layer 430 may be patterned, as described above. In this embodiment, the patterned getter layer 430 covers the polysilicon layer 432 in the first and the second cavity regions 424 and 426 respectively.

Figure 118:
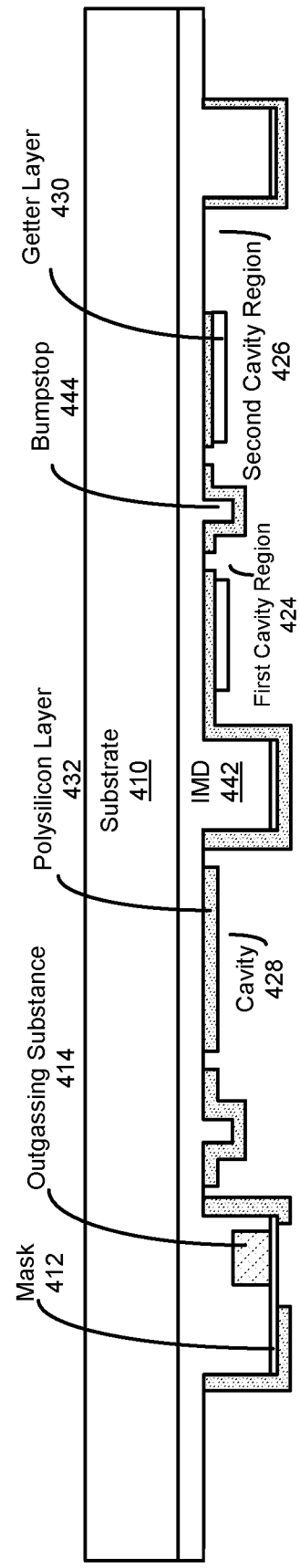
Figure 119A:
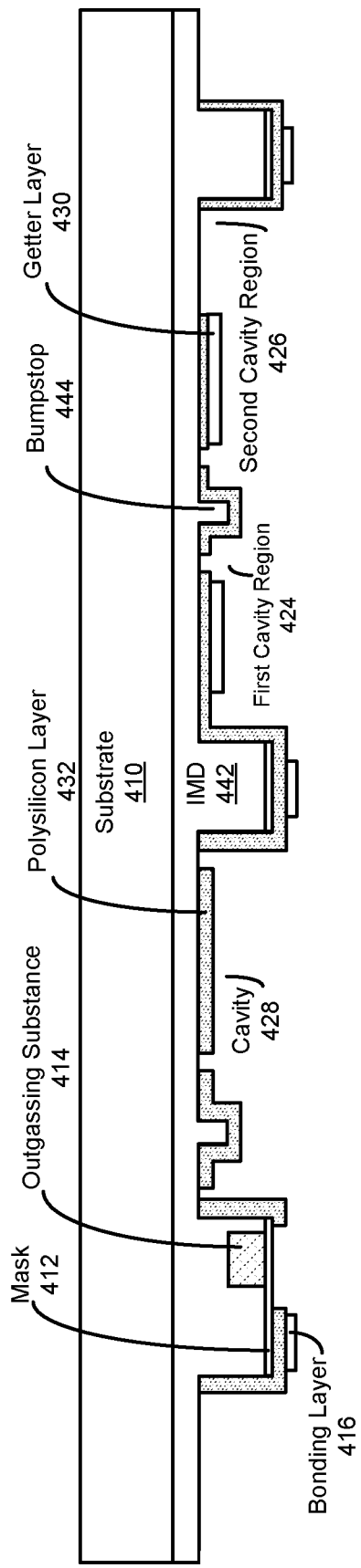
Figure 119B:
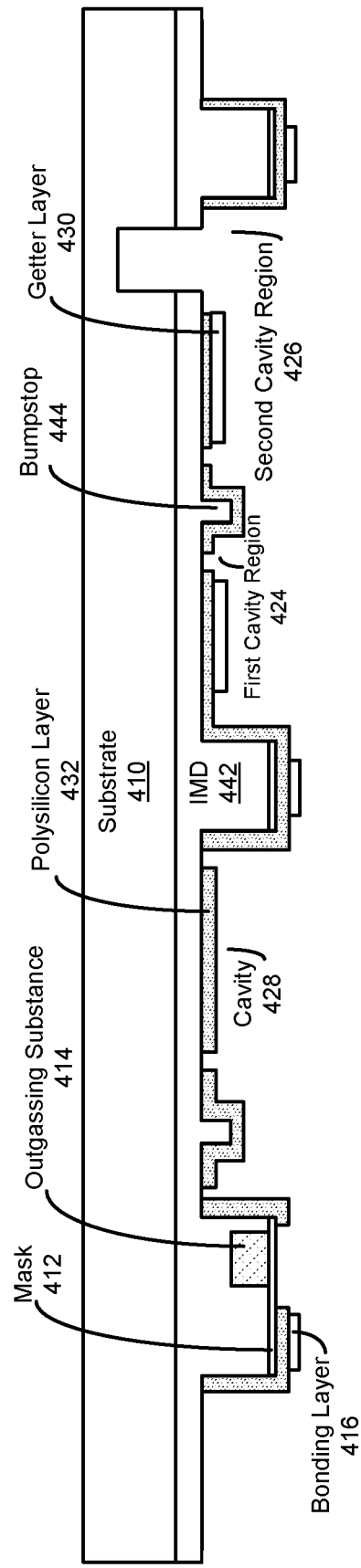
Figure 120A:
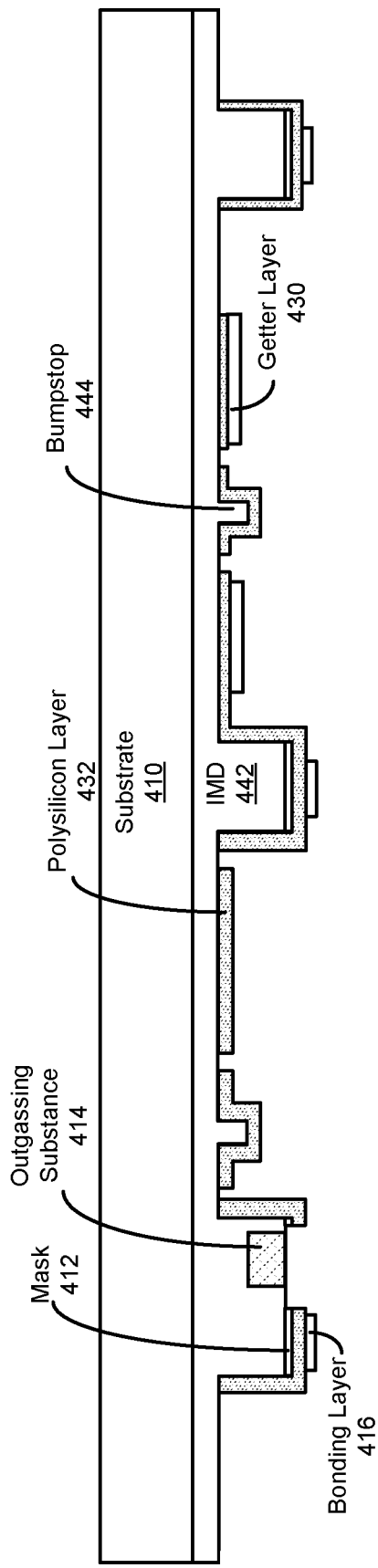
Figure 120B:
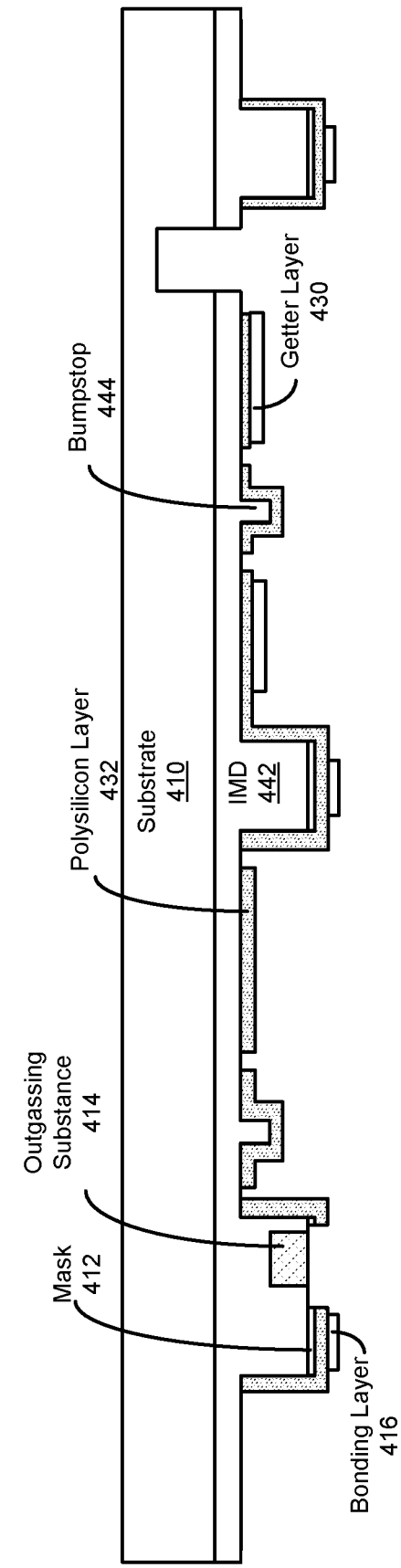
Figure 120E:
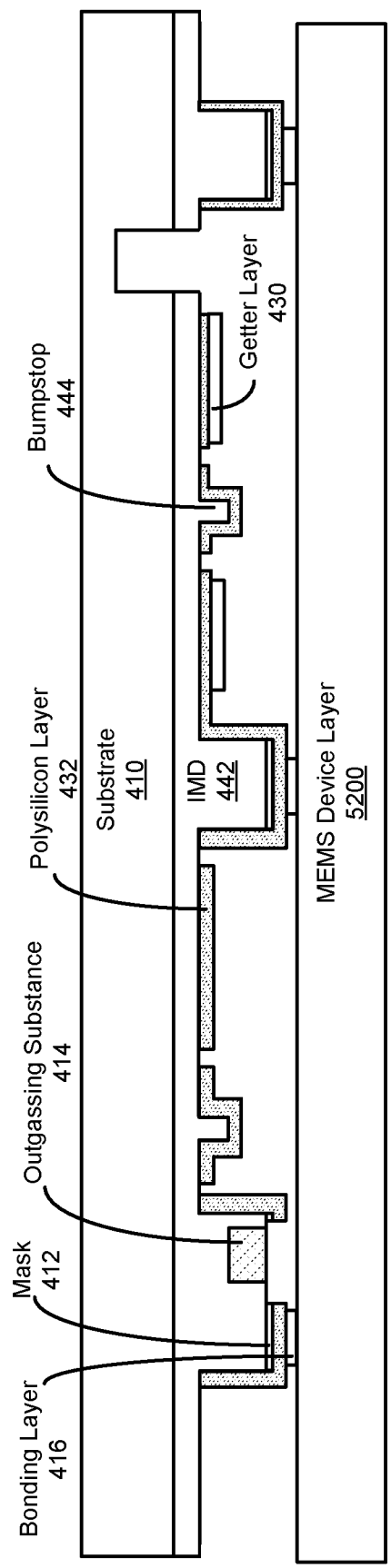

Referring now to FIG. 118, the polysilicon layer 432 is patterned, similar to the process described above. Referring now to FIG. 119A, a bond layer 416 is deposited and patterned corresponding to the standoffs. Referring now to FIG. 119B, a region within the second cavity region 426 is optionally etched to expose the substrate 410 for increasing the cavity volume, thereby reducing the cavity pressure for gyro application. Referring now to FIGS. 120A and 120B, the mask 412 covering the outgassing substance 414 of FIGS. 119A and 119B is removed to expose the outgassing substance 414. FIGS. 120C-120E show bonding of a MEMS device layer (1400, 3600, and 5200) to a cap layer according to a sixth aspect of the present embodiments. The patterned polysilicon layers 432 may be routed to multiple electrical signal paths due to the underlying IMD layer and may serve as sensing, shield, and actuating electrodes.

Figure 121A:
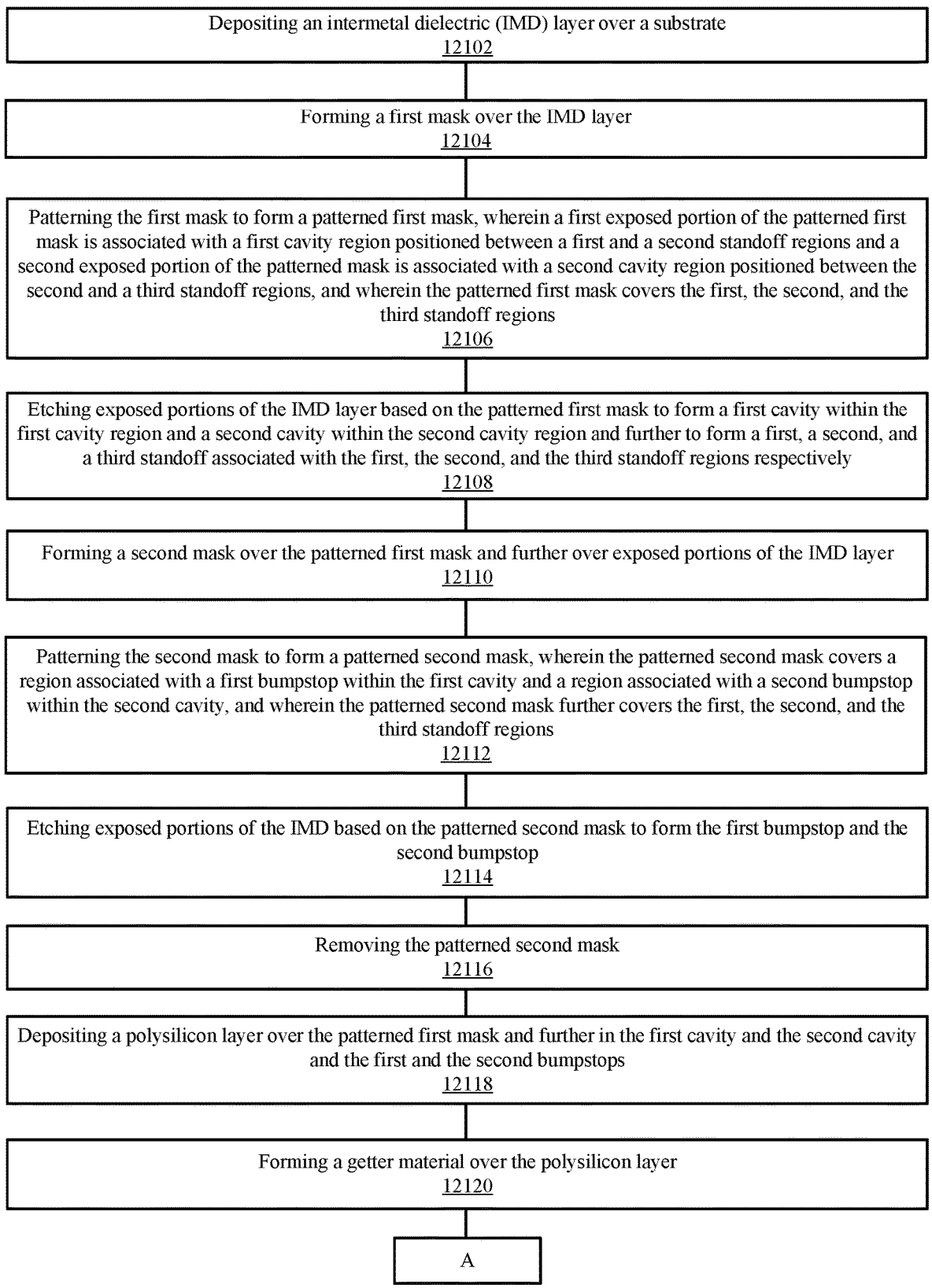
FIGS. 121A-121B show a method flow for fabricating a cap layer according to a sixth aspect of the present embodiments.
Figure 121B:
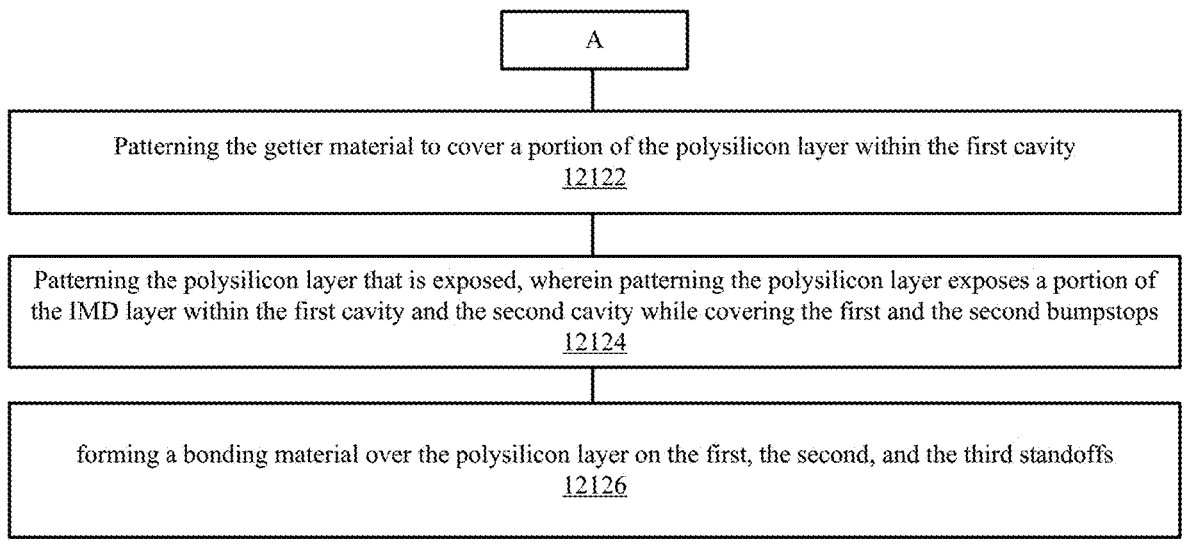

FIGS. 121A-121B show a method flow for fabricating a cap layer according to a sixth aspect of the present embodiments. At step 12102, an intermetal dielectric (IMD) layer is deposited over a substrate, as described above in FIGS. 111-120E. At step 12104, a first mask is formed over the IMD layer, as described above in FIGS. 111-120E. At step 12106, the first mask is patterned to form a patterned first mask, wherein a first exposed portion of the patterned first mask is associated with a first cavity region positioned between a first and a second standoff regions and a second exposed portion of the patterned mask is associated with a second cavity region positioned between the second and a third standoff regions, and wherein the patterned first mask covers the first, the second, and the third standoff regions, as described above in FIGS. 111-120E. At step 12108, exposed portions of the IMD layer based on the patterned first mask are etched to form a first cavity within the first cavity region and a second cavity within the second cavity region and further to form a first, a second, and a third standoff associated with the first, the second, and the third standoff regions respectively, as described above in FIGS. 111-120E. At step 12110, a second mask is formed over the patterned first mask and further over exposed portions of the IMD layer, as described above in FIGS. 111-120E. At step 12112, the second mask is patterned to form a patterned second mask, wherein the patterned second mask covers a region associated with a first bumpstop within the first cavity and a region associated with a second bumpstop within the second cavity, and wherein the patterned second mask further covers the first, the second, and the third standoff regions, as described above in FIGS. 111-120E. At step 12114, exposed portions of the IMD based on the patterned second mask are etched to form the first bumpstop and the second bumpstop, as described above in FIGS. 111-120E. At step 12116, the patterned second mask is removed, as described above in FIGS. 111-120E. At step 12118, a polysilicon layer is deposited over the patterned first mask and further in the first cavity and the second cavity and the first and the second bumpstops, as described above in FIGS. 111-120E. At step 12120, a getter material is formed over the polysilicon layer. At step 12122, the getter material is patterned to cover a portion of the polysilicon layer within the first cavity, as described above in FIGS. 111-120E. At step 12124, the polysilicon layer that is exposed is patterned, wherein patterning the polysilicon layer exposes a portion of the IMD layer within the first cavity and the second cavity while covering the first and the second bumpstops, as described above in FIGS. 111-120E. At step 12126, a bonding material is formed over the polysilicon layer on the first, the second, and the third standoffs, as described above in FIGS. 111-120E.

As illustrated, the getter layer patterning is achieved with less topography and the getter material area is reduced. Furthermore, multiple electrodes (sensing electrodes) are formed in the cap layer.

Figure 122:
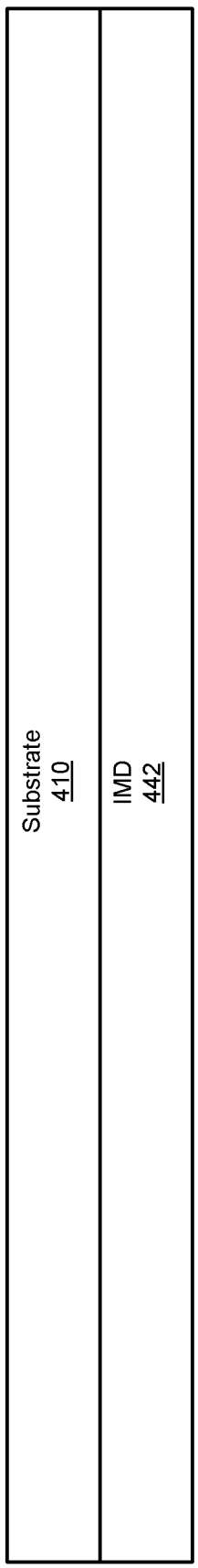
Figure 123:
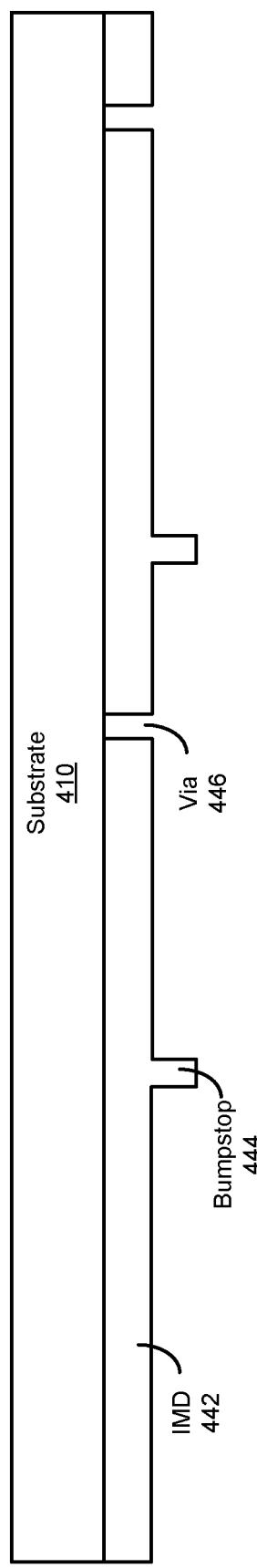
Figure 124:
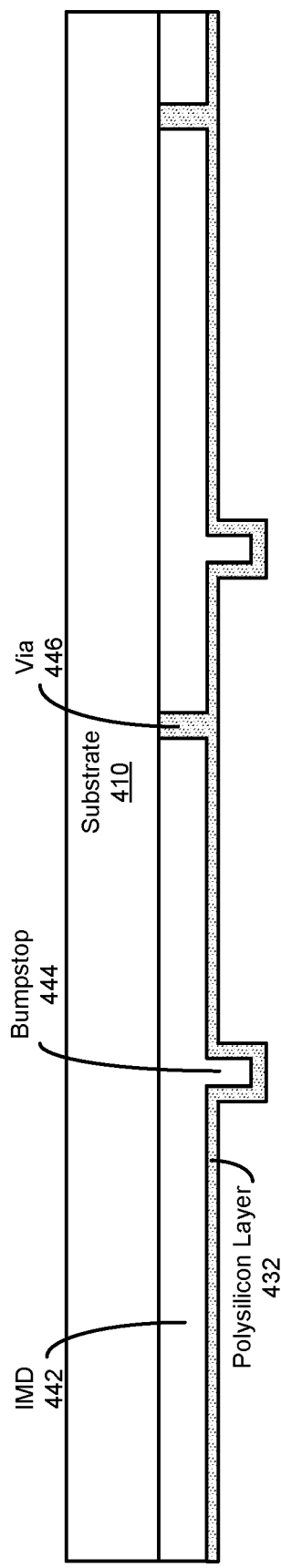
Figure 125:
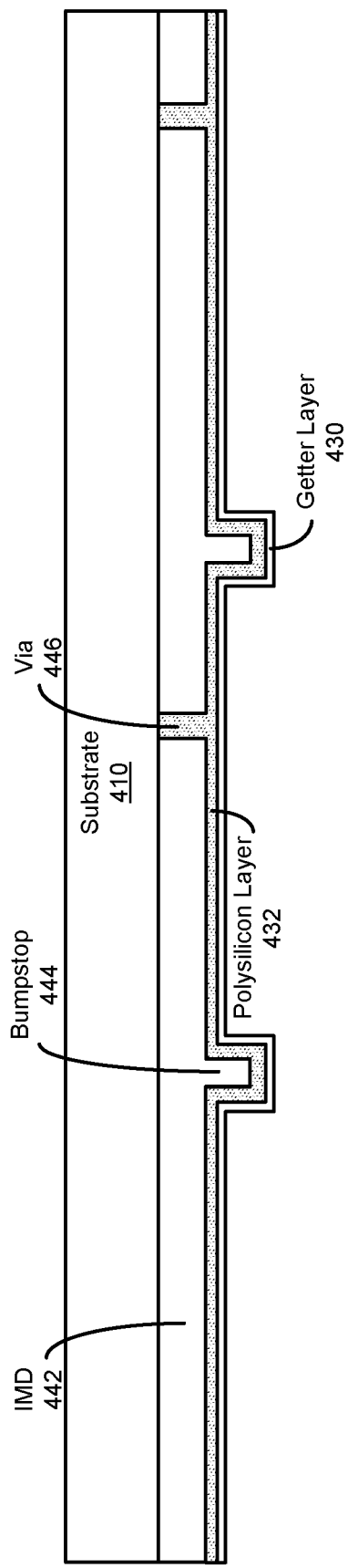
Figure 126:
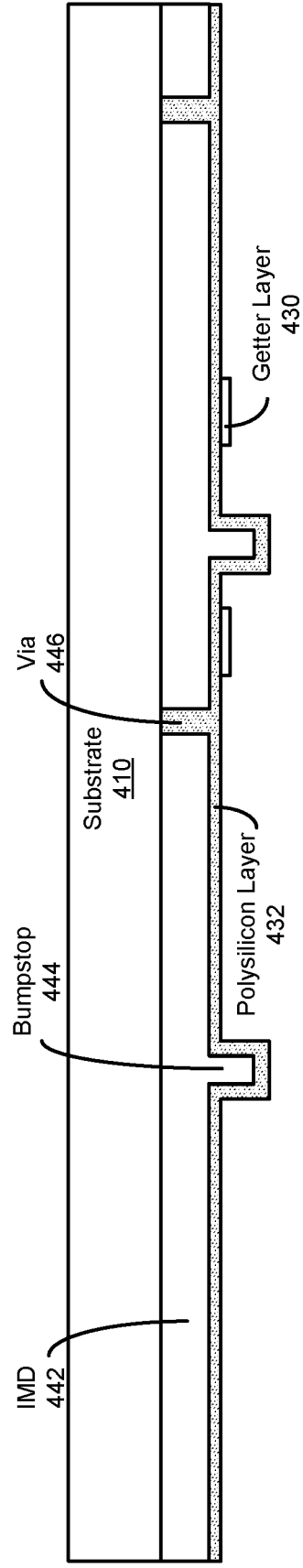

FIGS. 122-135A show fabrication process for a cap layer according to a seventh aspect of the present embodiments. Referring now to FIG. 122, an IMD 442 layer is formed over the substrate 410, similar to above. Referring now to FIG. 123, a plurality of vias 446 and bumpstops 444 are formed within the IMD 442 layer, similar to processes described above. Referring now to FIG. 124, a polysilicon layer 432 is deposited over the IMD 442 layer and further within the vias 446 contacting the substrate 410. Referring now to FIG. 125, a getter layer 430 is deposited over the polysilicon layer 432 and patterned, as illustrated in FIG. 126 and as described above.

Figure 127:
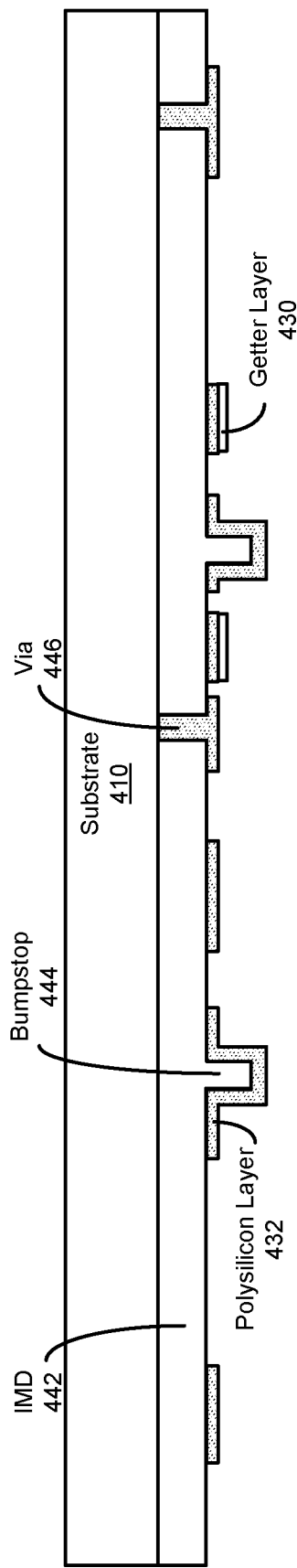
Figure 128:
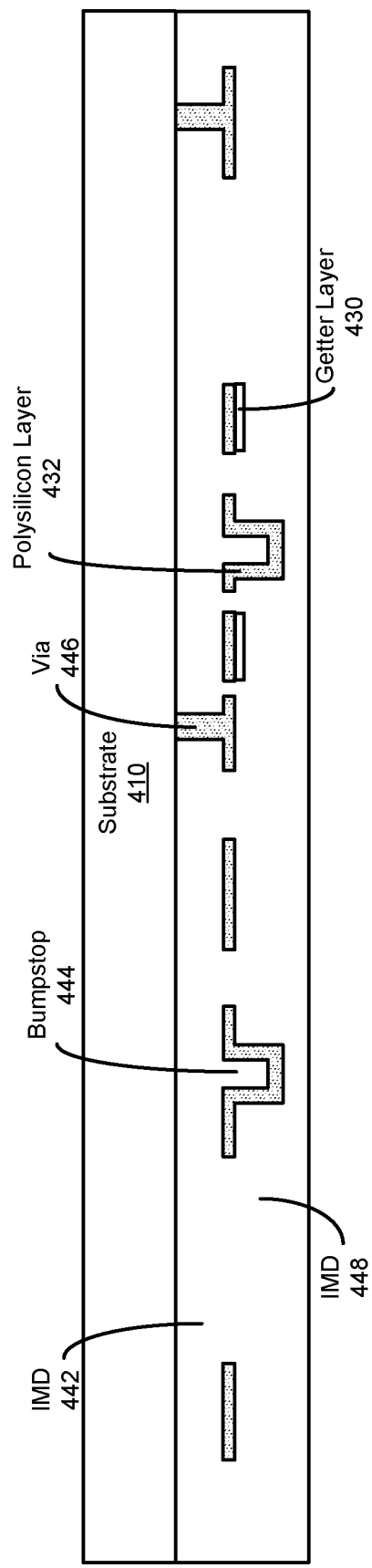
Figure 129:
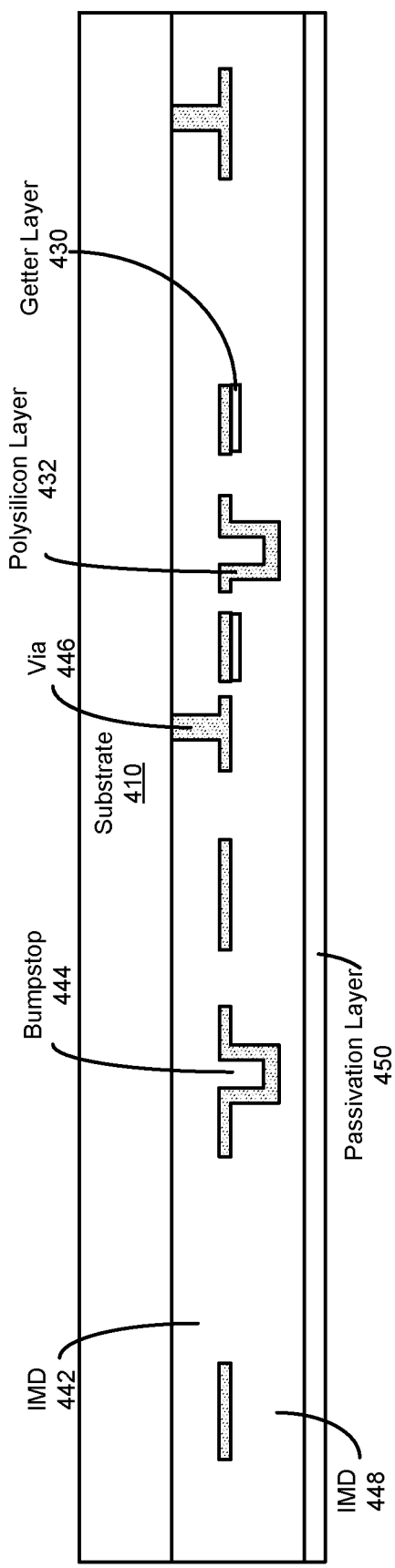

Referring now to FIG. 127, the polysilicon layer 432 is patterned, as described above, e.g., using a mask. Referring now to FIG. 128, another IMD 448 layer is deposited to cover the patterned polysilicon layer 432 and also the IMD 442 layer. The IMD 448 layer may go through the CMP process. It is appreciated that the IMD layer 442 and 448 may be similar to the IMD layers that have been described above. Referring now to FIG. 129, a passivation layer 450, e.g., SiN, may be deposited over the IMD layer 448.

Figure 130A:
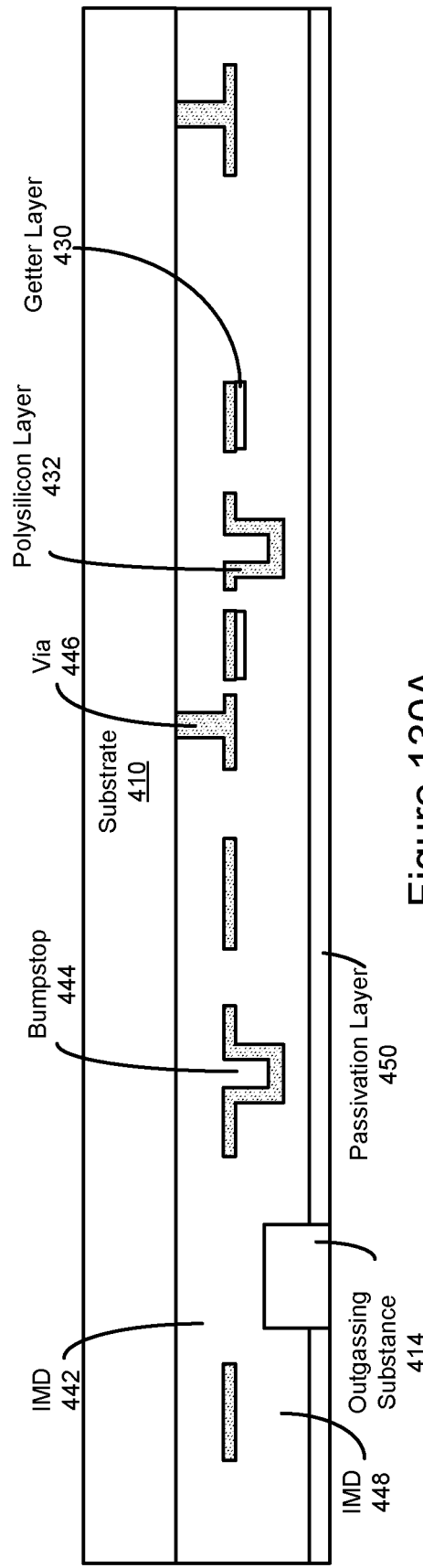
Figure 130B:
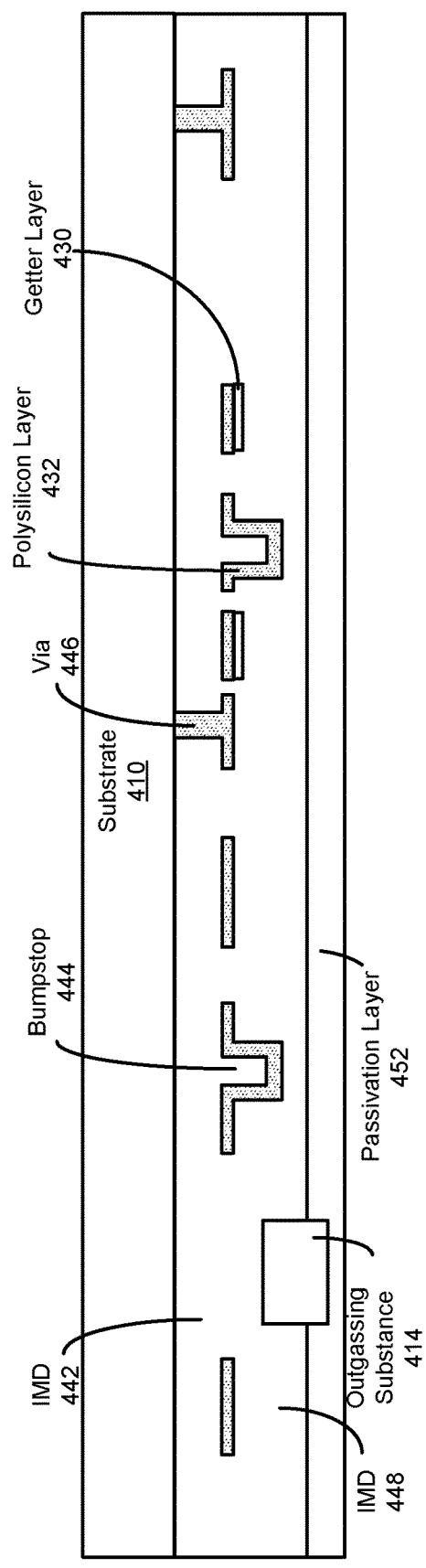

Referring now to FIG. 130A, a mask may be formed and patterned over the passivation layer 450 to correspond to the outgassing substance 414. HDP may be deposited in the outgassing substance 414. HDP may be patterned by CMP after deposition. Referring now to FIG. 130B, another passivation layer 452 is deposited over the passivation layer 450 and further over the outgassing substance 414 in order to protect the outgassing substance 414 from being damaged or degraded in subsequent fabrication processing.

Figure 131:
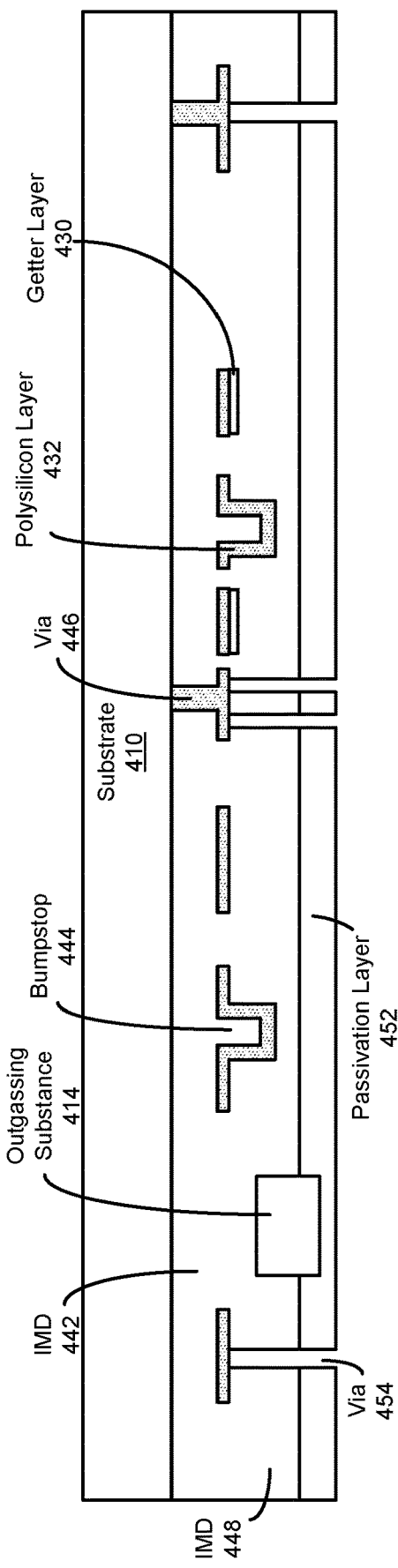

Referring now to FIG. 131, via 454 is formed through the passivation layer 452 and further through the IMD 448 layer to expose the patterned polysilicon layer 432. It is appreciated that the via may be formed by forming a mask and patterning it. Referring now to FIG. 132A, the interior surface of the vias 452 are coated with barrier layer 456 such as Ti or TiN. The vias 452 may be filled, e.g., with Tungsten, and go through the CMP process. The barrier layer 456 may also be deposited on the top surface of the vias 452. The bonding layer 416 may be formed over the vias 454 and the passivation layer 452 and subsequently patterned that correspond to the standoffs within the standoff regions.

Figure 133:
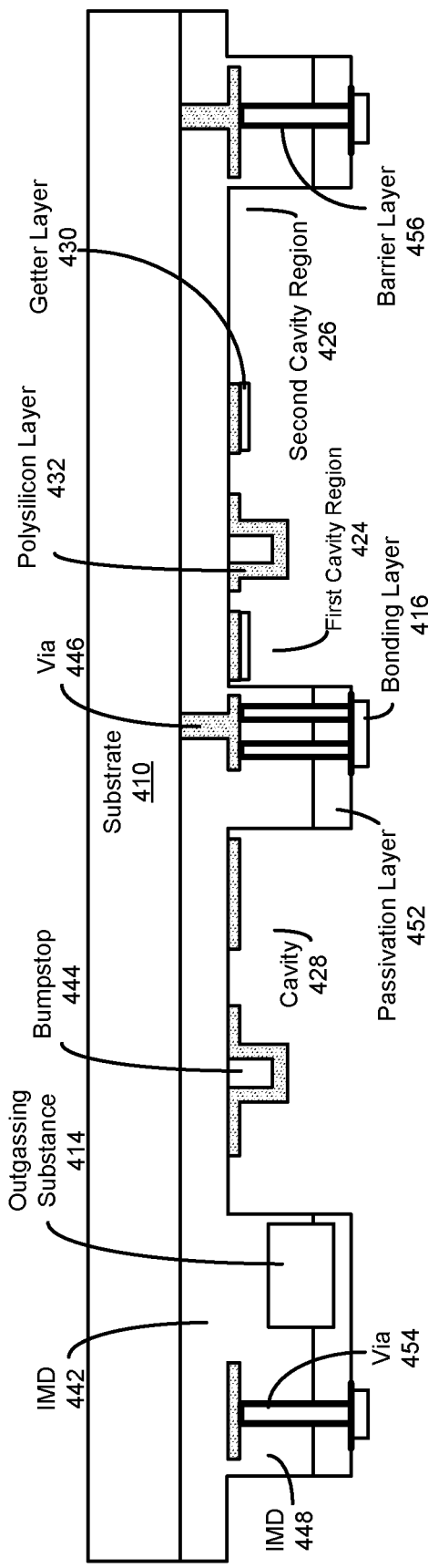
Figure 134:
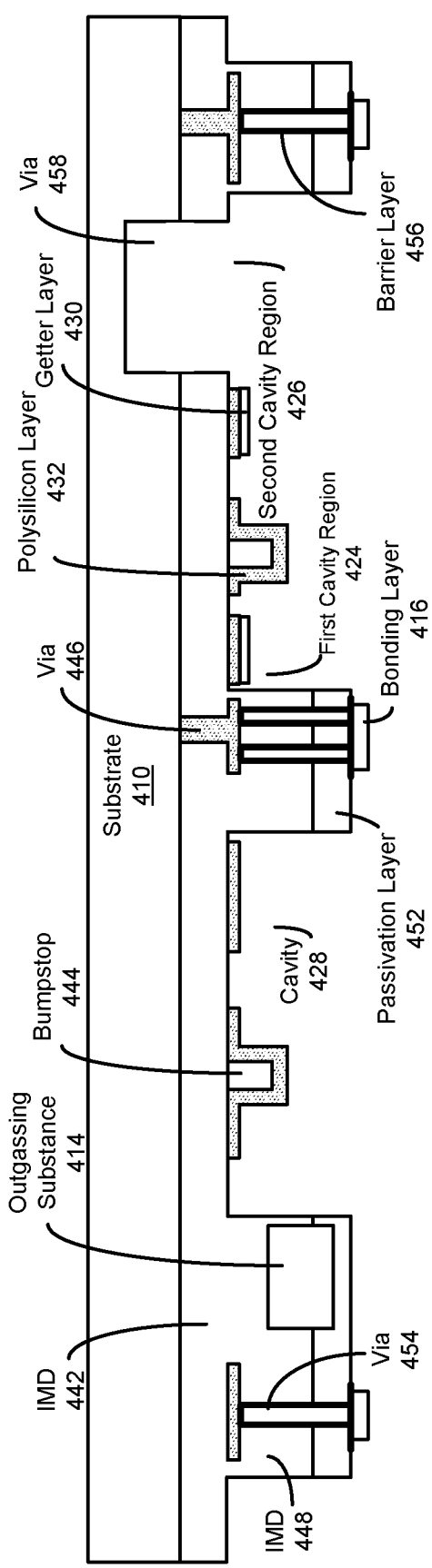

Referring now to FIG. 132B, an alternative embodiment is shown where the vias 454 are not coated with the barrier layer 456. Referring now to FIG. 133, the passivation layer 452 and the IMD 448 layer in the first and the second cavity regions are etched to expose the polysilicon layer 432. Referring now to FIG. 134, a via 458 is etched within the second cavity region 426 for increasing the cavity volume, thereby reducing the cavity pressure for gyro application. Referring now to FIG. 135A, the passivation layer 452 is etched to expose the outgassing substance 414. Referring now to FIGS. 135B-135D bonding of a MEMS device layer (1400, 3600, and 5200) to a cap layer according to a seventh aspect of the present embodiments are shown. The patterned polysilicon layers 432 may be routed to multiple electrical signal paths due to the underlying IMD layer and may serve as sensing, shield, and actuating electrodes.

Figure 135E:
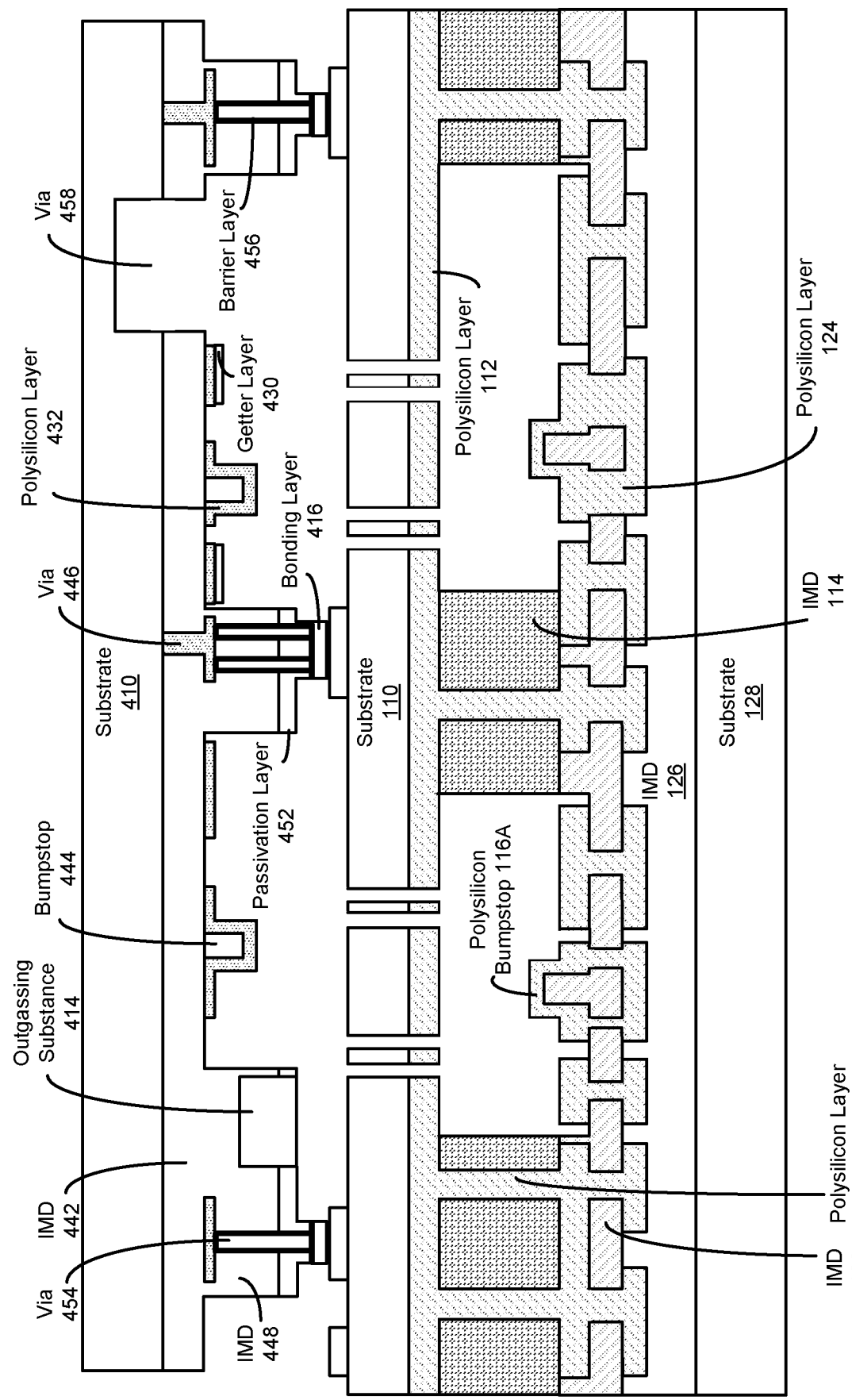
Figure 136:
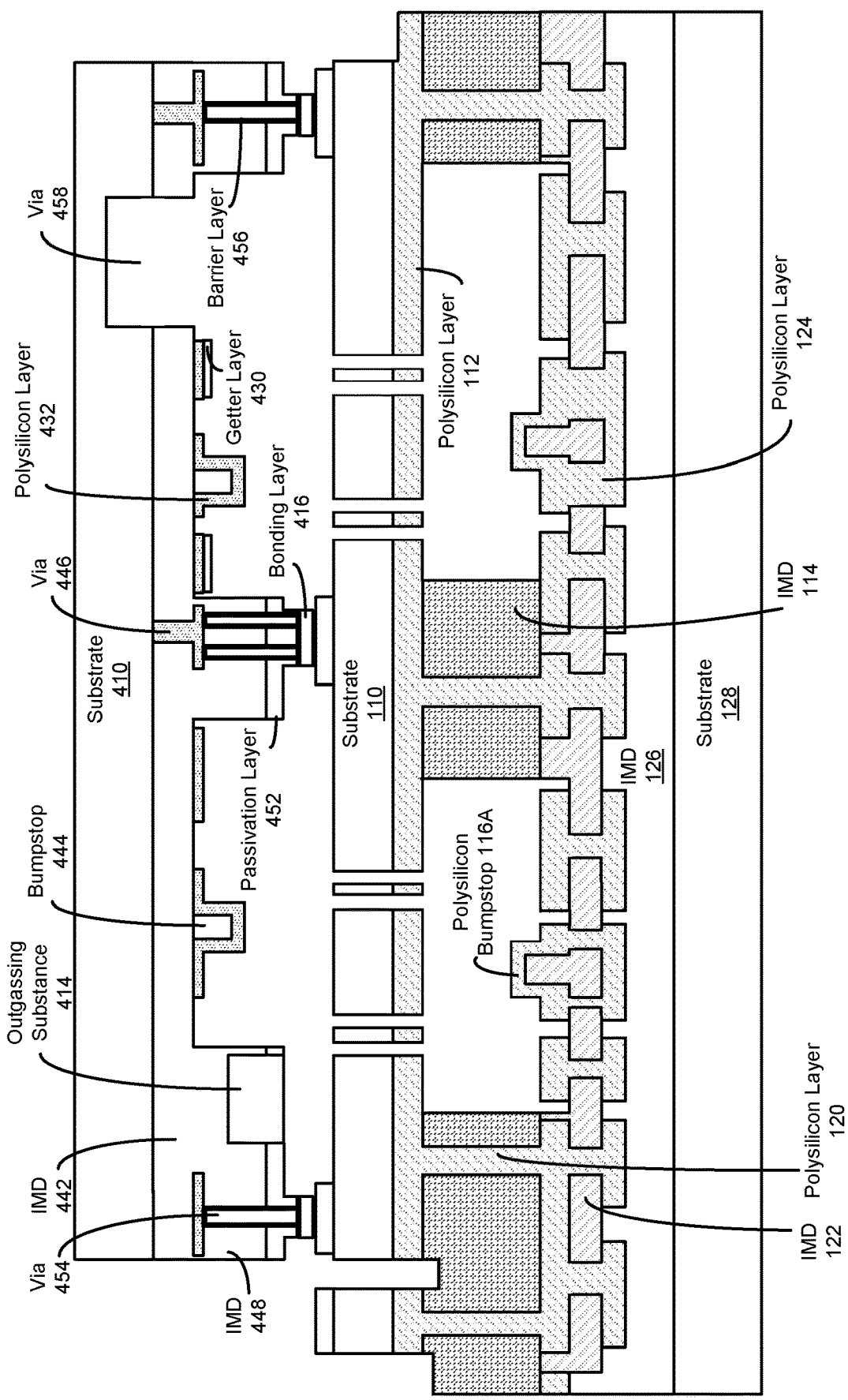

Referring now to FIG. 135E bonding of a MEMS device layer 1400 to a cap layer forming a MEMS layer is shown. FIG. 136 illustrates MEMS layer thinning and opening a bond pad according to a seventh aspect of the present embodiments.

Figure 137A:
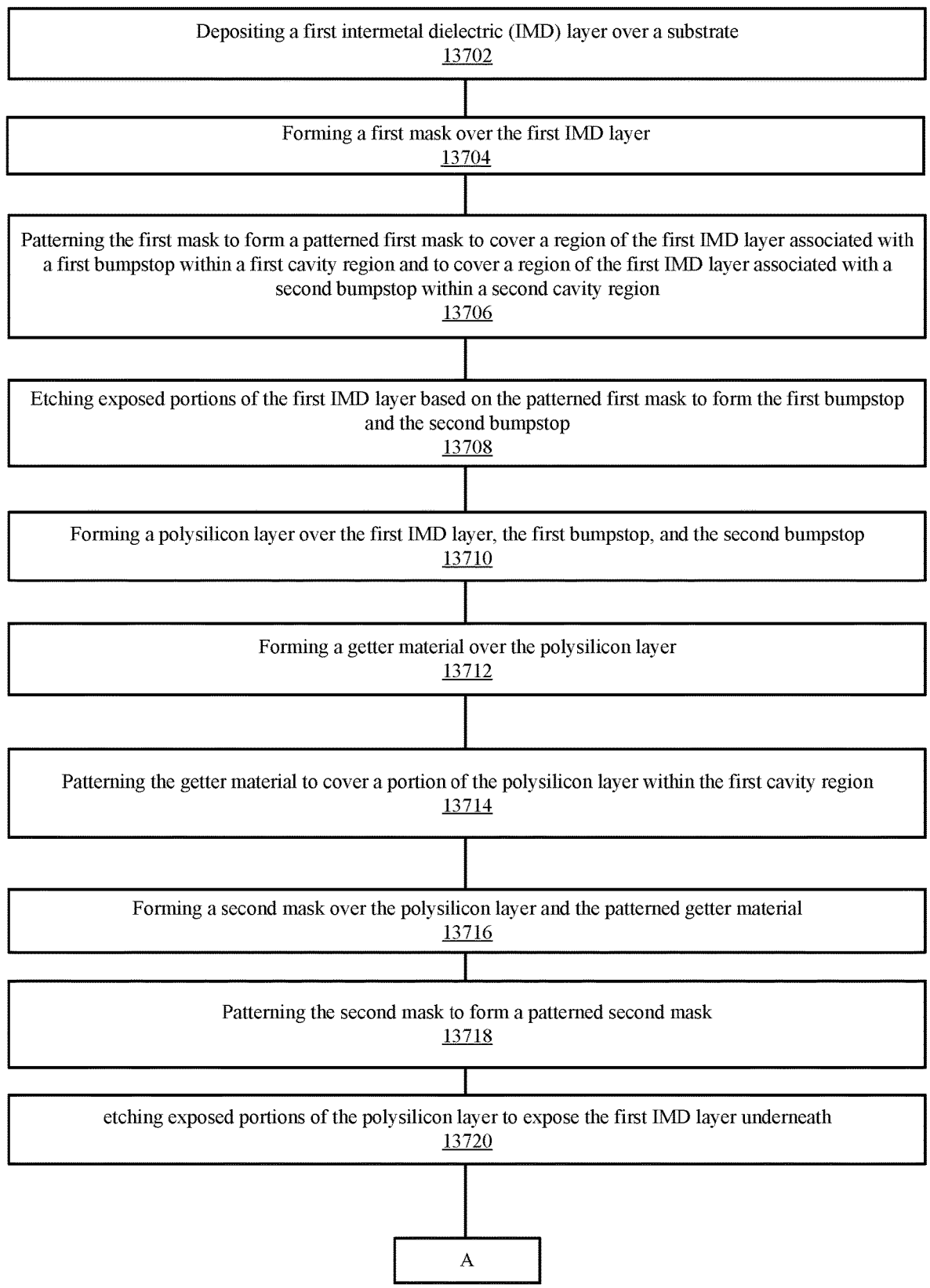
FIGS. 137A-137B show a method flow for fabricating a cap layer according to a seventh aspect of the present embodiments.
Figure 137B:
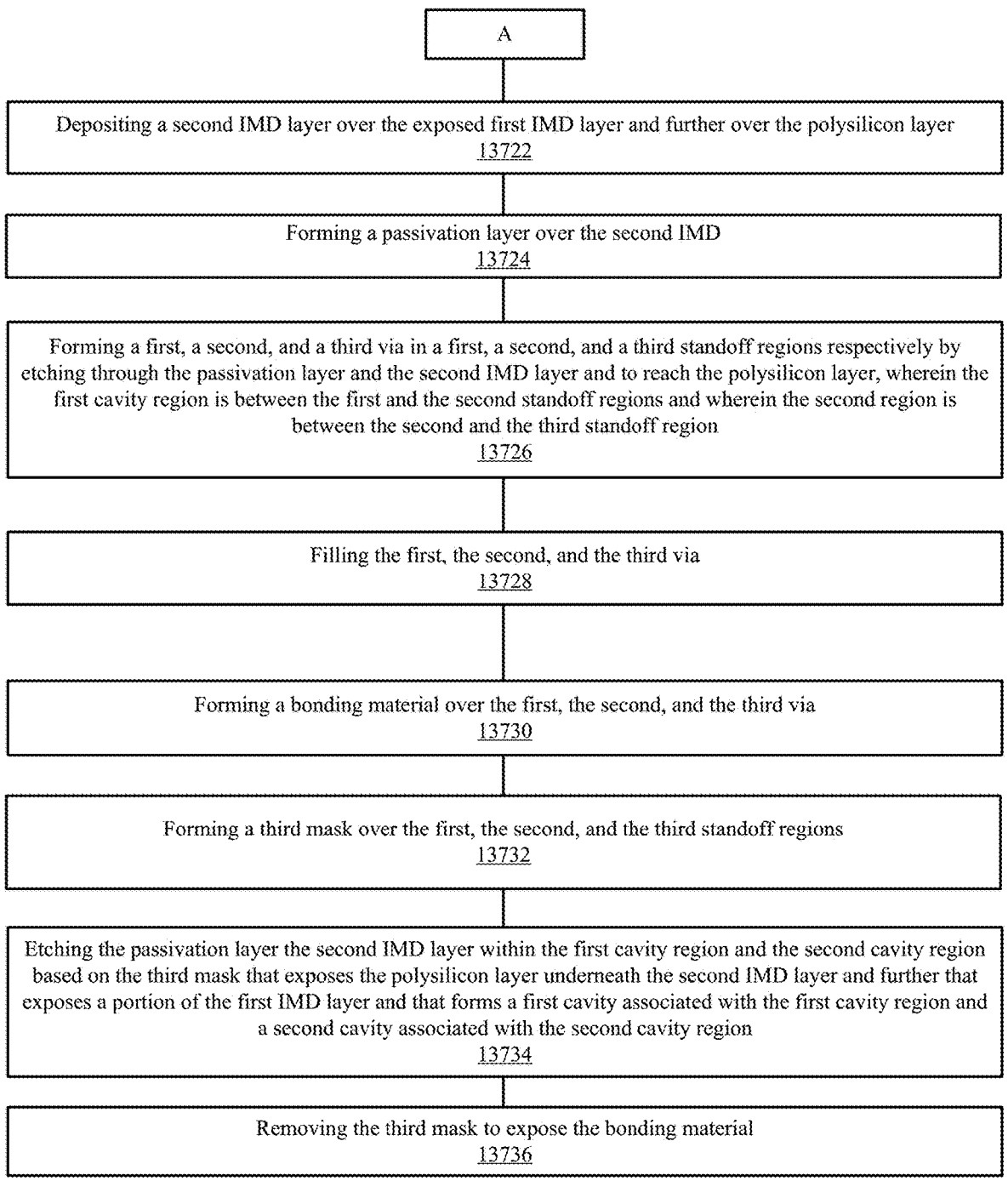

FIGS. 137A-137B show a method flow for fabricating a cap layer according to a seventh aspect of the present embodiments. At step 13702, a first intermetal dielectric (IMD) layer is deposited over a substrate, as described above in FIGS. 122-136. At step 13704, a first mask is formed over the first IMD layer, as described above in FIGS. 122-136. At step 13706, the first mask is patterned to form a patterned first mask to cover a region of the first IMD layer associated with a first bumpstop within a first cavity region and to cover a region of the first IMD layer associated with a second bumpstop within a second cavity region, as described above in FIGS. 122-136. At step 13708, exposed portions of the first IMD layer based on the patterned first mask are etched to form the first bumpstop and the second bumpstop, as described above in FIGS. 122-136. At step 13710, a polysilicon layer is deposited over the first IMD layer, the first bumpstop, and the second bumpstop, as described above in FIGS. 122-136. At step 13712, a getter material is deposited over the polysilicon layer, as described above in FIGS. 122-136. At step 13714, the getter material is patterned to cover a portion of the polysilicon layer within the first cavity region, as described above in FIGS. 122-136. At step 13716, a second mask is formed over the polysilicon layer and the patterned getter material, as described above in FIGS. 122-136. At step 13718, the second mask is patterned to form a patterned second mask, as described above in FIGS. 122-136. At step 13720, exposed portions of the polysilicon layer are etched to expose the first IMD layer underneath, as described above in FIGS. 122-136. At step 13722, a second IMD layer is deposited over the exposed first IMD layer and further over the polysilicon layer, as described above in FIGS. 122-136. At step 13724, a passivation layer is formed over the second IMD layer, as described above in FIGS. 122-136. At step 13726, a first, a second, and a third via in a first, a second, and a third standoff regions respectively are formed by etching through the passivation layer and the second IMD layer and to reach the polysilicon layer, wherein the first cavity region is between the first and the second standoff regions and wherein the second region is between the second and the third standoff region, as described above in FIGS. 122-136. At step 13728, the first, the second, and the third via are filled, as described above in FIGS. 122-136. At step 13730, a bonding material is deposited over the first, the second, and the third via, as described above in FIGS. 122-136. At step 13732, a third mask is formed over the first, the second, and the third standoff regions, as described above in FIGS. 122-136. At step 13734, the passivation layer over the second IMD layer within the first cavity region and the second cavity region are etched based on the third mask that exposes the polysilicon layer underneath the second IMD layer and further that exposes a portion of the first IMD layer and that forms a first cavity associated with the first cavity region and a second cavity associated with the second cavity region, as described above in FIGS. 122-136. At step 13736, the third mask is removed to expose the bonding material, as described above in FIGS. 122-136.

As illustrated, the getter layer patterning is achieved with less topography and the getter material area is reduced. Furthermore, multiple electrodes (sensing electrodes) are formed in the cap layer.

The embodiments described herein, decouples the fabrication process for the MEMS layer in a non-monolithic fashion. The embodiments fabricate polysilicon electrodes and/or polysilicon interconnection layer on a substrate, thereby reduces hillock effects and eliminating a need to create slotting to account for hillock. Moreover, the embodiments utilize polysilicon bumpstop to reduce stiction. Moreover, standoff formation in the MEMS device layer is eliminated by forming it on a substrate and/or on a cap layer, thereby improving the MEMS device layer lithography by reducing photoresist pooling.

In some embodiments, the MEMS device layer are bonded to a substrate. Electrodes comprising polysilicon material are formed and a bumpstop with a layer of polysilicon is formed, thereby reducing hillock effects and stiction. A bond pad may be formed on the MEMS device layer.

According to some embodiments, a cap layer is fabricated to bond with the MEMS device layer. In some embodiments, HDP is deposited in the cap layer to form an outgassing substance for damping purposes, e.g., in accelerometer cavity with high cavity pressure, while certain cavity surfaces of the cap layer, e.g., gyro cavity with low pressure, may be coated with a getter material to stabilize the cavity pressure. The cap layer may also optionally include a polysilicon electrode similar to the MEMS device layer as well as a bumpstop with a layer of polysilicon.

It is appreciated that in some embodiments have the additional advantage of tighter vertical gap control by eliminating eutectic bond squish. Moreover, the embodiments, allow for tighter MEMS device layer to substrate lithography alignment. Furthermore, the MEMS device layer may be released through DRIE with using an oxide etch stop. It may be appreciated that the embodiments also enable single-sided anchor between the substrate and the MEMS device layer, thereby reducing the device size.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   depositing a first polysilicon layer over a first side of an actuator layer;
   forming a first intermetal dielectric (IMD) layer over the first polysilicon layer;
   etching the first IMD layer to form a via that exposes the first polysilicon layer and further to form a bump region;
   depositing a second polysilicon layer over the first IMD layer, the via and the bump region;
   etching a portion of the second polysilicon layer to expose a portion of the first IMD layer and to form a patterned second polysilicon layer;
   depositing a second IMD layer over the patterned second polysilicon layer and further over the exposed portion of the first IMD layer;
   etching a portion of the second IMD layer to expose a portion of the patterned second polysilicon layer and to form a patterned second IMD layer;
   depositing a third polysilicon layer over the patterned second IMD layer and further over the exposed portion of the second polysilicon layer;
   etching the third polysilicon layer to form a patterned third polysilicon layer;
   depositing a third IMD layer over the patterned third polysilicon layer and further over an exposed portion of the second IMD layer;
   fusion bonding the third IMD layer to a substrate;
   depositing a bond layer over a second side of an actuator layer, wherein the second side is opposite to the first side;
   patterning the bond layer to form a patterned bond layer;
   etching a pattern through the actuator layer, the first polysilicon layer and partially through the first IMD layer; and
   etching through the first IMD layer to form a cavity and further to expose a portion of the second polysilicon layer.

2. The method of claim 1 further comprising eutecticly bonding Germanium on a cap layer to the patterned bond layer.

3. The method of claim 2, wherein the cap layer comprises at least one cavity.

4. The method of claim 3 further comprising thinning the cap layer and further deep reactive ion etching (DRIE) the cap layer to open and pattern bond pad outside of the at least one cavity.

5. The method of claim 2, wherein at least a portion of the cap layer that faces the actuator layer is lined with a getter material.

6. The method of claim 5, wherein the getter material includes Ti.

7. The method of claim 2, depositing High Density Plasma Oxide (HDP) in the cap layer before bonding the cap layer.

8. The method of claim 1, wherein the bond layer comprises Aluminum or Germanium.

9. A method comprising:
   roughening a first side of an actuator layer;
   depositing a first InterMetal Dielectric (IMD) layer over the first side of the actuator layer;
   forming a via and a cavity within the first IMD layer;
   depositing a first polysilicon layer over the first IMD layer, the via and the cavity;
   patterning the first polysilicon layer to expose a portion of the first IMD layer and to form a patterned first polysilicon layer;
   depositing a second IMD layer over the patterned first polysilicon layer and further over the exposed portion of the first IMD layer;
   etching a portion of the second IMD layer to expose a portion of the patterned first polysilicon layer and to form a patterned second IMD layer;
   depositing a second polysilicon layer over a portion of the patterned second IMD layer and further over the exposed portion of the first polysilicon layer to connect the first polysilicon layer to the second polysilicon layer;

depositing a third IMD layer over the second polysilicon layer and further over an exposed portion of the second IMD layer;

fusion bonding the third IMD layer to a substrate;

depositing a bond layer over a portion of a second side of the actuator layer, wherein the second side is opposite to the first side;

etching a pattern through the actuator layer from the second side to partially etch through the first IMD layer; and etching through the first IMD layer through the etched pattern to form a cavity and further to expose a portion of the second polysilicon layer.

10. The method of claim 9 wherein the etching through the first IMD layer through the etched pattern is by timed vapor hydrofluoric etch process.

11. The method of claim 9 further comprising eutecticly bonding a cap layer to the eutectic bond layer.

12. The method of claim 11, wherein the cap layer comprises at least one cavity.

13. The method of claim 12 further comprising thinning the cap layer and further deep reactive ion etching (DRIE) the cap layer to open and pattern bond pad outside of the at least one cavity.

14. The method of claim 11, wherein at least a portion of the cap layer that faces the actuator layer is lined with a getter material.

15. The method of claim 14, wherein the getter material includes Ti.

16. The method of claim 9, wherein the bond layer comprises Aluminum or Germanium.

\* \* \* \* \*